(12) United States Patent
Lescot et al.

(10) Patent No.: US 6,920,417 B2
(45) Date of Patent: *Jul. 19, 2005

(54) APPARATUS FOR MODELING IC SUBSTRATE NOISE UTILIZING IMPROVED DOPING PROFILE ACCESS KEY

(75) Inventors: Jérôme D. Lescot, Grenoble (FR); Bertrand L. Marchand, Grenoble (FR)

(73) Assignee: Cadence Design Systems, Inc., San Jose, CA (US)

( * ) Notice: Subject to any disclaimer, the term of this patent is extended or adjusted under 35 U.S.C. 154(b) by 652 days.

This patent is subject to a terminal disclaimer.

(21) Appl. No.: 09/905,090

(22) Filed: Jul. 12, 2001

(65) Prior Publication Data

US 2002/0006714 A1 Jan. 17, 2002

Related U.S. Application Data

(63) Continuation of application No. 09/536,206, filed on Mar. 27, 2000.

(51) Int. Cl.⁷ .......................... H01L 21/04; G06F 17/10
(52) U.S. Cl. .............................. 703/13; 703/2; 438/510
(58) Field of Search ........................ 703/2, 13; 438/510

(56) References Cited

U.S. PATENT DOCUMENTS

| | | | |
|---|---|---|---|
| 5,238,860 A | | 8/1993 | Sawada et al. |
| 6,103,561 A | | 8/2000 | Seshadri et al. |
| 6,291,324 B1 | * | 9/2001 | Lescot et al. ............... 438/510 |

OTHER PUBLICATIONS

Shin et al.; MOSFET drain engineering analysis for deep–submicrometer dimensions: a new approach; IEEE Trans. Elect. Dev.; pp. 1922–1927; Aug. 1992.*

Xavier Aragones, "A Contribution to the Study of Substrate Coupling in Mixed–Signal Integrated Circuits", Universitat Politecnica de Catalunya, Oct. 1997.

Francois Clement, "Computer Aided Analysis of Parasitic Substrate Coupling in Mixed Digital–Analog Cmos Integrated Circuits", Ecole Polytechnique Federale de Lausanne, 1996.

Tallis Blalack, "Switching Noise in Mixed–Signal Integrated Circuits", Department of Electrical Engineering, Stanford University, Dec. 1997.

Tallis Blalack, Jack Lau, François J.R. Clément, and Bruce A. Wooley, *"Experimental Results and Modeling of Noise Coupling in a Lightly Doped Substrate"*, 0–7803–3393–4, © 1996 IEEE, IEDM 96–623, pp. 23.3.1–23.3.4.

Alan Pun et al., "Experimental Results and Simulation of Substrate Noise Coupling via Planar Spiral Inductor in RF ICs", Dept. of IEEE, The Hong Kong University of Science and Technology, Swiss Federal Institute of Technology and Hewlett–Packard Laboratory, 1997.

(Continued)

*Primary Examiner*—Hugh Jones
(74) *Attorney, Agent, or Firm*—Stattler, Johansen & Adeli LLP

(57) ABSTRACT

A method for modeling a substrate, which includes obtaining vertically discretized doping profiles in the substrate to facilitate modeling. The method includes employing substrate region names and substrate cross-section names as access keys to permit accessing of the vertically discretized doping profiles. The use of the combination of region names and substrate cross-section names as unique access keys simplifies access to doping profile information for modeling purposes and yields valuable information pertaining to the presence of p-type to n-type material transitions. The information pertaining to transitions may be employed to improve substrate modeling accuracy through the inclusion of junction capacitances with the modeling process.

19 Claims, 39 Drawing Sheets

OTHER PUBLICATIONS

Martin Pfost et al., "Modeling Substrate Effects in the Design of High–Speed Si–Bipolar IC's", IEEE Journal of Solid–State Circuits, vol. 31, No. 10, Oct. 1996.

Sujoy Mitra et al., "A Methodology for Rapid Estimation of Substrate–Coupled Switching Noise", IEEE 1995 Custom Integrated Circuits Conference, 1995.

Nishath K. Verghese et al., "Fast Parasitic Extraction for Substrate Coupling in Mixed–Signal ICs", IEEE 1995 Custom Integrated Circuits Conference, 1995.

R. Gharpurey et al., "Modeling and Analysis of Substrate Coupling in Integrated Circuits", IEEE 1995 Custom Integrated Circuits Conference, 1995.

Balsha R. Stanisic et al., Addressing Substrate Coupling in Mixed–Mode IC's: Simulation and Power Distribution Synthesis, IEEE Journal of Solid–State Circuits, vol. 29, No. 3, Mar. 1994.

Kuntal Joardar, "A Simple Approach to Modeling Cross–Talk in Integrated Circuits", IEEE Journal of Solid–State Circuits, vol. 29, No. 10, Oct. 1994.

Thomas A. Johnson et al., "Chip Substrate Resistance Modeling Technique for Integrated Circuit Design", IEEE Transactions on Computer–Aided Design, vol. CAD–3, No. 2, Apr. 1984.

T.A. Johnson et al., "Chip Substrate Resistance Modeling Technique for Integrated Circuit Design", IEEE, 1983.

Ivan L. Wemple et al., "Mixed–Signal Switching Noise Analysis Using Voronoi–Tessellated Substrate Macromodels", $32^{nd}$ Design Automation Conference, 1995.

R. Singh et al., "A Practical Approach to Modeling Substrate Coupling in Realistically–Large Mixed–Signal Designs", Department of Electrical and Electronic Engineering, University of Newcastle–upon–Tyne.

Drago Strle, "Crosstalk in Mixed Signal Integrated Circuits: Problems and Solutions", University of Ljubjana.

Tallis Blalack et al., "The Effects of Switching Noise on an Oversampling A/D Converter", 1995 IEEE International Solid–State Circuits Conference, 1995.

David K. Su et al., "Experimental Results and Modeling Techniques for Substrates Noise in Mixed–Signal Integrated Circuits", IEEE Journal of Solid–State Circuits, vol. 28, No. 4, Apr. 1993.

Ranjit Gharpurey et al., "Modeling and Analysis of Substrate Coupling in Integrated Circuits", IEEE Journal of Solid–State Circuits, vol. 31, No. 3, Mar. 1996.

Nishath K. Verghese et al., "Verification Techniques for Substrate Coupling and Their Application to Mixed–Signal IC Design", IEEE Journal of Solid–State Circuits, vol. 31, No. 3, Mar. 1996.

T. Smedes et al., "Layout Extraction of 3D Models for Interconnect and Substrate Parasitics", ESSDERC'95 $25^{th}$ European Solid State Device Research Conference, The Hague, Sep. 1995.

J.P. Raskin et al., "Coupling Effects in High–Resistivity Simox Substrates for VHF and Microwave Applications", Proceedings 1995 IEEE International SOI Conference, Oct. 1995.

R.B. Merrill et al., "Effect of Substrate Material on Crosstalk in Mixed Analog/Digital Integrated Circuits", IEEE, 1994.

A. Viviani et al., "Extended Study of Crosstalk in SOI–SIMOX Substrates", IEEE Universite Catholique de Louvain, 1995.

King H. Kwan et al., "Simulation and Analysis of Substrate Coupling in Realistically–Large Mixed–A/D Circuits", IEEE Symposium on VLSI circuits Digest of Technical Papers, 1996.

Jean–Pierre Raskin et al., "Substrate Crosstalk Reduction Using SOI Technology", IEEE Transactions on Electron Devices, vol. 44, No. 12, Dec. 1997.

Nishath K. Verghese et al., "Computer–Aided Design Considerations for Mixed–Signal Coupling in RF Integrated Circuits", IEEE Journal of Solid–State Circuits, vol. 33, No. 3, Mar. 1998.

Ranjit Gharpurey et al., "Transsform Domain Techniques for Efficient Extraction of Substrate Parasitics", IEEE DSPSR&D Center, Texas Instruments Inc., 1997.

W. Liu et al., "R.F. MOSFET Modeling Accounting for Distributed Substrate and Channel Resistances with Emphasis on the BSIM3v3 SPICE Model", IEEE, 1997.

Francois J.R. Clement, IC Substrate Noise Modeling With Improved Surface Gridding Technique, U.S. Appl. No. 09/495,078, filed Jan. 31, 2000, 57 pages.

Francois J.R. Clement, IC Substrate Noise Modeling, U.S. Appl. No. 09/262,735, filed Mar. 4, 1999, 54 pages.

Jean–Michel Richer, IC Substrate Noise Modeling Including Extracted Capacitance For Improved Accuracy, U.S. Appl. No. 09/536,256, filed Mar. 27, 2000, 89 pages.

* cited by examiner

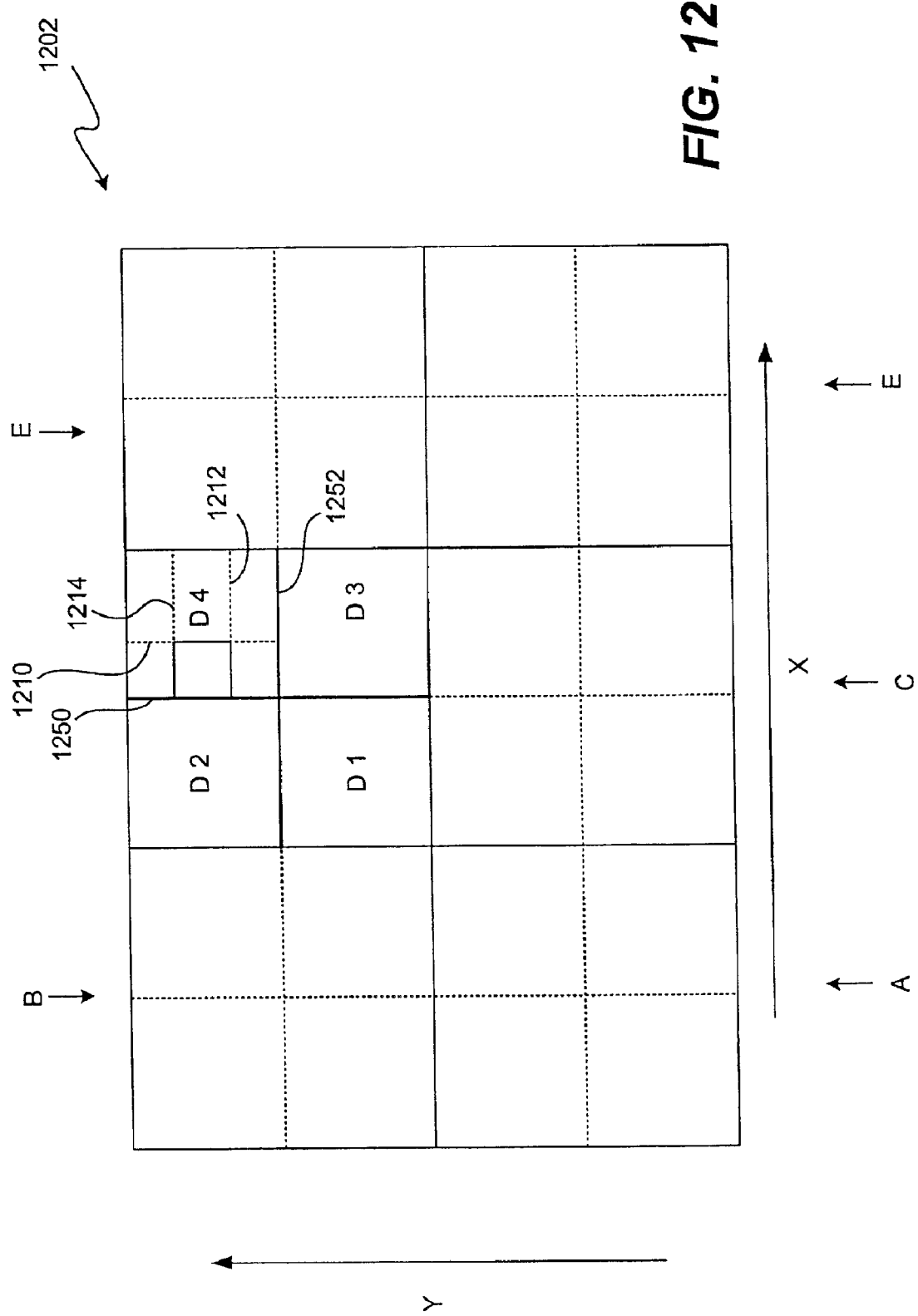

| $V_{NP}$ | Y (1e⁻⁵ cm) | Width (1e⁻⁵ cm) |
|---|---|---|
| 0 | 4.94385 | 0.988713 |
| 0.25 | 5.54958 | 1.10644 |
| 0.5 | 6.03517 | 1.20334 |
| 0.75 | 6.45595 | 1.28674 |
| 1 | 6.82921 | 1.36053 |
| 1.25 | 7.16941 | 1.42709 |
| 1.5 | 7.46467 | 1.48796 |
| 1.75 | 7.74643 | 1.54422 |
| 2 | 8.00918 | 1.59665 |
| 2.25 | 8.25618 | 1.64585 |
| 2.5 | 8.49008 | 1.69227 |
| 2.75 | 8.71313 | 1.73627 |
| 3 | 8.91566 | 1.77815 |
| 3.25 | 9.11547 | 1.81815 |
| 3.5 | 9.30687 | 1.85646 |
| 3.75 | 9.4907 | 1.89325 |
| 4 | 9.66771 | 1.92866 |
| 4.25 | 9.83856 | 1.96282 |
| 4.5 | 10.0038 | 1.99583 |
| 4.75 | 10.164 | 2.02778 |

| $V_{NP}$ | Y (1e$^5$ m) | Width (1e$^{-5}$cm) |
|---|---|---|
| 0 | 4.94385 | 0.988713 |
| 0.25 | 5.54958 | 1.10644 |
| 0.5 | 6.03517 | 1.20334 |
| 0.75 | 6.45595 | 1.28674 |
| 1 | 6.23005 | 1.223 |
| 1.25 | 6.74591 | 1.27459 |
| 1.5 | 7.16845 | 1.31685 |
| 1.75 | 7.55522 | 1.35552 |
| 2 | 7.91756 | 1.39176 |
| 2.25 | 8.26085 | 1.42608 |
| 2.5 | 8.58837 | 1.45884 |
| 2.75 | 8.90241 | 1.49024 |
| 3 | 9.20468 | 1.52047 |
| 3.25 | 9.49652 | 1.54965 |
| 3.5 | 9.77901 | 1.5779 |
| 3.75 | 10.053 | 1.6053 |
| 4 | 10.3193 | 1.63193 |
| 4.25 | 10.5786 | 1.65786 |
| 4.5 | 10.8313 | 1.68313 |
| 4.75 | 11.078 | 1.7078 |

| $V_{NP}$ (V) | width (cm) |
|---|---|
| 0 | 0.000129354 |
| 0.25 | 0.000146124 |
| 0.5 | 0.000159855 |
| 1 | 0.000182128 |
| 1.5 | 0.000200235 |
| 2 | 0.00021574 |
| 3 | 0.000241808 |

| | |
|---|---|
| α | 7.77677e-12, |
| β | 1.28937e-11 |
| γ | 0.35 |
| e (α,β,γ) | 1.5978e-14 |

| $V_{NP}$ (V) | width (cm) |
|---|---|
| 0 | 0.000209707 |
| 0.25 | 0.000239053 |
| 0.5 | 0.000262844 |
| 1 | 0.000301435 |
| 1.5 | 0.000332609 |
| 2 | 0.000359377 |
| 3 | 0.000404536 |
| $\alpha$ | 6.05704e-11 |
| $\beta$ | 1.05054e-10 |
| $\gamma$ | 0.36 |
| e ($\alpha,\beta,\gamma$) | 2.31072e-13 |

APPARATUS FOR MODELING IC SUBSTRATE NOISE UTILIZING IMPROVED DOPING PROFILE ACCESS KEY

RELATED APPLICATIONS

This application is a continuation application of an earlier filed commonly owned patent application entitled "Method of Modeling IC Substrate Noises Utilizing Improved Doping Profile Access Key" filed on Mar. 27, 2000 (Ser. No. 09/536,206), which is incorporated herein by reference for all purposes.

This application is also related to a commonly owned patent application entitled "Method for Modeling Noises in an Integrated Circuit" filed on Mar. 4, 1999 (Ser. No. 09/262,735).

This application is related to a commonly owned patent application entitled "IC Substrate Noise Modeling With Improved Surface Gridding Technique" filed on Jan. 31, 2000 (Ser. No. 09/495,078).

This application is also related to a commonly owned patent application entitled "IC Substrate Noise Modeling Including Extracted Capacitance for Improved Accuracy" filed on Mar. 27, 2000 (Ser. No. 09/536,256).

This application is also related to a commonly owned patent application entitled "Apparatus for Modeling Noises in an Integrated Circuit" filed on Jul. 11, 2001 (Ser. No. 09/903,821).

BACKGROUND OF THE INVENTION

1. Field of the Invention

The present invention relates to substrate modeling. More particularly, the present invention relates to modeling characteristics of a substrate using doping profiles.

2. Description of the Related Art

Integrated circuits are typically modeled, or simulated, prior to fabrication. These simulation tools may be used to optimize performance of integrated circuits as well as reduce the likelihood of failure of such circuits after fabrication. Thus, simulation is advantageous since circuits may be easily redesigned without duplicative fabrication costs.

Simulation tools are typically used to model the behavior of transistor devices that are formed on a substrate as well as interconnect lines that connect these devices. However, through the use of such tools, only a portion of the substrate is modeled. By way of example, during simulation of a transistor device formed on a substrate approximately 400 microns thick, a thickness of approximately 0.1 microns is typically modeled. Since net doping levels vary throughout the substrate, modeling only a fraction of the substrate yields an inaccurate simulation of the substrate characteristics. Accordingly, it would be desirable if the entire depth of the substrate were modeled.

Further, a substrate is not an ideal medium. Since recently developed fabrication processes permit device feature sizes to be reduced, the frequency of operation for transistor devices has increased with these developments. Similarly, with such a reduction in device feature size, the distance between transistor devices may be reduced. Since noise attenuates with the distance between the source of the noise (e.g., power supply) and the receiver of the noise, this parasitic noise may easily propagate to multiple devices. As a result, this parasitic noise may prevent these transistor devices from operating correctly. More particularly, these negative consequences may be considerable for sensitive semiconductor devices such as MOS transistors. Thus, it would be desirable if substrate modeling could be performed to detect this noise.

Noise may be transferred to the substrate by a circuit formed on the surface of the substrate. This noise transfer may occur at various interfaces between the circuit and the substrate. A circuit typically includes numerous devices connected by conductive interconnect lines. Capacitance as well as resistance between the substrate and an overlying interconnect line or device may create undesirable parasitic effects. As a result, this parasitic noise may be transferred through the substrate to other devices in the circuit. Thus, it would be desirable to model the interface between the substrate and the circuit.

IC substrates, as well as portions of the substrates, are typically doped. By way of example, portions of substrates may be doped to create device elements, such as source and drain diffusion regions. Thus, substrates commonly include multiple layers that contain various net doping levels. In addition, the resistance present in the substrate varies with these net doping levels. These varied resistances affect the current flow throughout the substrate and therefore the performance of integrated circuits formed on the substrate. Thus, it would be desirable if these doping levels could be considered during the substrate modeling.

In view of the above, it would be desirable if a system and method for modeling substrate noise through varying doping levels were developed. In this manner, noise flowing through the substrate as well as between the substrate and devices formed on the substrate, may be modeled and eliminated. Accordingly, a circuit may be designed to eliminate or reduce this noise at the design phase without estimation or fabrication of the circuit.

SUMMARY OF THE INVENTION

An invention is described herein which provides methods and apparatus for modeling noise present in an integrated circuit substrate. This is accomplished by obtaining a doping profile associated with the integrated circuit substrate. Through vertically discretizing the doping profile, the doping profile is divided into a finite number of discrete portions. Moreover, all doping profiles associated with the integrated circuit substrate may be obtained and vertically discretized. The integrated circuit substrate can then be modeled using one or more vertically discretized doping profiles. In this manner, speed and accuracy may be balanced during the modeling process.

According to one aspect of the invention, an integrated circuit substrate is modeled by using an associated doping profile. A position on a surface of the integrated circuit substrate is obtained. A combination of layers associated with the position and defining a vertical column beneath the position is obtained. A doping profile associated with the combination of layers is obtained. The doping profile includes a plurality of portions, each of which is associated with a different range of substrate depth. A model of the substrate may then be generated using the obtained doping profile. Such modeling may similarly be performed using a set of doping profiles.

According to another aspect of the invention, methods and apparatus for characterizing an integrated circuit substrate are disclosed. A set of one or more substrate doping profiles including a net doping level for each one of a plurality of depths within an integrated circuit substrate is obtained. A set (e.g., combination) of layers associated with the set of one or more substrate doping profiles is determined. The set of layers is in an order in relation to a surface of the integrated circuit substrate. By way of example, the set of layers may be sorted with respect to the sequence in which the layers are used during the fabrication process of an integrated circuit. The set of one or more substrate doping profiles is vertically discretized to form a vertically discretized substrate doping profile. A specific combination of layers is then associated with each vertically discretized substrate doping profile.

To simplify the number of computations required to model a high component count substrate, there is included an improved technique for performing surface gridding, which allows highly dense regions to be modeled with dense divisions while less populated regions to be modeled with larger surface divisions. As an object is introduced into the substrate, the local partition impacted is examined to determine if additional divisions are needed for proper surface modeling. As an object is removed, the local/global partitions impacted are reviewed to determine whether simplification may be performed.

In another embodiment, the invention relates to a method for extracting the capacitance value associated with a PN junction along the well-substrate interface for use in modeling the substrate. The method includes receiving the 2-D or 1-D mesh doping profile. The method includes finding a junction curve or transition region that represents the transition between the well and the substrate bulk. The method further includes finding a set of parameters α, β and γ to characterize the junction at a point or a vertical discretization along the transition. During modeling, the set of parameters α, β and γ is then employed, along with the input bias voltage value, to calculate the thickness of the depletion region, which is in turn employed to calculate the capacitance for the well-substrate junction at that point or vertical discretization. The capacitance calculated is then employed to more accurately model the junction at that point or vertical discretization, which leads to a more accurate model for the substrate.

In yet another embodiment, the invention relates to a method for modeling a substrate, which includes obtaining vertically discretized doping profiles in the substrate to facilitate modeling. The method includes employing substrate region names and substrate cross-section names as access keys to permit accessing of the doping profiles. The use of the combination of region names and substrate cross-section names as unique access keys simplifies access to doping profile information for modeling purposes and yields valuable information pertaining to the presence of p-type to n-type material transitions. The information pertaining to transitions may be employed to improve substrate modeling accuracy through the inclusion of junction capacitances with the modeling process.

BRIEF DESCRIPTION OF THE DRAWINGS

The present invention will be readily understood by the following detailed description in conjunction with the accompanying drawings, wherein like reference numerals designate like structural elements, and in which:

To facilitate further understanding of this aspect of the present invention, FIGS. 12A–12F depict a substrate and the partitioning process that occurs when two objects are inserted in sequence.

To facilitate further understanding of this aspect of the present invention.

DETAILED DESCRIPTION OF THE INVENTION

Figure 1:
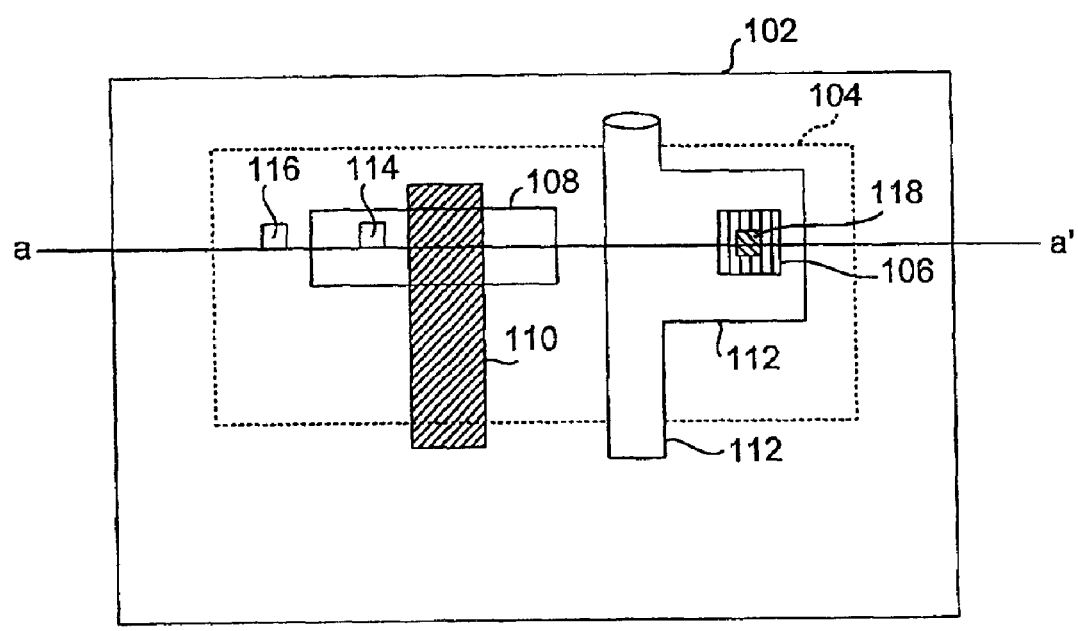
FIG. 1 is a surface view of an integrated circuit substrate in which the present invention may be implemented.

In the following description, numerous specific details are set forth in order to provide a thorough understanding of the present invention. It will be obvious, however, to one skilled in the art, that the present invention may be practiced without some or all of these specific details. In other instances, well known process steps have not been described in detail in order not to unnecessarily obscure the present invention.

An invention is described herein that provides a method and system for IC substrate modeling. The substrate modeling includes modeling characteristics (e.g., electrical or thermal characteristics) of the substrate as well as characteristics at junctions between the substrate and any immediately overlying devices. Through modeling the parasitic effects of a non-ideal substrate, the degradation in ideal operation of a circuit formed on the substrate may be identified. This permits a circuit designer to modify a circuit design such that it is less sensitive to such parasitic effects. Thus, an operational circuit may be fabricated despite the fact that the substrate is a non-ideal medium. Moreover, the likelihood of circuit failure after fabrication may be significantly reduced.

According to one embodiment, a method for characterizing the technology that may be used in a particular substrate is disclosed. As described below, the technology may be characterized through the use of multiple substrate doping profiles. Each of the doping profiles represents a possible combination of doping levels that may be present in a given cross-section of the substrate. In addition, the doping profiles are "vertically discretized" to create subdivisions such that each subdivision corresponds to a range of depth within the substrate. The subdivisions may be placed such that a greater number of subdivisions are created where variation in doping level is greatest. In this manner, the number and location of the subdivisions may be selected such that a balance between accuracy and speed is realized.

According to another embodiment, noise present in the substrate may be modeled through the use of a doping profile. A vertical "column" in the substrate may be selected through selecting a position at a surface of the substrate. A combination of layers associated with this vertical column may then be obtained from a circuit layout. The doping profile associated with this combination of layers may then be obtained. Since resistance is associated with each doping level, equivalent resistances throughout the column may then be obtained. In this manner, the substrate may be modeled. In addition, the resistance and capacitance present at junctions between the substrate and overlying layers may be obtained and utilized to associate the substrate model with an existing model of the devices and/or interconnects of the circuit.

According to yet another embodiment, an integrated circuit substrate is "horizontally discretized" to create partitions across the surface of the substrate. The doping profile corresponding to each partition may then be selected and applied during the substrate modeling. The number and location of the partitions may be selected to promote accuracy as well as efficiency during the modeling process.

Referring first to FIG. 1, a surface view of an exemplary integrated circuit substrate in which the present invention may be implemented is illustrated. As shown, the integrated circuit may be a single MOS transistor. However, those of ordinary skill in the art will readily recognize that the present invention may be useful for a variety of substrates as well as an unlimited number of devices. Integrated circuit substrate 102 includes a p-well 104, p-type diffusion region 106, n-type diffusion region 108, and polysilicon 110. In addition, a metal interconnect 112 is shown. A first vertical column designated by position 114 may be obtained. Similarly, a second vertical column designated by position 116 may be obtained. The first vertical column may be associated with a first doping profile and the second vertical column may be associated with a second doping profile. Each of these doping profiles includes varying net doping levels across the depth of the substrate 102. The metal interconnect 112 is connected to the p-type diffusion region 106 through a contact 118.

Figure 2A:
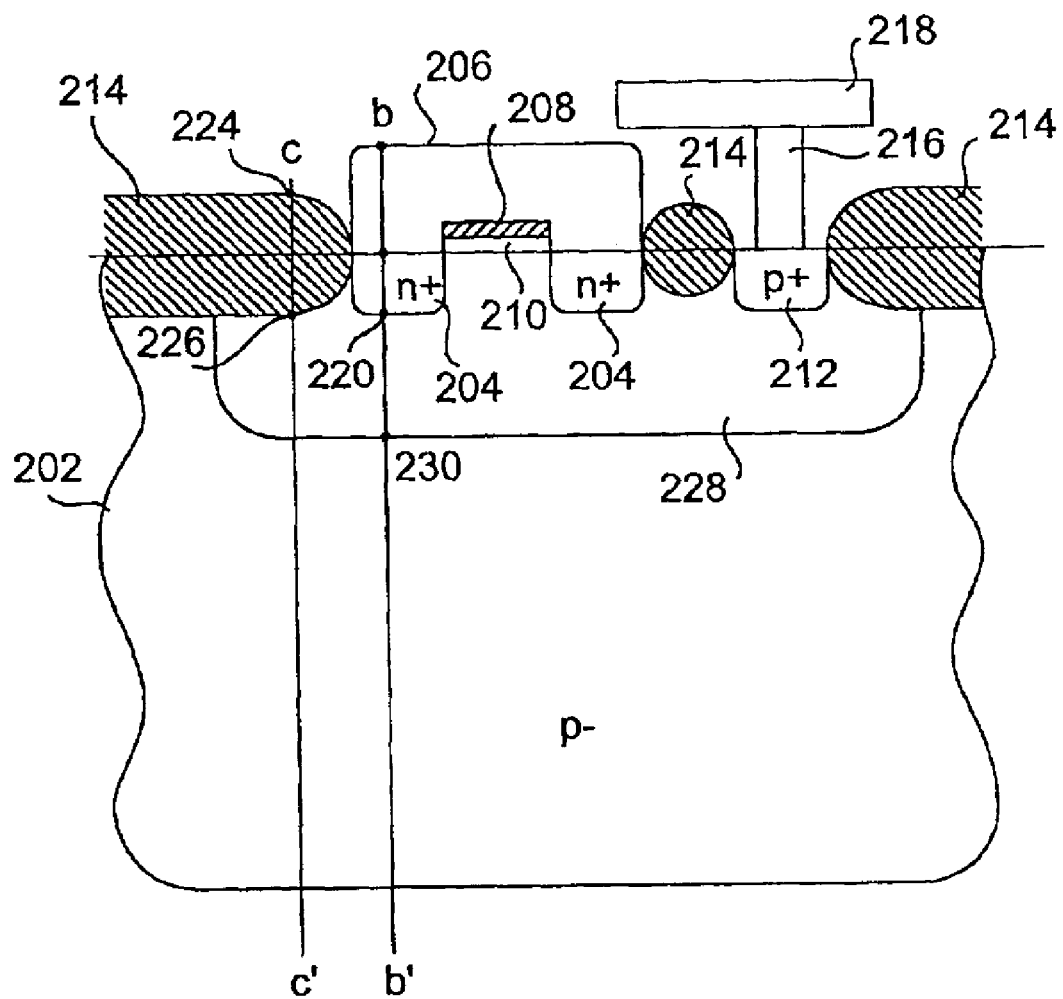
FIG. 2A is a cross-sectional view along the line a–a' of FIG. 1.

FIG. 2A is a cross-sectional view along the line a–a' of FIG. 1. Integrated circuit substrate 202 includes n+ diffusion region 204 that forms a part of integrated circuit device 206. In addition, polysilicon layer 208 is formed above dielectric layer 210. A heavily doped p+ diffusion region 212 is formed in the integrated circuit substrate 202 which may be made from silicon or other suitable material. As shown, local oxidation of silicon (LOCOS) 214 is formed in the integrated circuit substrate 202. Moreover, metal contact 216 connects metal interconnect 218 to the p+ diffusion contact region 212. The first column designated by the position 114 of FIG. 1 extends across the line b–b'. As shown, a portion of the first column 114 passes through nodes 220 and 222 within the n+ diffusion region 204. However, the n+ diffusion region 204 is part of the device 206 and is therefore modeled during device modeling rather than substrate modeling. Similarly, the second column designated by the position 116 of FIG. 1 extends across the line c–c'. A portion of the second column 116 defines the local oxidation 214 bounded by nodes 224 and 226. In addition, p-type well 228 includes the device 206. The bottom of the p-well is shown at node 230.

Figure 2B:
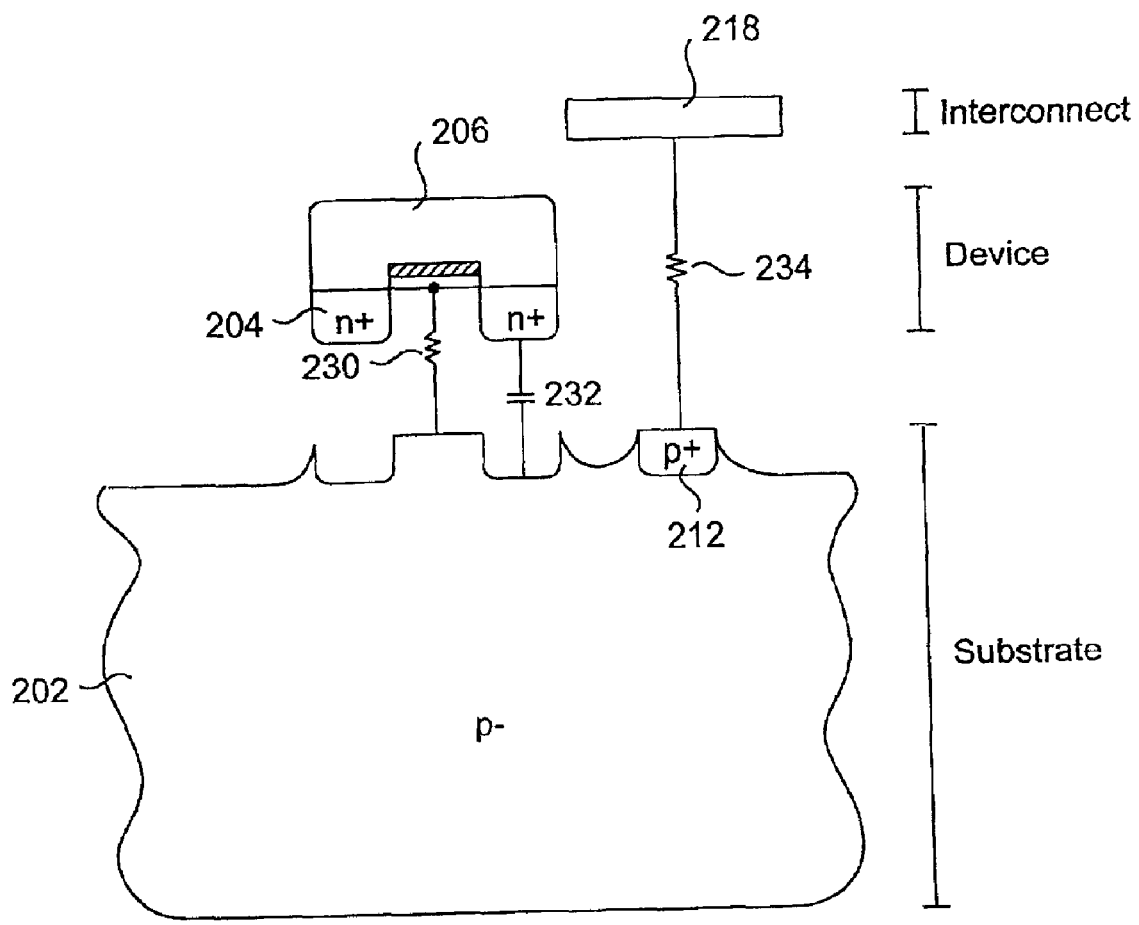
FIG. 2B is an exploded view of FIG. 2A exhibiting levels of modeling that may be used to simulate the structure illustrated in FIG. 1.

Referring now to FIG. 2B, an exploded view of FIG. 2A is illustrated. The integrated circuit substrate 202 and each interface (230, 232, and 234) between the substrate and layers directly above the substrate may be modeled according to the present invention. As shown, the integrated device 206 is connected resistively 230 and capacitively 232 by the n+ diffusion region 204 to the substrate 202. In addition, since the p+ diffusion region 212 is part of the substrate 202, the metal interconnect 218 is resisitively 234 interfacing with the substrate 202. Accordingly, the entire substrate and substrate interfaces may be modeled utilizing the present invention.

Figure 3:
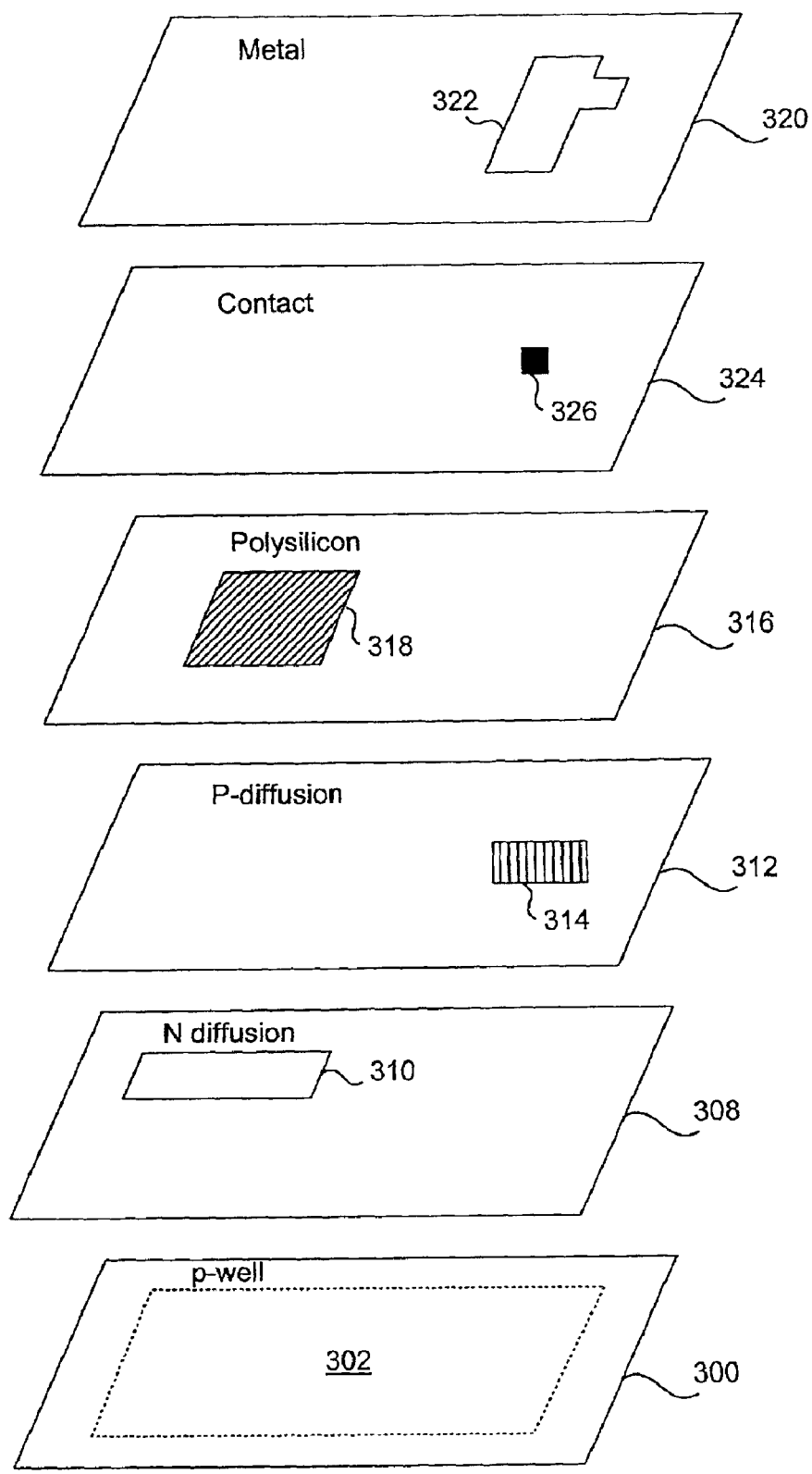
FIG. 3 is a layout view of each layer within FIG. 1 used to mask etching and implantation during the fabrication process.

A layout view of the more relevant masks used to fabricate the structure depicted in FIG. 1 is illustrated in FIG. 3. Layer 300 includes p-well 302, layer 308 includes n+ diffusion region 310, layer 312 includes p+ diffusion region 314, layer 316 includes polysilicon 318, layer 320 includes metal line 322, and layer 324 includes contact 326. These ordered layers may then be associated with a doping profile. As will be described in further detail herein, a key may be associated with each doping profile to permit a circuit layout such as that illustrated in FIG. 3 to be associated with multiple doping profiles.

Figure 4:
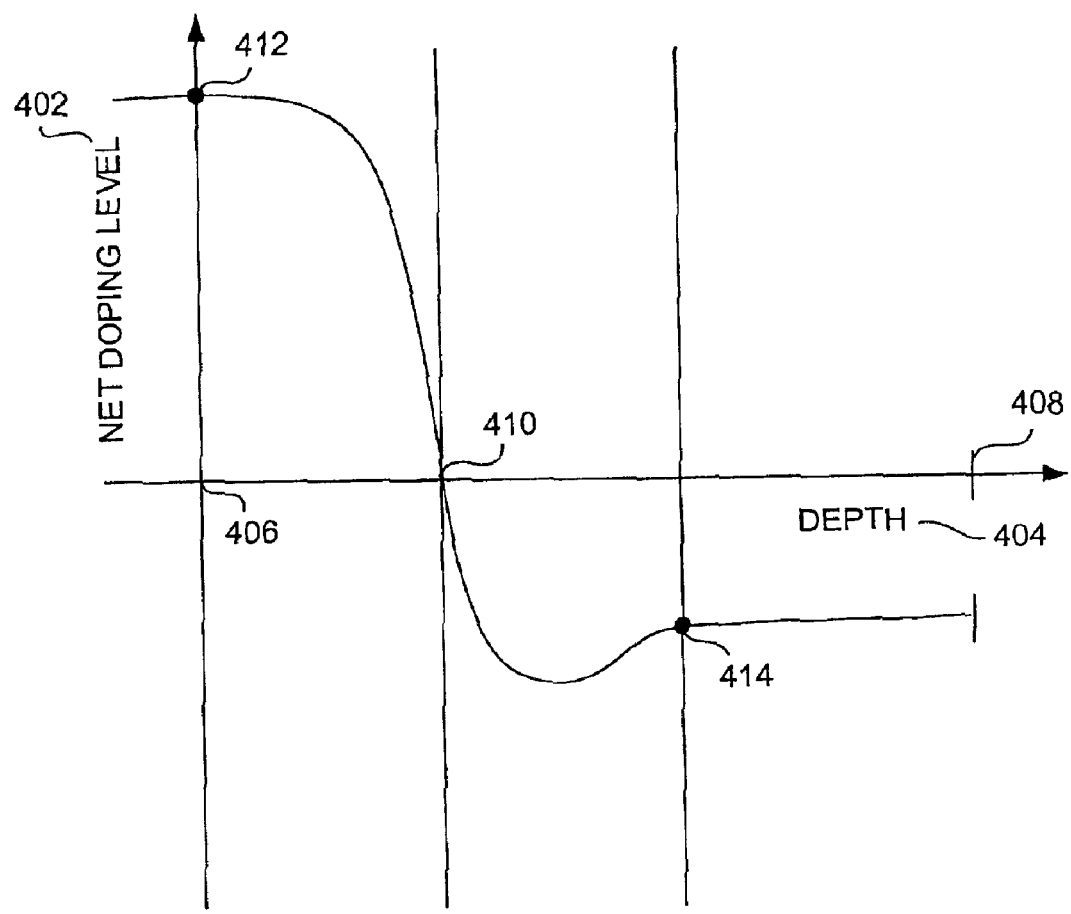
FIG. 4 is a graph illustrating an exemplary doping profile taken along the line b–b' of FIG. 2A according to one embodiment of the invention.

Each doping profile includes a net doping level obtained across a cross-section of the substrate. Referring next to FIG. 4, a graph illustrating an exemplary doping profile taken along the line b–b' of FIG. 2A according to one embodiment of the invention is presented. As shown, the graph illustrates a net doping level 402 along the y-axis and the depth 404 of the substrate along the y-axis. Thus, the top surface 406 of the substrate is designated at the point (0,0) of the graph, while the bottom of the substrate is designated at point 408. In addition, the n+ diffusion region of FIG. 2A is bounded by points 410 and 412, which correspond to the net doping level found at nodes 220 and 222 of FIG. 2A. Since this n+ diffusion region is part of the device 206 shown in FIG. 2A, this portion is not utilized during the substrate modeling. Additionally, the bottom of the p-well is shown by point 414, which corresponds to the net doping level found at node 230 of FIG. 2A.

Figure 5:
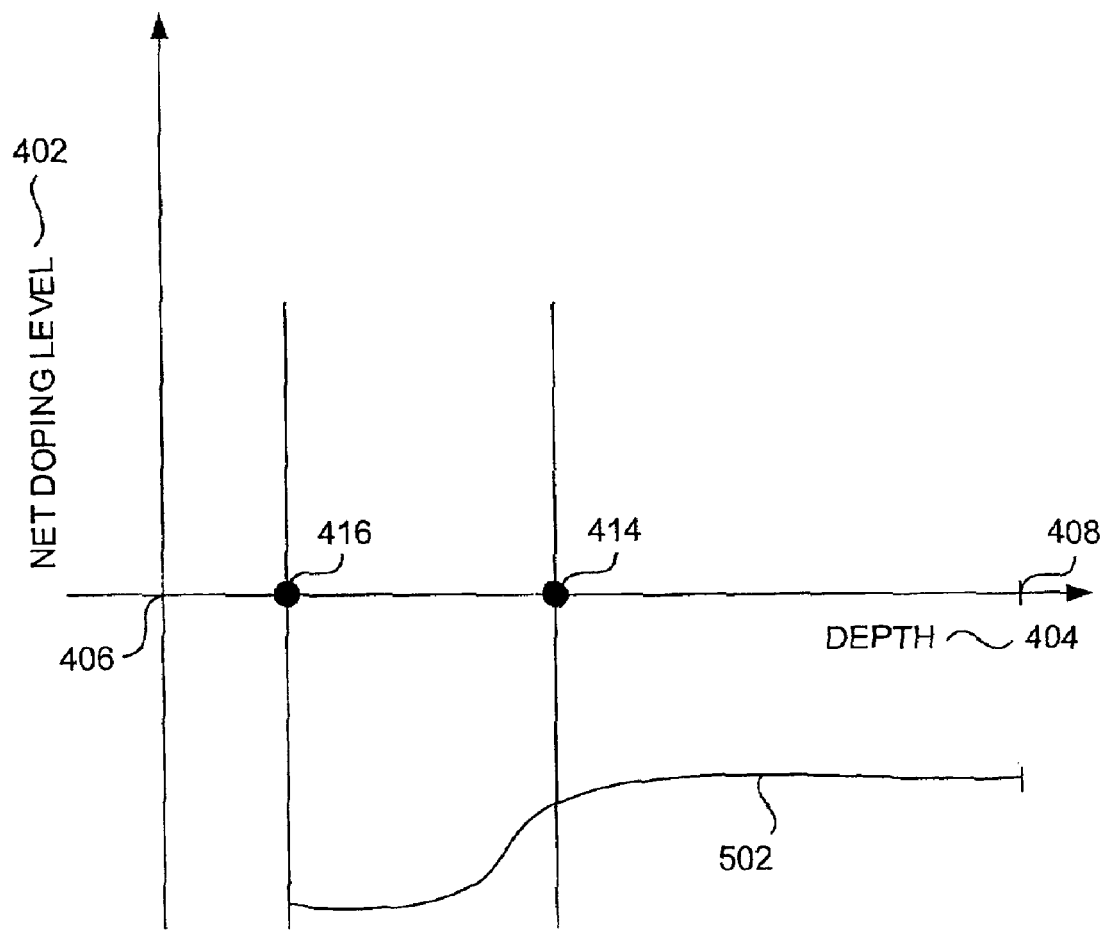
FIG. 5 is a graph illustrating an exemplary doping profile taken along the line c–c' of FIG. 2A according to one embodiment of the invention.

FIG. 5 similarly illustrates another exemplary doping profile taken along the line c–c' of FIG. 2A according to one embodiment of the invention. In this doping profile 502, the region bounded by the point 406 and point 414, which corresponds to the net doping level at the node 226 of FIG. 2A, includes LOCOS and therefore this region is not included in the substrate modeling. Moreover, as shown, the net doping level is approximately uniform from point 414 down to point 408 near the bottom of the substrate.

The doping profiles may be obtained in several ways. By way of example, net doping levels may be obtained through measurement using a tool such as a scanning electron micrograph. As yet another example, conventional simulation tools such as "TSUPREM" available from Avant!, located in Fremont, Calif. and "SSUPREM3" available from Silvaco, located in Santa Clara, Calif. may be used. Since each device element is typically repeated in multiple locations on a substrate of a typical circuit, each doping profile may be employed to represent more than one vertical column in a given circuit. By way of example, a drain or source of a MOS transistor will be repeatedly formed on the substrate. It is not necessary to provide a separate doping profile for each drain or source of these multiple MOS transistors formed on the substrate. Thus, for a typical circuit, approximately ten profiles may be sufficient to model the substrate.

Figure 6A:
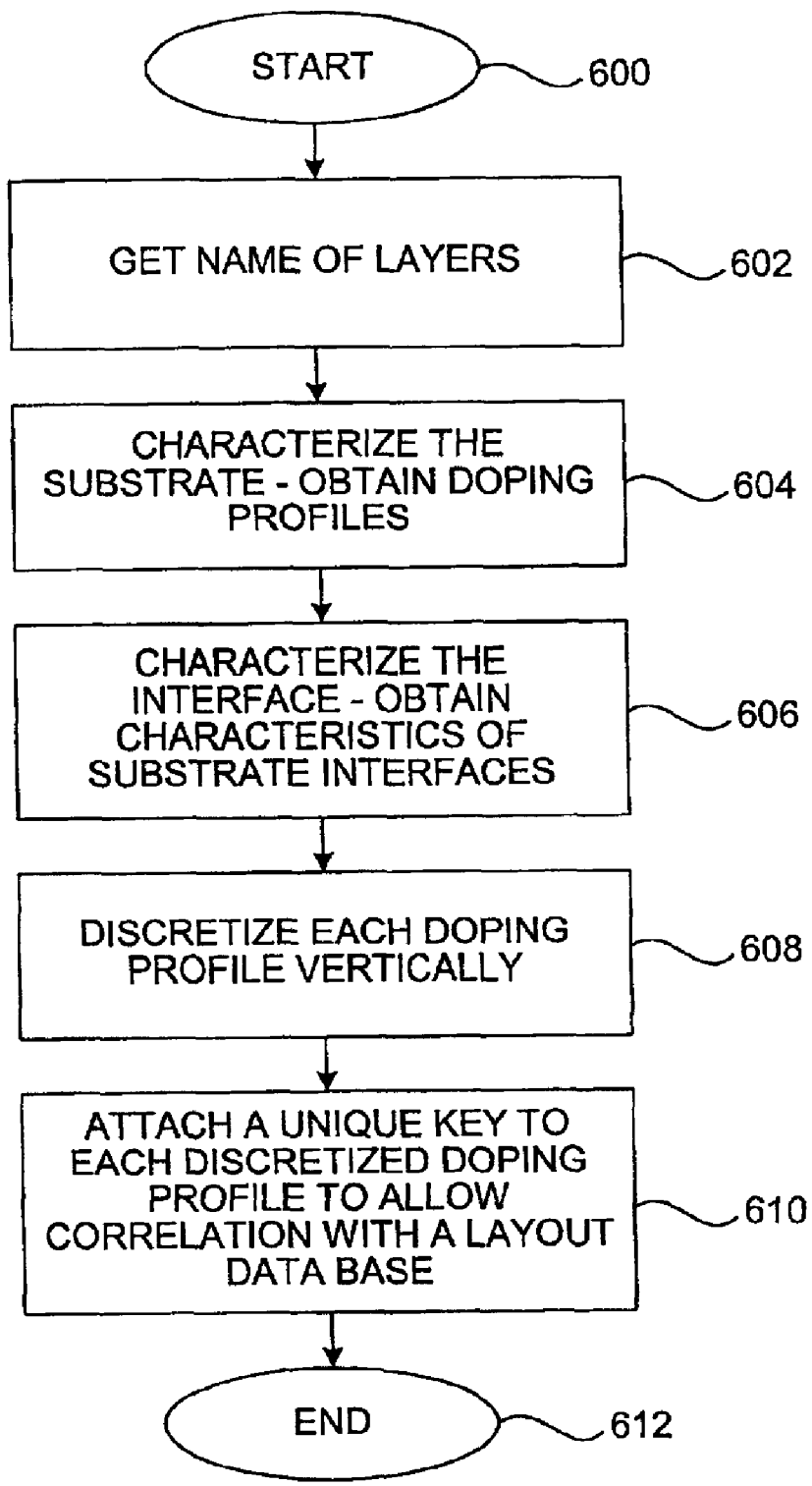
FIG. 6A is a flow diagram illustrating a method for characterizing a particular technology which may be used in a circuit layout according to one embodiment of the invention.

Prior to modeling the substrate of a particular circuit, the technology may be characterized. Referring next to FIG. 6A, a flow diagram illustrating a method for characterizing a particular technology which may be used in a circuit layout according to one embodiment of the invention is presented. The method starts at step 600. At step 602, a name for each layer that may be used in a circuit layout is obtained. By way of example, each combination of layers that may be used in a particular technology (e.g., fabrication process) may be obtained. Moreover, each combination of layers may be in an order in relation to a surface of the substrate. Next, at step 604, an integrated circuit substrate is characterized. According to one embodiment, the substrate is characterized through obtaining a substrate doping profile associated with each possible ordered combination of layers. The layer names and the substrate doping profiles may be obtained from a process engineer such that a relationship between each possible combination of layers and each one of the substrate doping profiles may be ascertained. Thus, the maximum number of substrate doping profiles is $2^n$ where n is the number of unique layers that may be used during fabrication in this particular technology. However, various combinations of these layers may not be permissible in the construction of certain devices. Thus, the number of possible combinations of layers and therefore the number of profiles will be less than this maximum number of profiles.

In addition to the doping profiles, the characteristics of interfaces between the substrate and overlaying devices or interconnects are obtained at step 606. These characteristics may include electrical characteristics such as capacitance and resistance between the substrate and an overlaying circuit layer. By way of example, the overlaying layer may include interconnect lines as well as devices formed above the substrate. According to one embodiment, the capacitance and resistance between the substrate and a layer in immediate contact with the substrate are obtained. Since layers not in direct contact with the substrate are effectively shielded from the substrate by the layer that is in direct contact with the substrate, the interface with these layers may be effectively ignored. Alternatively, the capacitance and resistance between these shielded layers and the substrate layer may be orders of magnitude less than that between the substrate and the layer in immediate contact with the substrate. Moreover, other characteristics of the interface such as thermal characteristics may be obtained. The characteristics of each interface may similarly be obtained from a process engineer.

Since each doping profile includes a large number of data points, it is desirable to "compress" these data points to reduce the number of operations that are performed and therefore increase the speed of the modeling process. Thus, once the doping profiles are obtained, the data points, or values, within each doping profile may be "compressed" at step 608. Each doping profile may be compressed through "vertical discretization." However, it is imperative that this compression be performed without unduly sacrificing the accuracy of the modeling process. One method for performing the vertical discretization will be described in further detail in FIGS. 8A–8D.

Next, at step 610, the ordered combination of layers is associated with the corresponding substrate doping profile. According to one embodiment, a unique key is attached to each discretized doping profile to allow correlation with a layout database during the modeling process. The unique key may be created using the ordered combination of layers that may be present in a vertical column within the substrate. The process is completed at step 612. Once the technology has been characterized, the layout information may be utilized during the substrate modeling.

Figure 6B:
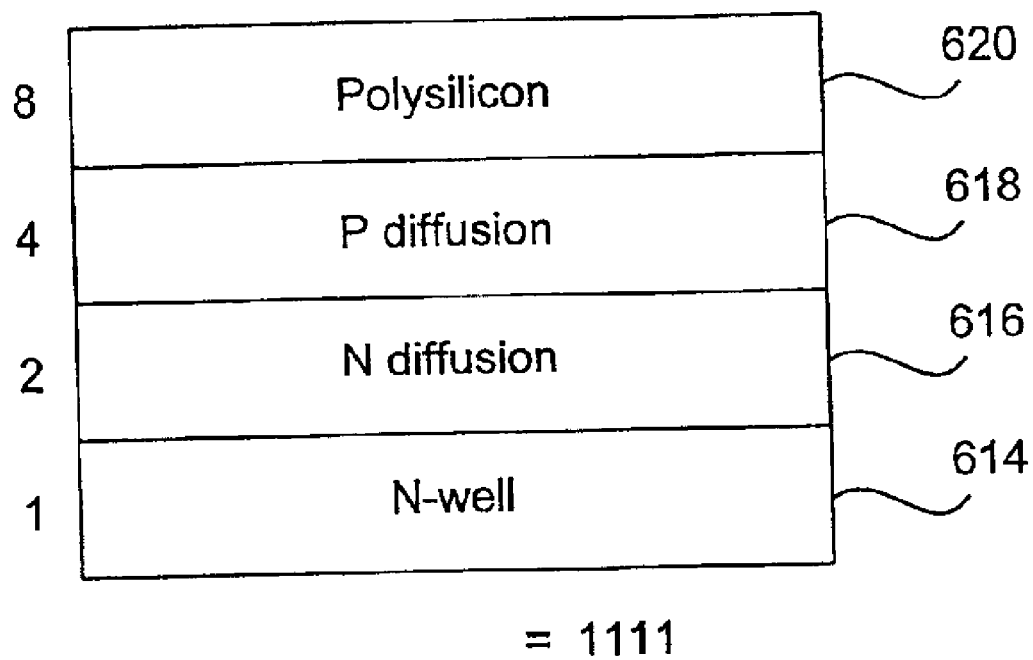
FIG. 6B is a diagram illustrating one method for obtaining a binary key to a doping profile as provided in FIG. 6A.
Figure 6B:
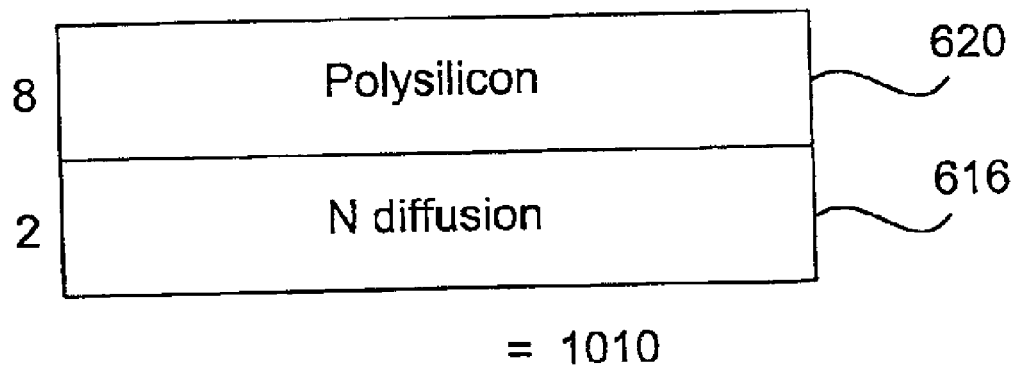

One method for obtaining a binary key to a doping profile as provided in step 610 of FIG. 6A is illustrated in FIG. 6B.

Since the layers in a vertical column at a given location (x, y) are provided in a specified order, the order of the layers may be used to obtain the binary key. By way of example, each ordered layer may be associated with a binary number. A binary key may therefore be obtained by adding the binary number associated with each layer. As shown, a first layer 614 may be an n-well, a second layer 616 may be an n-type diffusion layer, a third layer 618 may be a p-type diffusion layer, and a fourth layer 620 may be a polysilicon layer. If the first layer 614 is given a value of 1, the second layer 616 is given a value of 2, the third layer 618 is given a value of 4, and the fourth layer 620 is given a value of 8, this particular vertical column of layers has a value of 15, or a binary key of 1111.

As yet another example, a doping profile may have a polysilicon layer 620 and an n-type diffusion layer 616. As described above, the polysilicon layer 620 may have a value of 8 and the n-type diffusion layer 616 may have a value of 2. Thus, a binary key of 1010 may be created.

Figure 11A:
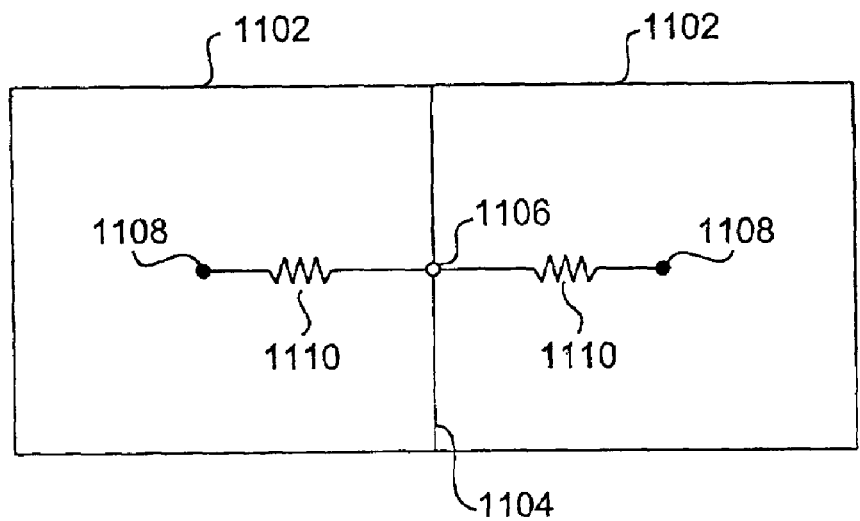
FIG. 11A is an exemplary diagram illustrating a global grid provided across a surface of the integrated circuit substrate according to an embodiment of the invention.

Horizontal discretization of the circuit may be performed to ascertain each position or area of interest in which the characterized technology is modeled. Horizontal discretization may be performed according to various methods. One method includes creating a global grid across a surface of the integrated circuit substrate. The global grid may be uniform or non-uniform. By way of example, a uniform global grid may be created such that it is aligned to the smallest component in the circuit layout. This global grid may be used where all global elements are approximately identical in size. As shown in FIG. 11A, an exemplary global grid is provided across the surface of the integrated circuit substrate. Global elements 1102 are approximately identical in size. A segment from global grid 1104 separates the global elements 1102. By way of example, the size of the global segment 1104 may be provided by the design engineer. As yet another example, the maximum number of global segments may be fixed. Accordingly, the size of the global segments may be determined by the size of the integrated circuit to be modeled divided by the maximum number of global segments. Global node 1106 of the integrated circuit substrate or substrate model connects the two global elements 1102. In addition, local nodes 1108 within the global elements 1102 are shown. A component such as resistance 1110 of the substrate model connects local nodes 1108 to global node 1106. Another method includes creating a local grid within a section of the global grid.

Figure 11B:
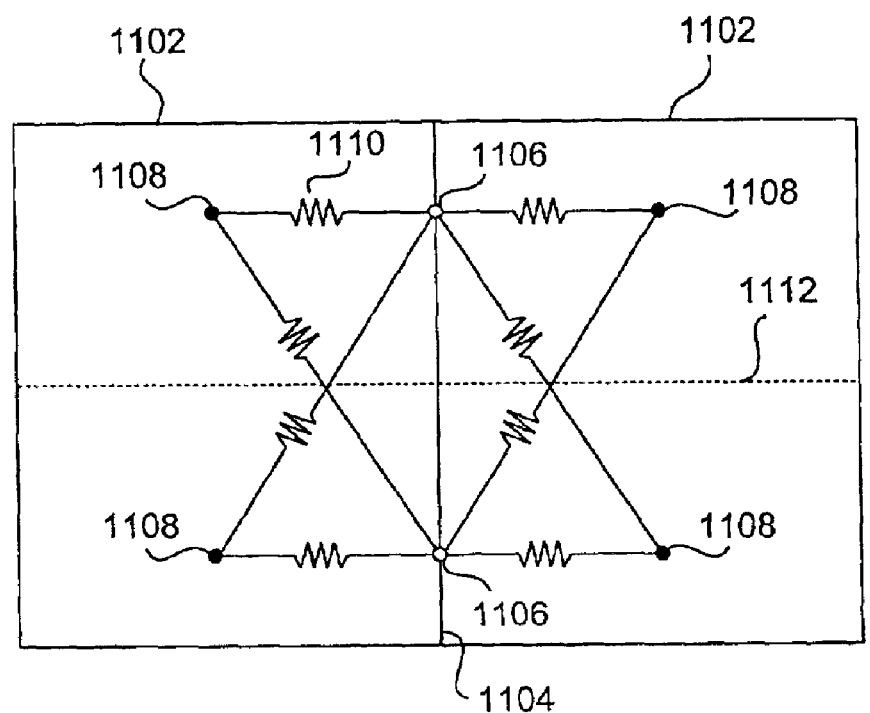
FIG. 11B is an exemplary diagram illustrating over-gridding that splits a segment of the global grid according to an embodiment of the invention.

One method for creating a local grid includes overgridding. As shown in FIG. 11B, during overgridding, one or more local grid segments 1112 may be created within the global elements 1102. As shown, the global segment 1104 that is common to two global elements may be split and additional global nodes 1106 may be introduced. The global nodes 1106 may be placed along one or more of the global segments 1104 such that the global segments are subdivided into portions by the global nodes 1106. These global segment portions may be equal or unequal in length. The addition of n global nodes will create n+1 global segment portions. By way of example, as shown in FIG. 11B, the placement of an additional global node creates two additional global segment portions, resulting in two global nodes and three global segment portions. The local grid of the global element 1102 is refined by adding local grid line 1112 together with local nodes 1108. During overgridding, when a local grid line is added, the line divides the global segment 1104 and the corresponding global element 1102 or portion thereof in two portions. The portions are preferably equal but may also be unequal in dimension. By way of example, when more than one local grid line is added during overgridding, the local grid lines may be spaced evenly. As yet another example, the local grid lines may be spaced unevenly to divide the global element into portions having varying dimensions. This may be useful to provide larger portions in the middle of the global element and smaller portions near the boundary of the global element. The local nodes 1108 are then placed in the middle of each newly created portion of the global element 1102, which may be termed "local grid elements." The local grid segments 1112 increase the number of global nodes 1106 connecting two global elements 1102, as shown in FIGS. 11A and 11B. In this manner, the number of global nodes connecting two global elements may be increased when the size of the global segment is large to improve the accuracy of the substrate model.

Figure 11C:
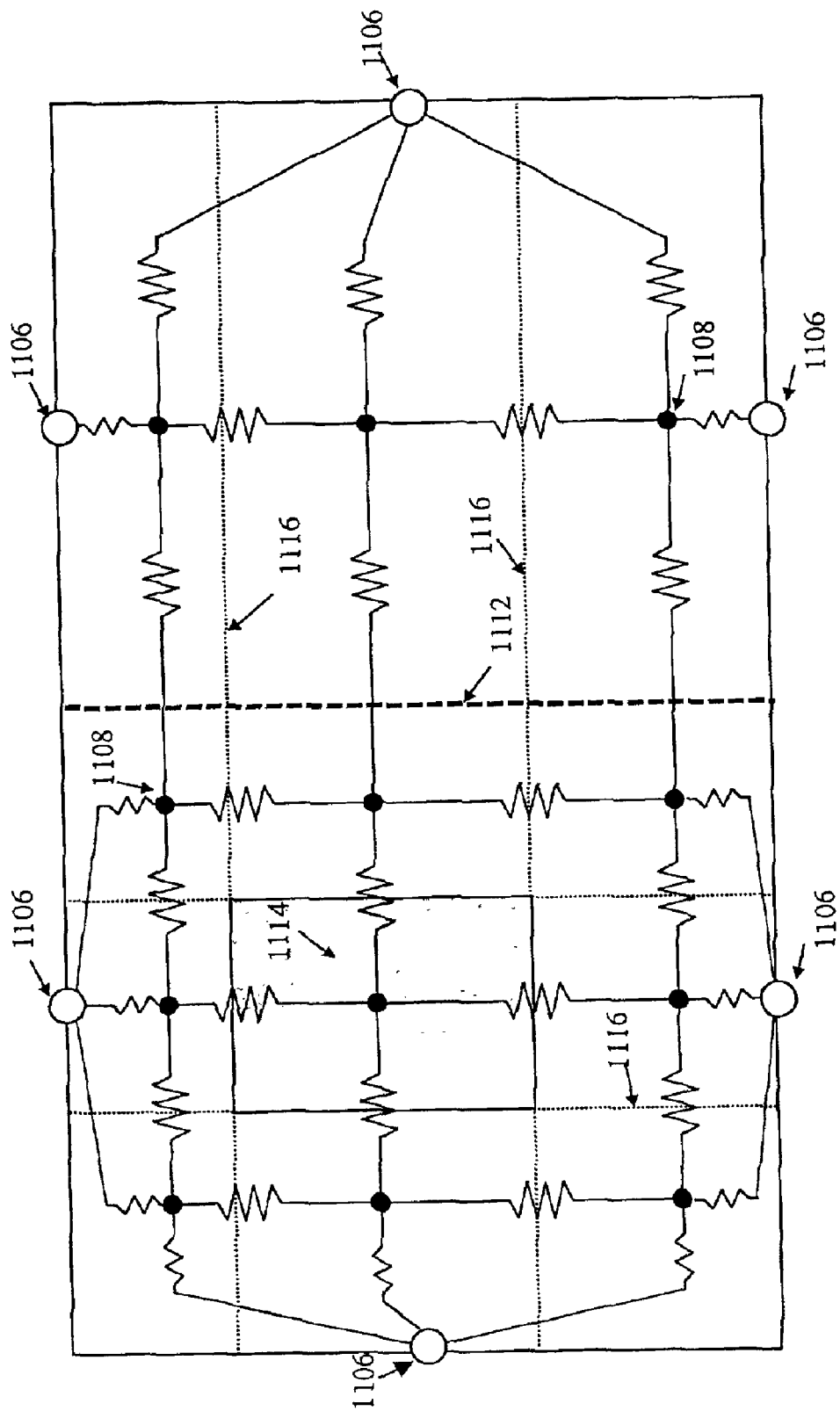
FIG. 11C is an exemplary diagram illustrating local gridding used to refine the horizontal discretization around devices and interconnect interfaces with the substrate.

Another method for creating the local grid is to add lines where the density of components (devices and interconnects interfacing with the substrate) is high. As shown in FIG. 11C, component 1114 is bounded by local grid lines 1116 and additional local nodes 1108. The local nodes 1108 are placed in the middle of the local grid elements, as described above. The global nodes 1106 are connected with the closest local nodes 1108. As a result, the local grid 1116 will be fine where the density of the components 1114 is high. As yet another example, a local grid may not be necessary where a global element contains no components. Thus, the level of resolution may be separately maximized for each global element, therefore enhancing the accuracy as well as the efficiency of the substrate modeling.

Figure 7:
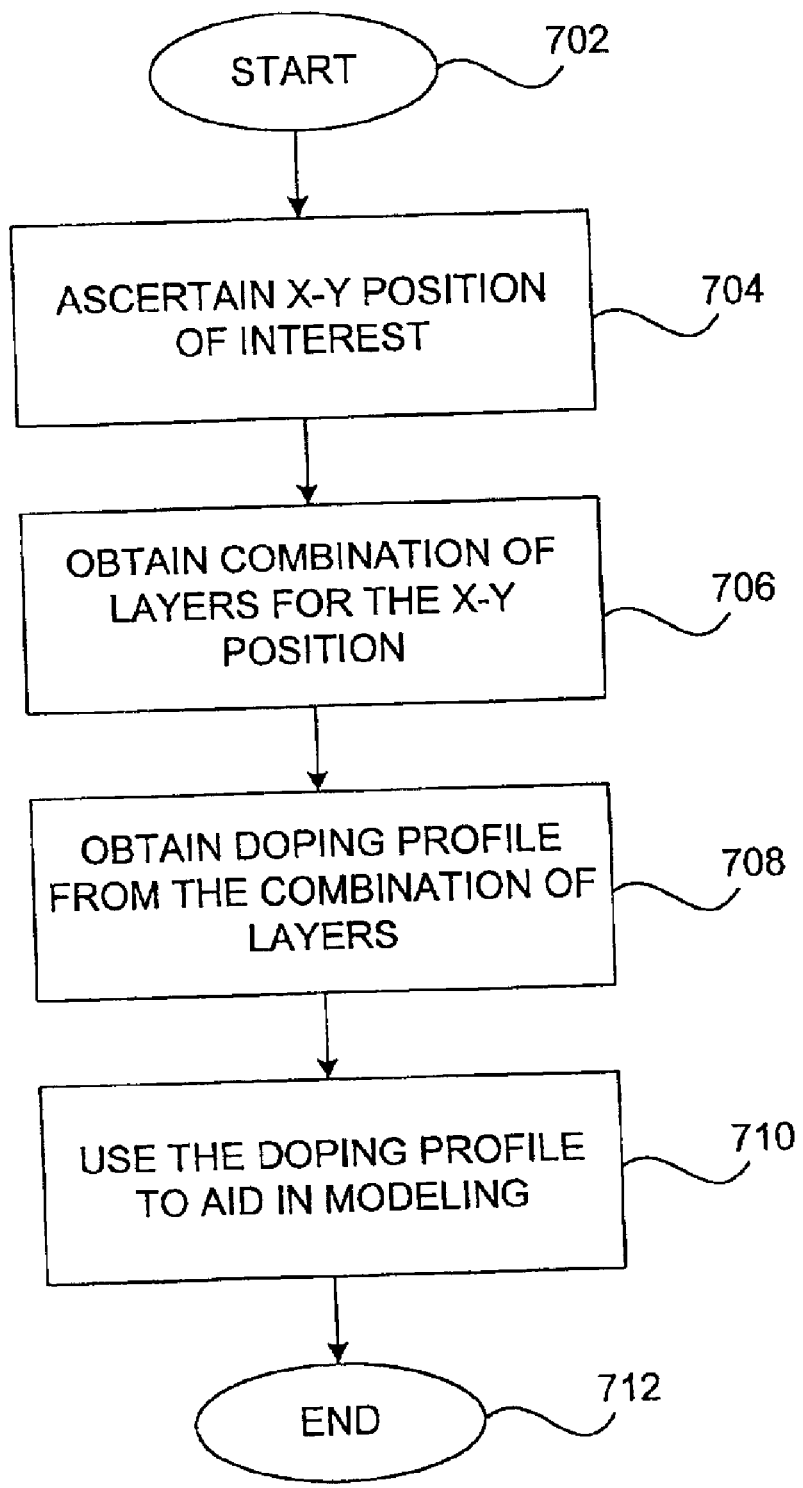
FIG. 7 is a flow diagram illustrating a method for applying the characterized technology obtained in FIG. 6A to a specific circuit layout according to one embodiment of the invention.

Once horizontal discretization of the circuit is completed, substrate modeling may be performed for each position or area defined by the horizontal discretization process. FIG. 7 illustrates a method for applying the characterized technology obtained in FIG. 6A to a specific circuit layout according to one embodiment of the invention. The process begins at step 702. At step 704, a position (x, y) of interest on a surface of an integrated circuit substrate is obtained. By way of example, a surface view of a circuit such as that illustrated in FIG. 1 may be provided, allowing a user to select the desired position. Next, a combination of layers defining a vertical column beneath the position may be obtained at step 706. By way of example, this combination of layers may be obtained from a layout database. Next, at step 708, a doping profile associated with the combination of layers may be retrieved. By way of example, the doping profile may be obtained through the use of a binary key associated with the combination of layers, as described above. The doping profile may then be used to aid in the modeling process at step 710. The process is completed at step 712.

As described in step 608 of FIG. 6A, each doping profile may be vertically discretized through creating a plurality of subdivisions across the depth of the substrate. Each one of the plurality of subdivisions may be created at a different substrate depth such that the number of subdivisions within a range of substrate depth is inversely proportional to the variation in doping level for one or more doping profiles. Thus, the number of subdivisions within each doping profile is minimized to achieve maximum speed. At the same time, a sufficient number of subdivisions are positioned to provide sufficient accuracy during the modeling process. Accordingly, speed of computation is achieved without sacrificing accuracy of the substrate modeling.

Figure 8A:
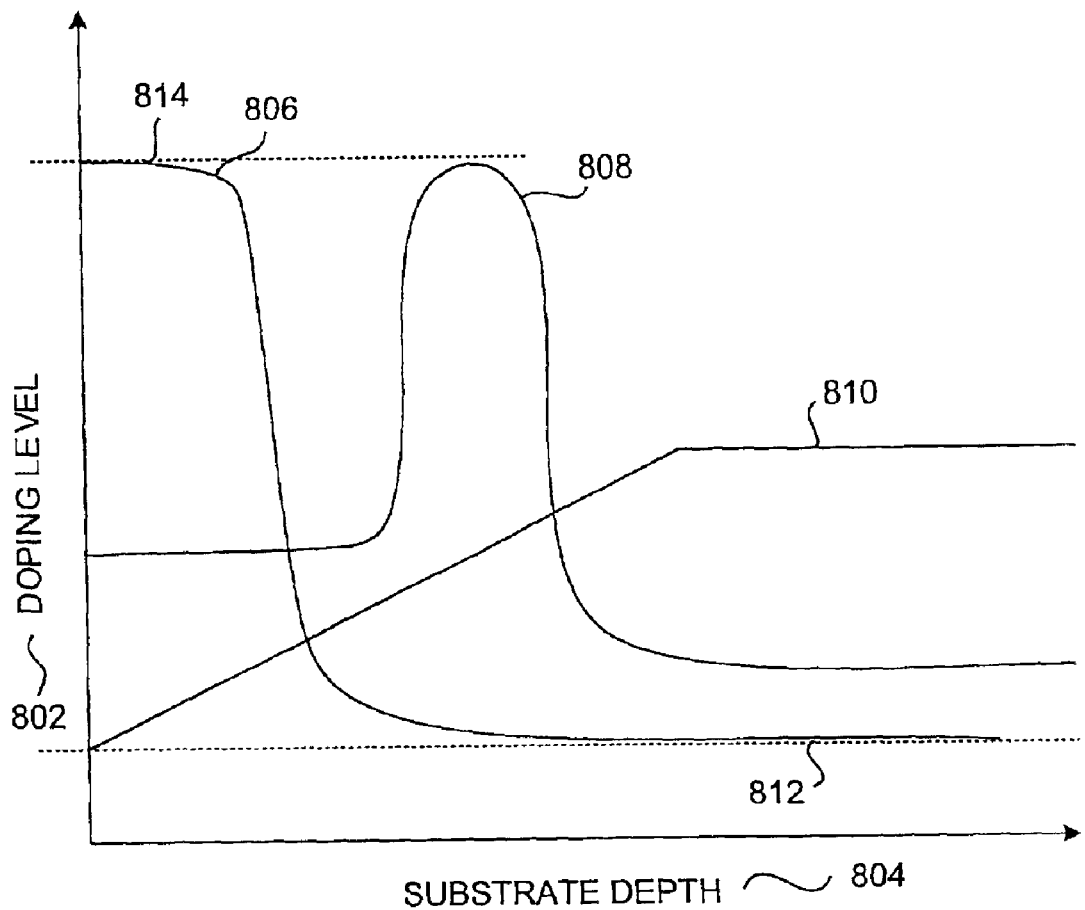
FIG. 8A is an exemplary graph superimposing multiple doping profiles which may be present in a substrate such as that illustrated in FIG. 2A.

One method for vertical discretization includes simultaneously aligning subdivisions for a plurality of doping profiles and is illustrated generally in FIGS. 8A–8D. FIG. 8A is an exemplary graph superimposing multiple doping profiles which may be present in a substrate such as that illustrated in FIG. 2A. The net doping level is illustrated along the y-axis 802 while the substrate depth is illustrated along the x-axis 804. As shown, a first doping profile 806, a second doping profile 808, and a third doping profile 810 are shown. Each level of doping translates into a resistance that is used to provide a substrate model or simulation. By way of example, lower doping levels 812 correspond to a high level of resistance. Similarly, higher doping levels 814 correspond to a low level of resistance. Thus, each doping profile has a corresponding resistivity profile. The resistivity profile therefore includes a resistance corresponding to the net doping level at each one of the plurality of depths within the integrated circuit substrate. The resistance may be obtained from the net doping levels as provided in "Computer Aided Analysis of Parasitic Substrate Coupling in Mixed Digital-Analog CMOS Integrated Circuits" by Franchise Clement, presented at the Electrical Engineering Department of (École Polytechniqe Fédérale De Lausanne), 1995. This reference is incorporated herein by reference in its entirety and for all purposes. As shown, the resistance will be approximately uniform for a given doping profile as the substrate depth 804 increases. As previously described, each doping profile may contain thousands of points. Thus, it would be desirable to minimize the number of points utilized through the creation of subdivisions at selected depths in the substrate. Since it is preferable to create subdivisions at equivalent substrate depths for each of the doping profiles, it is desirable to ascertain optimum substrate depths at which to place subdivisions for all doping profiles for a given substrate.

Figure 8B:
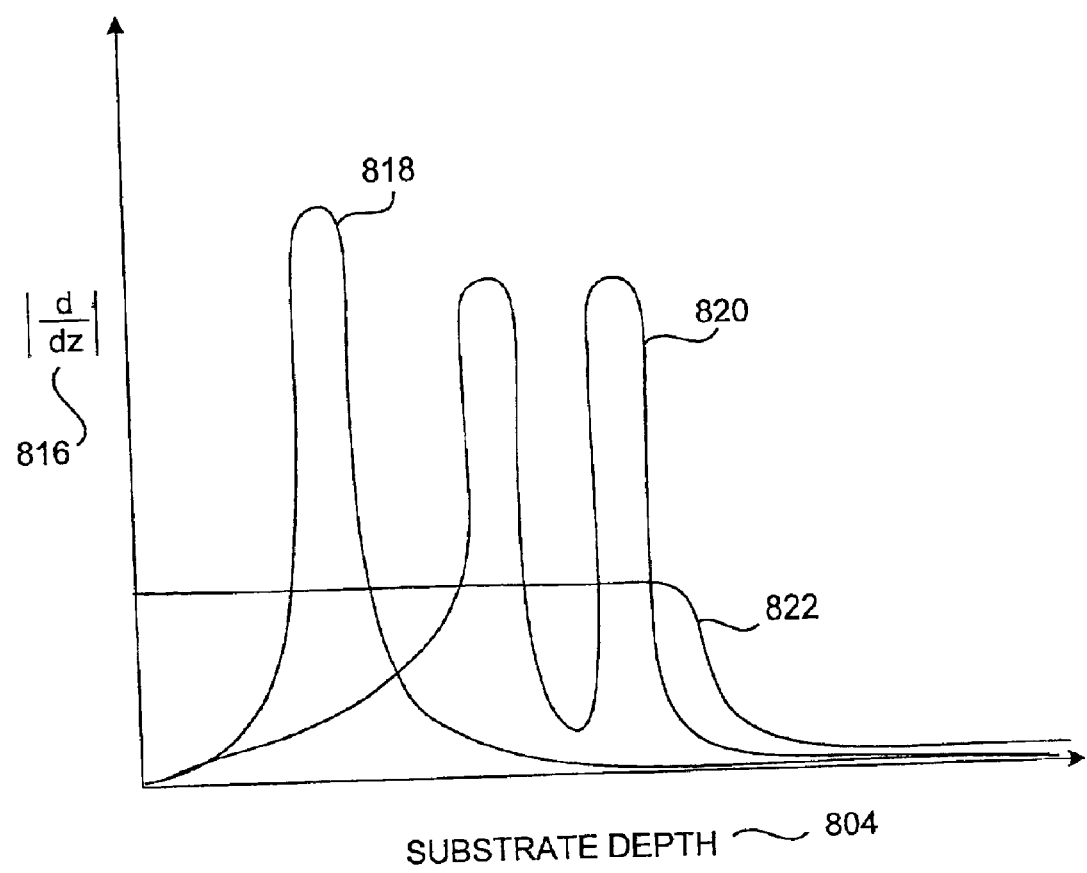
FIG. 8B is an exemplary graph illustrating the absolute values of the slopes of the resistivity associated with the doping profiles of FIG. 8A.

Since resistivity rather than net doping level is used during substrate modeling, one method for positioning subdivisions for selected doping profiles is through determining the amount of variation of resistivity with respect to the substrate depth. This may be accomplished through ascertaining the slope of each resistivity profile. Since it is irrelevant whether the resistivity is increasing or decreasing, the absolute value of the slope may be obtained. FIG. 8B is an exemplary graph illustrating the absolute values of the slopes of the resistivity profiles of FIG. 8A. Those of ordinary skill in the art will readily recognize that the slope of each resistivity profile may be obtained through calculating the derivative of the resistivity profile curves illustrated in FIG. 8A. Thus, the absolute value of the slope is shown along the y-axis 816 and the substrate depth is shown along the x-axis 804. As shown, the absolute value of the slopes, or derivatives, of the first doping profile 818, the second doping profile 820, and the third doping profile 822 are illustrated.

Figure 8C:
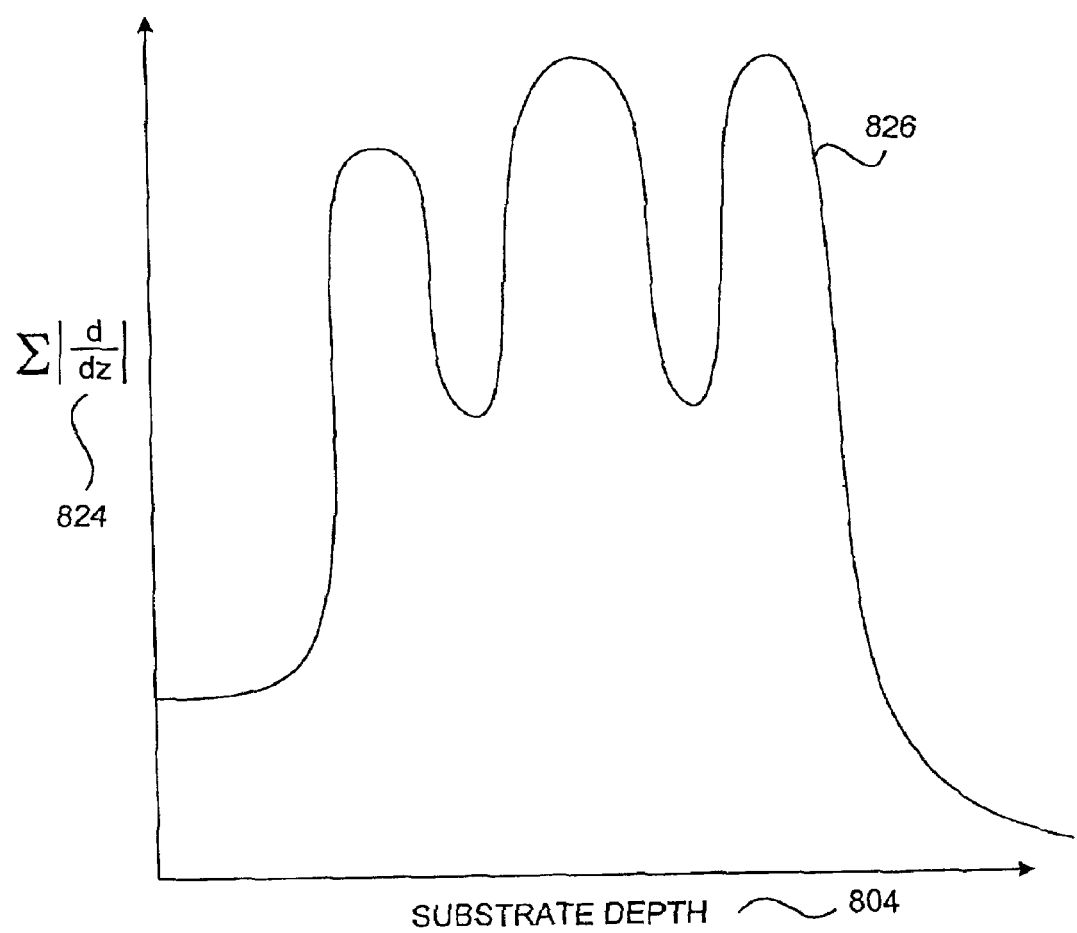
FIG. 8C is an exemplary graph illustrating the sum of the curves illustrated in FIG. 8B.

Once the resistivity variation is obtained for each of the profiles, these variations may be combined to obtain an overall variation in the resistivity for multiple doping profiles. FIG. 8C is an exemplary graph illustrating the sum of the curves illustrated in FIG. 8B. As shown, the y-axis represents the sum of the resistivity profile derivatives associated with multiple doping profiles 824 across the depth of the substrate, represented by the x-axis 804. Thus, the sum of the absolute values for multiple resistivity profile derivatives is obtained to yield the overall variation 826 in the resistivity.

Figure 8D:
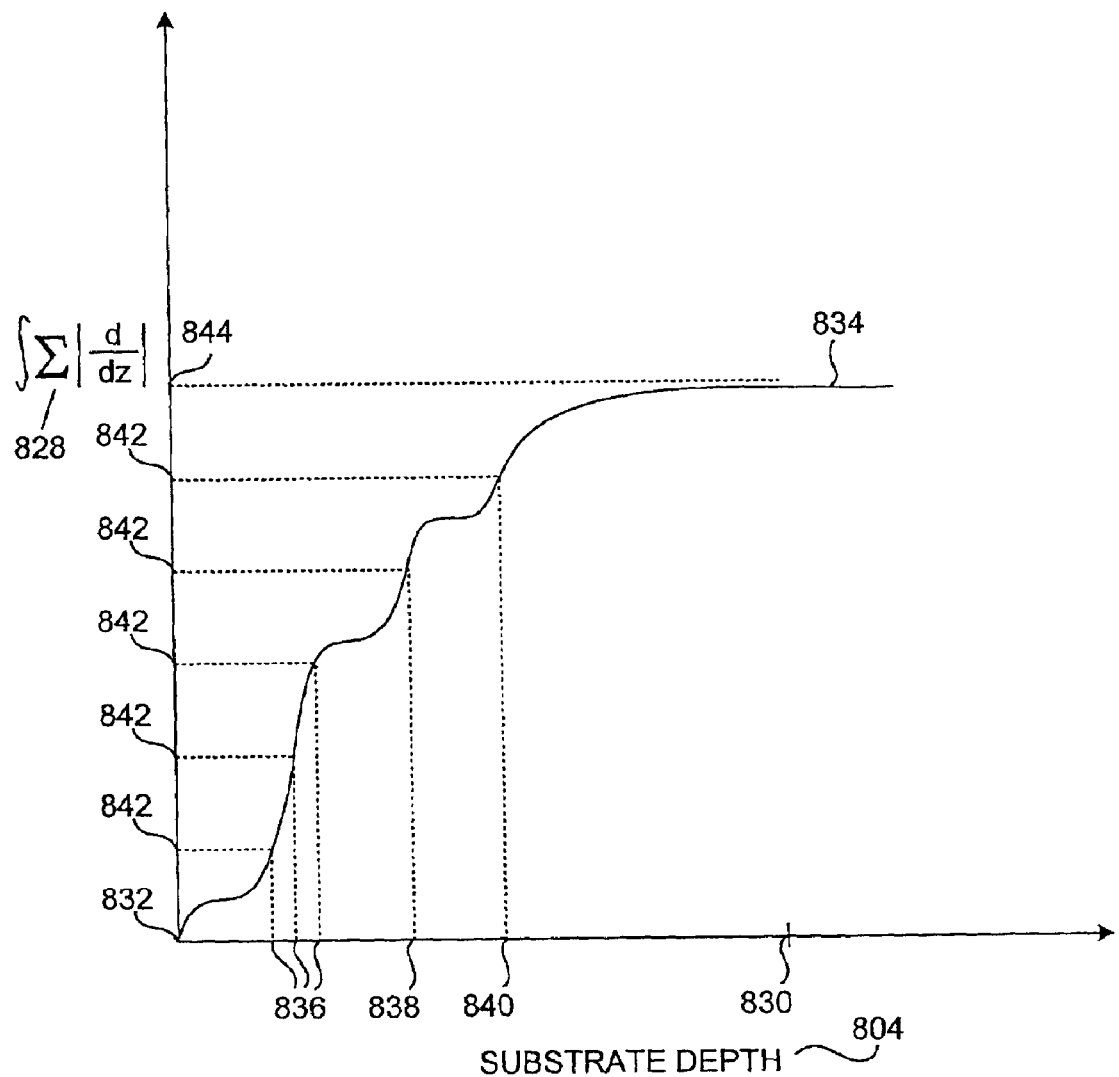
FIG. 8D is an exemplary graph illustrating the integral of the summed curve illustrated in FIG. 8C.

Through integrating the curve illustrated in FIG. 8C representing the overall variation in the resistivity, it is possible to obtain the area under the curve representing this overall variation. FIG. 8D is an exemplary graph illustrating the integrated sum 828 along the y-axis vs. the depth of the substrate along the x-axis 804. As shown, at a maximum substrate depth 830, the resistance will be approximately uniform for a given doping profile. Where there is a large variation in the resistance, a greater number of subdivisions is desirable. Thus, since the variation is greatest close to the surface 832 of the substrate, shown at the origin (0, 0), a greater number of subdivisions along the substrate depth 804 may be created.

In order to appropriately place subdivisions along the x-axis, a number of subdivisions desired may be obtained. By way of example, a processing engineer may specify a desired number of subdivisions that may be used across all doping profiles for a particular substrate. Thus, the maximum height 844 of the curve 834 may be obtained and divided by the desired number of subdivisions. In this manner, the allowed variation for each vertical subdivision may be obtained. The number of subdivisions are then superimposed on the y-axis and dropped down to the x-axis at the point of intersection with the curve 834 to create subdivision boundaries 836, 838, 840. As shown, boundaries 842 may be placed along the y-axis such that the boundaries 842 are evenly spaced along the y-axis. The boundaries along the y-axis are then correlated with the curve 834 at points of intersection to create the subdivision boundaries 836, 838, 840 along the x-axis, representing the depth of the substrate. As shown, each subdivision created along the x-axis intercepts the curve 834 as well as the corresponding boundary 842 created along the y-axis. Thus, each subdivision bounded by the subdivision boundaries (e.g., boundaries 836, 838, and 840) will correspond to a different resistance. Moreover, as shown, the subdivisions bounded by the boundaries 836, 838, 840 along the depth of the substrate will be unevenly spaced. Accordingly, where there is less change in the doping level, there will be less subdivisions along the depth.

Other methods for positioning subdivisions for multiple profiles may be utilized. Since the devices are fabricated at the substrate surface, there is a greater variation in doping level in close proximity to the substrate surface. Because a greater accuracy might be desired closer to the surface than in the depth of the substrate, it may be desirable to create a greater number of subdivisions in this region to maintain a high degree of accuracy during subsequent substrate modeling. Hence, the spacing between the boundaries (e.g., 836, 838, 840) may be decreased in proximity to the substrate surface 832 or increased along the depth of the substrate.

In order to provide greater accuracy close to the substrate surface, a spacing ratio may be applied to split the total net doping variation 844 along the depth of the substrate. The spacing ratio may be a constant value which may be multiplied by the width of a subdivision. By way of example, binary values 1, 2, 4, etc. may be utilized as multiplication factors for the width of the subdivisions as the distance from the surface of the substrate increases. Alternatively, the spacing between the boundaries 842 may be increased closer to the height of the curve 844. For example, using a multiplication factor of 2 will lead to a net profile variation for one subdivision twice as large as the variation of the previous subdivision. Accordingly, various methods may be applied to adjust the width of each subdivision.

Figure 9:
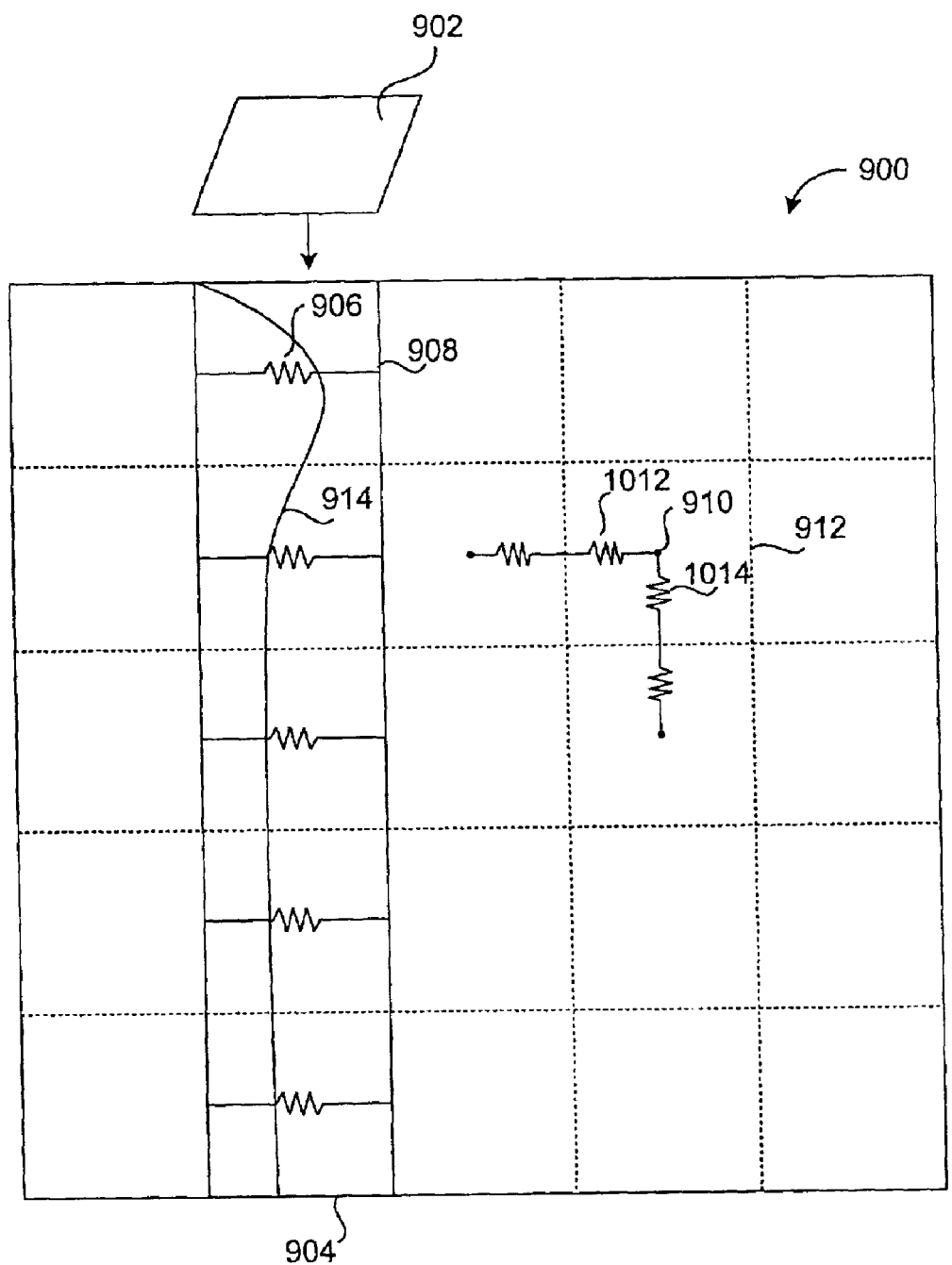
FIG. 9 is an exemplary block diagram illustrating the method for using a doping profile to aid in the modeling process of FIG. 7 according to one embodiment.

As described above, the doping level at a given substrate depth corresponds to a resistance. Thus, each partition within a given doping profile corresponds to a particular resistance that exists within a range of the substrate depth. FIG. 9 is an exemplary block diagram illustrating one method for using a doping profile to aid in substrate modeling 710 shown in FIG. 7. As shown, horizontal discretization may be performed on the substrate 900 to create a plurality of surface area subdivisions. The area 902, or position, of interest on the substrate 900 is then selected. The combination of layers for vertical column 904 defined by that position is then obtained from a layout database. The doping profile, represented by curve 914, corresponding to this combination of layers may then be obtained using a key. The doping profile 914 may then be used to ascertain the equivalent resistance 906 associated with each particular block 908 within the vertical column 904 associated with the selected area 902. In this manner, the equivalent resistance throughout each vertical column through the selected area 902, or "slice", within the substrate may be obtained. By way of example, the equivalent resistance can be computed using the algebraic average of the net doping values through a subdivision.

As shown in FIG. 9, an equivalent electrical node 910 may be identified for each block 912 within the substrate 900. An equivalent resistance associated with each cube defining the vertical column may therefore be obtained. The equivalent resistance will vary throughout the substrate due to the fabrication process and may be represented by an equivalent horizontal resistance 1012 and an equivalent vertical resistance 1014. In addition, the equivalent resistance will depend in part upon the selection of vertical columns in the substrate through horizontal discretization as well as the positioning of subdivisions in the doping profiles through vertical discretization.

Figure 10:
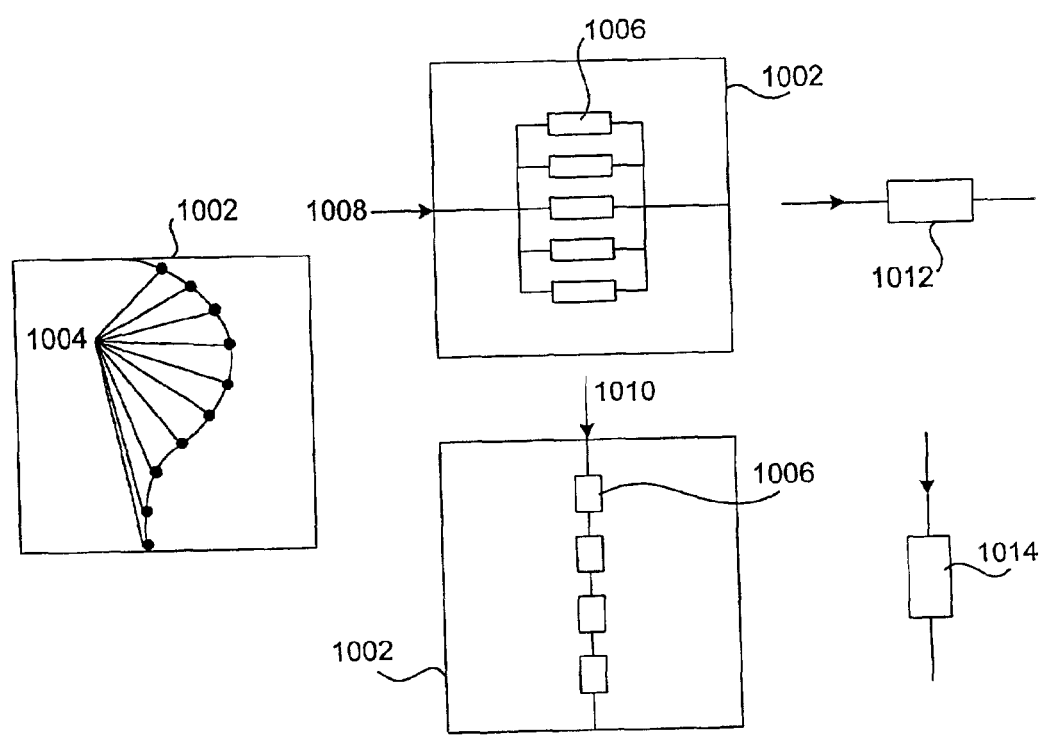
FIG. 10 is an exemplary diagram illustrating a method for determining resistances using a doping profile according to an embodiment of the invention.

FIG. 10 is an exemplary diagram illustrating a method for determining equivalent resistances using a doping profile according to an embodiment of the invention. The accuracy of the substrate model can be improved by distinguishing currents that flow horizontally from currents flowing vertically within a block 1002. After the vertical discretization process, the net doping level within a block will change as a function of the vertical position. As illustrated in FIG. 10, the block 1002 is characterized by a discrete number of net doping values 1004 corresponding to a doping profile. Each doping value 1004 further corresponds to a resistance value 1006. Each resistance 1006 is seen in parallel by a lateral current 1008 and in series by a vertical current 1010. Thus, the equivalent vertical resistance 1012 may be defined by the sum of the resistances 1006 in the block 1002. Correspondingly, the horizontal equivalent resistance 1014 may be defined by $1/(\Sigma(1/R))$ for the resistances 1006.

Once the equivalent resistance is ascertained for each subdivision and block within the substrate, these values may be used to model the noise in the substrate. By way of example, a resistive matrix may be created that includes the equivalent resistance at each node within the substrate. Thus, the resistance and the capacitance at the junction between the substrate and the overlying layer may be combined with the equivalent resistance at each node within the substrate. Using these values, a netlist may be created according to a conventional process. In this manner, RC substrate modeling may be performed.

In accordance with one aspect of the present invention, it is found that when the number of devices on the substrate increases, the aforementioned surface or horizontal gridding scheme requires a large number of computations to appropriately model such a high component count, high density substrate. If an engineer needs to add or remove components (such as when "what-if" modeling is performed), the large number of computations would be a disadvantage due to the time delay involved in performing the large number of computations. Accordingly, it would be desirable to employ a surface gridding technique which requires fewer computations to model a given substrate.

In accordance with one aspect of the present invention, the substrate is initially initialized into a predefined set of local partitions and gridded into default divisions or grids. If the introduced component overlaps an existing grid of a local partition, that local partition is checked to see whether further partitioning is appropriate. The introduction of a component adds local grid segments, which creates additional divisions out of the existing division or grid. If the additional local grid segments (which arise due to the introduction of a new component) cause the local partition to be subdivided into an unduly large number of divisions (i.e., larger than a specified maximum per local partition), that existing local partition is turned into a global partition containing new local partitions (according to the GridGlobalDivision parameter of the corresponding level). The creation of one additional level of partitioning has the effect of reducing the size of the resultant local partitions, which in turn reduces the number of divisions therein. In other words, since the newly created local partitions are smaller than the old local partition (which was turned into a global partition upon partitioning), there would be fewer divisions per resultant local partition. The new local partitions are checked again to see whether each of them has fewer than the maximum number of allowable divisions therein. If any resultant local partition is found to contain more than the maximum number of allowable divisions therein, that resultant local partition is again turned into a global partition, which further reduces the size of the resultant local partitions. The process recursively continues until no local partition has therein more than the maximum number of allowable divisions or the inserted object is in a global partition that is already at the maximum level (level 2 in our example because GridMaxDepth=3 leads to 3 levels: level 0, level 1 and level 2).

Conversely, when a component is removed, the local grid segments associated therewith are removed from the local partition affected. At that point, the next higher up level of partition (i.e., the immediate higher up global partition) is checked to see whether the number of divisions therein is fewer than the maximum number of allowable divisions. If the next higher up level of partition has fewer than the maximum number of allowable divisions due to the removal of the local grid segments (which were removed because of the removal of the component), simplification is performed since the local partitions are no longer needed for accurate surface modeling. The process recursively continues until no additional simplification is possible, i.e., any additional simplification would cause a local partition to have more than the maximum number of allowable divisions.

Figure 12A:
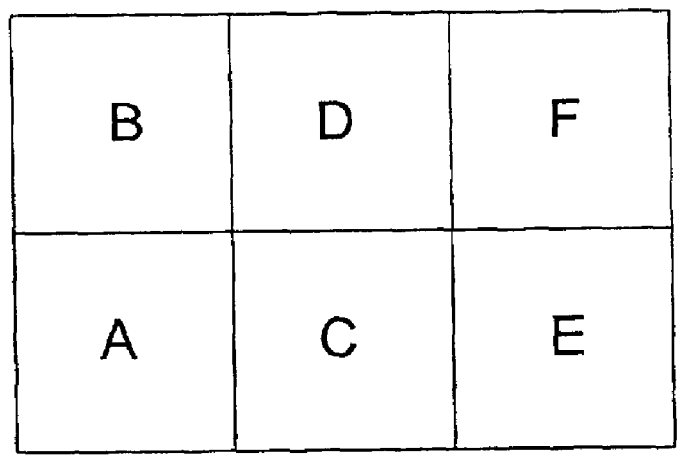

To facilitate further understanding of this aspect of the present invention, FIGS. 12A–12F depict a substrate 1202 and the partitioning process that occurs when two objects are inserted in sequence. In FIG. 12A, substrate 1202 is initialized by being partitioned into six top level local partitions A, B, C, D, E, and F. These initial local partitions are generally chosen in accordance with a predefined set of initialization parameters. In the example of FIG. 12A, the predefined set of grid initialization parameter may, for example, be employed to divide the substrate into a matrix of 3×3 (in accordance with parameter GridGlobalDivision0 of Table 1 below). Preferably, however, the ratio is adjusted so that the resulting partitions are quasi-square. In the case of FIG. 12A, since one side of the substrate is smaller than the other, the ratio between the two sides suggests that a 3×2 partitioning scheme would yield quasi-square partitions. Thus, at the top level (level 0), the substrate is divided into a matrix of 3×2.

Thereafter, default divisions are formed in each of the local partitions A–F. The default divisions are created responsive to two parameters: OverGriddingFactor and OverGriddingResolution. These factors, which may be user-supplied or may be predefined, indicate how many lines (OverGriddingFactor) are to be created for each resolution (OverGriddingResolution). An example may be OverGriddingFactor=1 and OverGriddingResolution=100 microns, in which case one division is created for each 100 microns.

Additionally, the creation of the default divisions may be constrained such that the number of default local grid elements be no greater than the global grid segments of an inferior level if this local partition has to be turned into a global partition at a later time. In the current example, the local partition of level 0 (FIG. 12A) cannot contain more than 1 default local grid segment since the global partition of level 1 is 2×2 (as specified by the parameter GridGlobalDivisionl of Table 1 below).

Figure 12B:
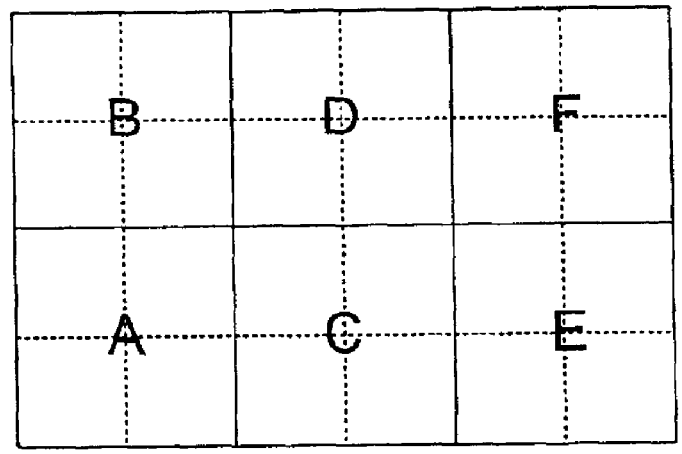

The resultant divisions or grids are illustrated in the example of FIG. 12B. Note that in FIG. 12B, each of partitions A, B, C, D, E, and F are still local partitions at this point.

Thereafter, components may be inserted in sequence, preferably one-by-one, and each local partition impacted by the insertion (i.e., overlaps at least partially with the component added) is checked to see if any of its existing grid now has a greater than acceptable number of allowable divisions (which is predefined by a variable GridMaxDivisions in the preferred embodiment). For the remainder of the example herein, GridMaxDivisions is set to 4 in order to work through the example.

Figure 12C:
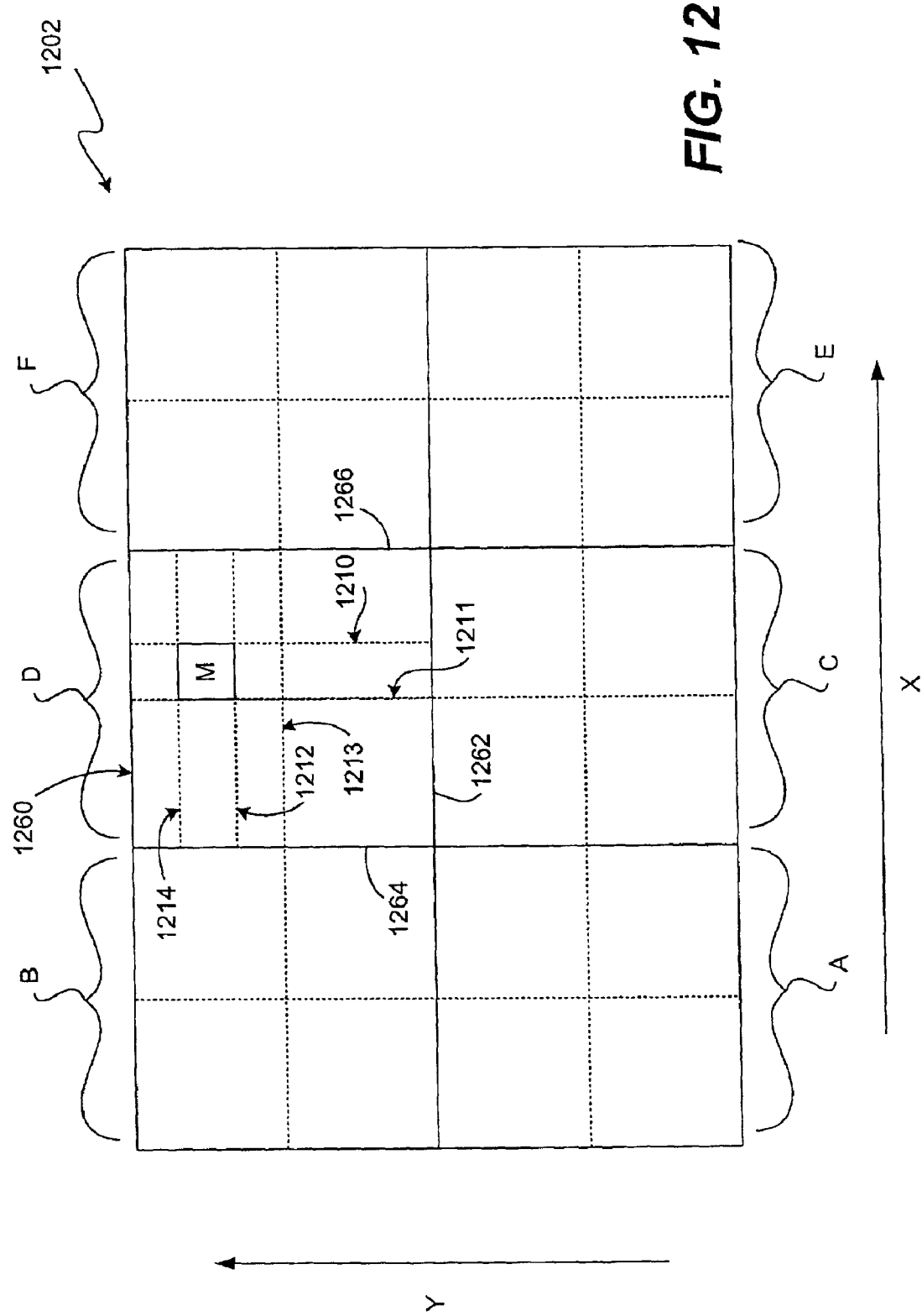

In FIG. 12C, the insertion of object M causes local grid segments 1210, 1212, and 1214 to be added to local partition D. No other partition is affected since object M does not overlap any other local partition. Note that these local grid segments end at the border of the affected local partition, i.e., local grid segments 1210, 1212, 1214 terminate at the border of local partition D. At this point, the maximum number of divisions of local partition D does not exceed GridMaxDivisions or 4. In fact, in the Y direction in FIG. 12C, there are 4 divisions (limited by local partition boundaries 1260 and 1262, and local grid segments 1214, 1212 and 1213) within local partition D. In the X direction, there are only 3 divisions (limited by local partition boundaries 1264 and 1266, and local grid segments 1210 and 1211).

Figure 12D:
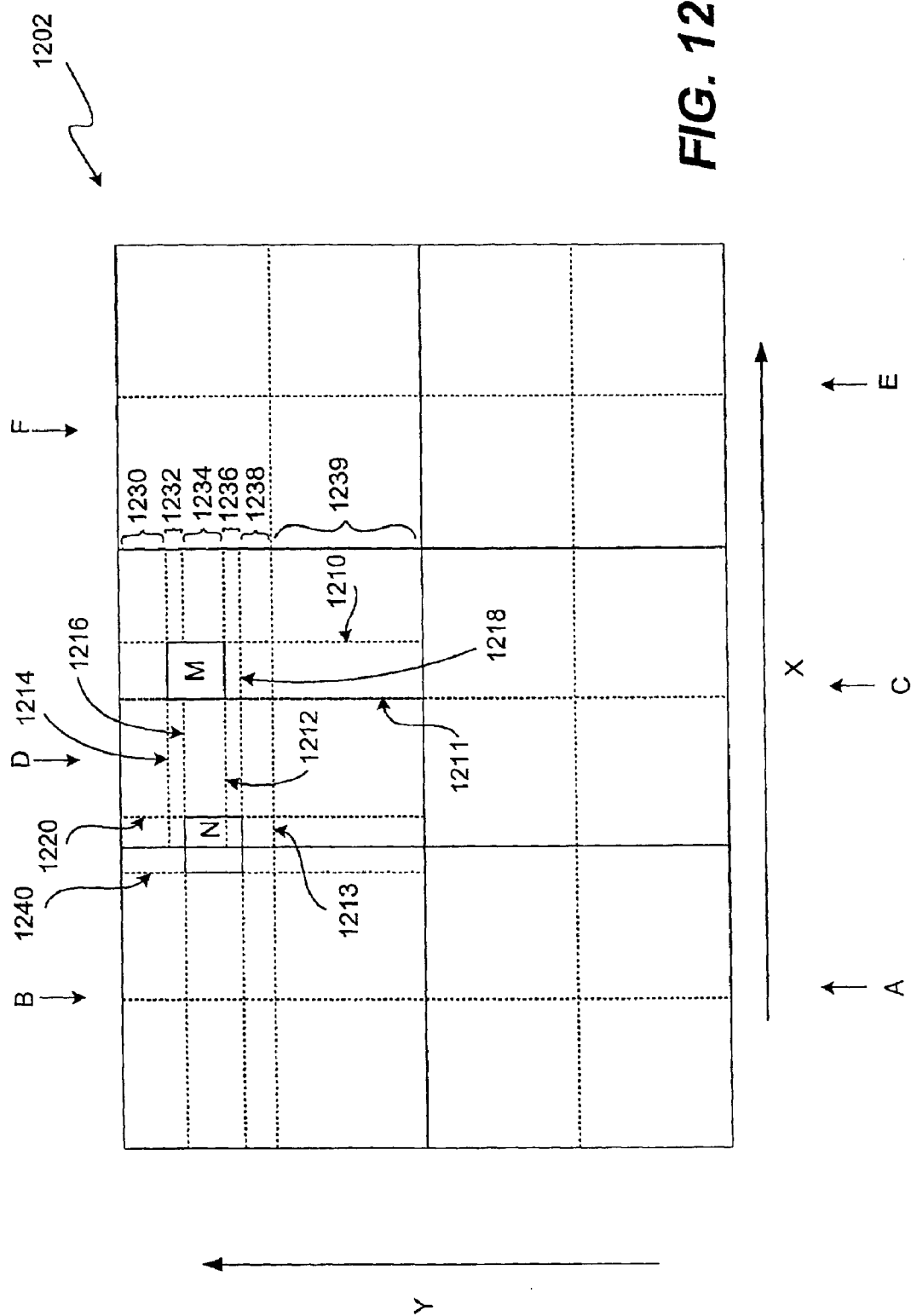

In FIG. 12D, an object N is inserted into the substrate. Upon insertion, it is seen that object N intersects two current local partitions: local partition B and local partition D. Initially, the addition of objectN would have introduced additional local grid segments 1216, 1218, and 1220 into existing local partition D. Note that since local partition D is still a local partition, the additional local grid elements terminate at its border as shown in FIG. 12D. More significantly, and as seen in FIG. 12D, the introduction of local grid segments 1216 and 1218 would increase the number of divisions in local partition D to over 4. In fact, it is seen that 6 divisions are created in the Y direction (referenced by numbers 1230, 1232, 1234, 1236, 1238 and 1239 in FIG. 12C). Since this is larger than the acceptable number of allowable division (GridMaxDivision, which is 4 in the current example), the local partition D is turned into a global partition (of level 1) and splitted into local partitions (2×2 according to GridGlobalDivisionl parameters that are equal to 2): D1, D2, D3 and D4 as seen in FIG. 12E.

Furthermore, in keeping with the rule that local grid segments terminate at the border of the respective local partition, the portions of local grid segments 1212 and 1214 that exist to the left of line 1211 in FIG. 12D are removed from FIG. 12E.

Figure 12F:
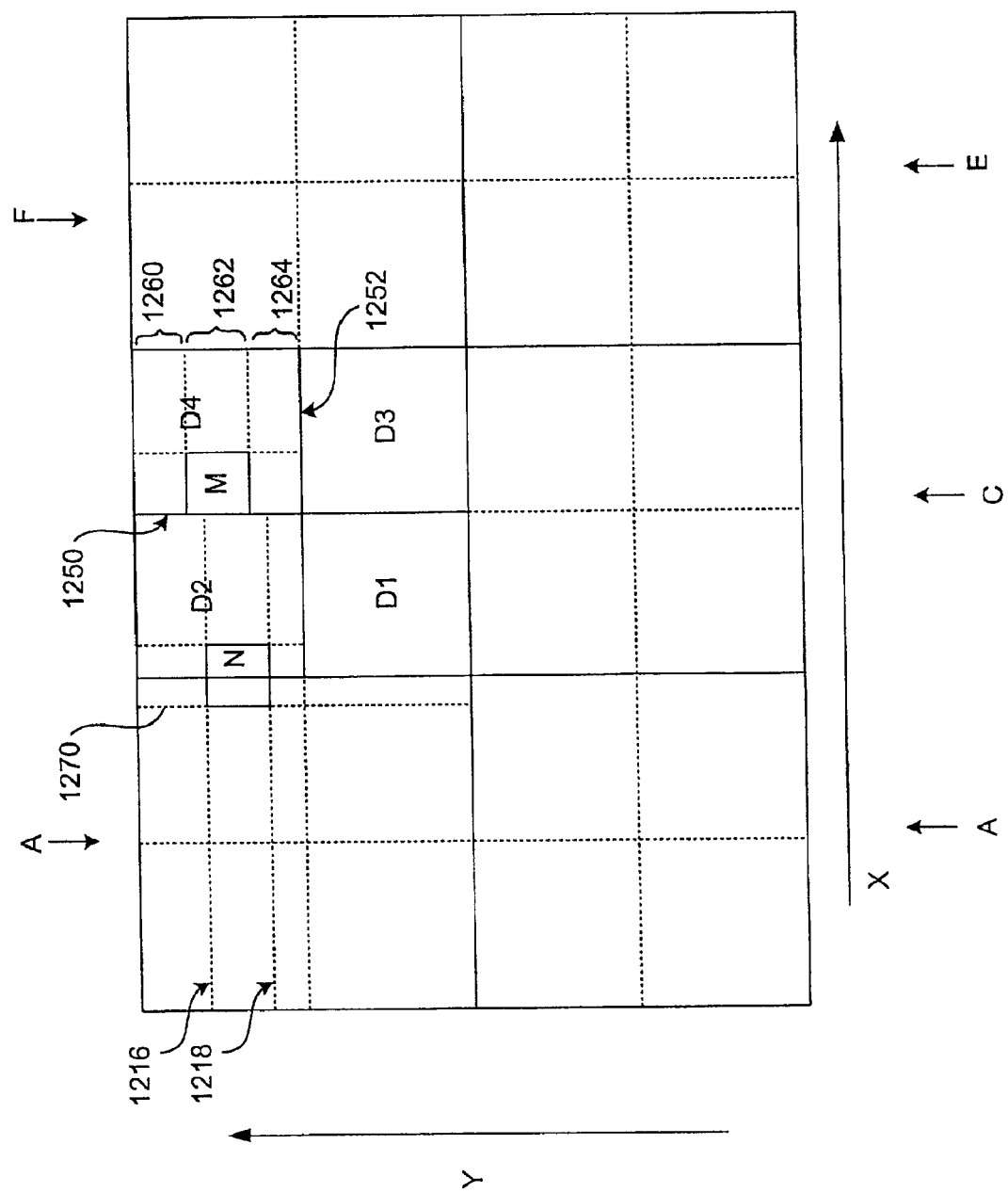

In FIG. 12F, the new object N is reintroduced into the local partitions D1, D2, D3, and D4 of newly created global partition D. Note that the resultant local partitions are now smaller (each of local partitions D1, D2, D3, and D4 is roughly ¼ the size of the original local partition D in the example). Equally important is the fact that local grid segments introduced by the addition of object N now terminate at the new local partition borders. In other words, they now terminate at lines 1250 and 1252, which are the lines separating new local partitions D1, D2, D3, and D4. As such, local grid segments 1216 and 1218 seen earlier in FIG. 12D do not protrude into local partition D4 of FIG. 12F. Thus, the number of divisions in partition D4 is now 3 (shown by reference numbers 1260, 1262, and 1264 in FIG. 12F). Effectively, the additional partitioning of the original local partition D into four local partitions D1, D2, D3, and D4 reduces the number of divisions in each of the local partitions down below the acceptable number of allowable division (GridMaxDivision, which is 4 in the current example).

A quick check of FIG. 12F shows that none of the other newly created local partitions have more than 4 divisions in either the X or Y direction. Likewise, the addition of local grid segments 1216 and 1218 (as well as 1270) to existing local partition A does not result in having more than the acceptable number of allowable divisions (GridMaxDivision, which is 4 in the current example). As such, no additional partitioning of local partition A is necessary.

Figure 13:
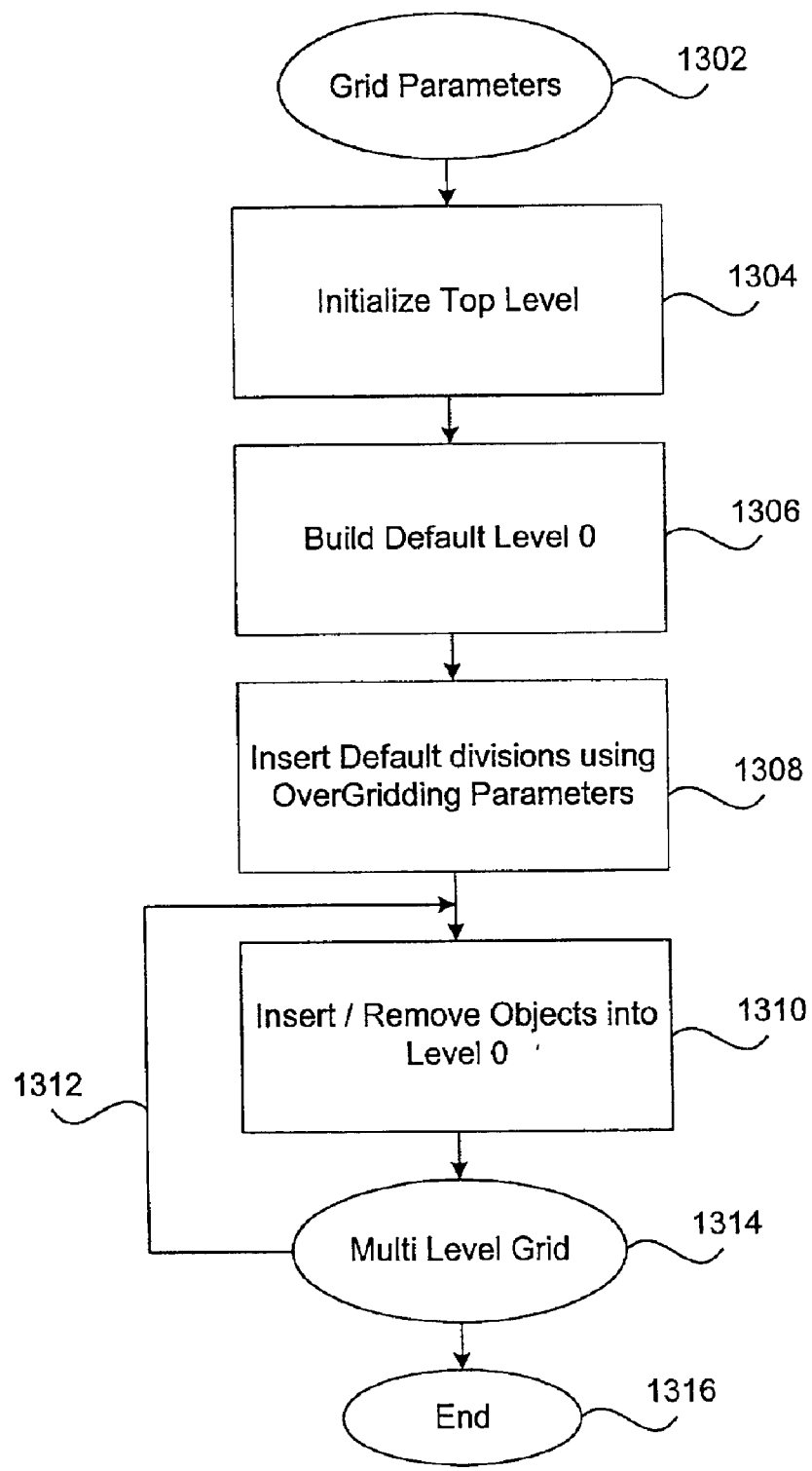
FIGS. 13 and 14 show, in one embodiment, the steps taken in initializing a substrate and implementing the inventive surface gridding scheme while inserting an object.
Figure 14:
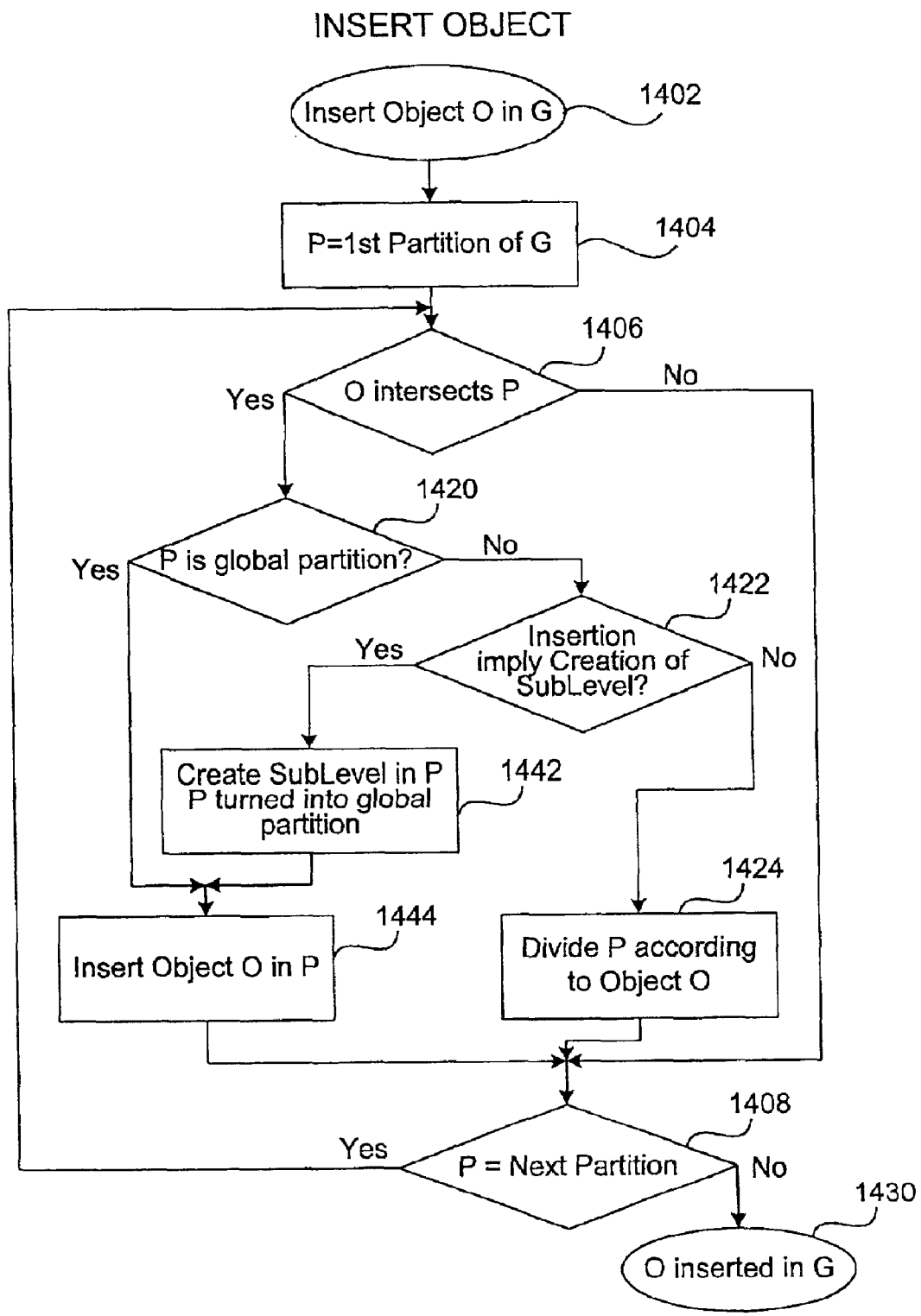

In accordance with one aspect of the present invention, the aforementioned surface gridding scheme can be implemented using a recursive algorithm. FIGS. 13 and 14 show, in one embodiment, the steps taken in initializing a substrate and implementing the inventive surface gridding scheme while inserting an object. In step 1302, grid parameters are first obtained. As mentioned, these grid parameters may be obtained from the user or may be predefined. Table 1 illustrates some exemplary parameters.

TABLE 1

| Name | Value |
| --- | --- |
| GridMaxDepth | 3 |
| GridGlobalDivision0 | 3 |
| GridGlobalDivision1 | 2 |
| GridGlobalDivision2 | 2 |
| OverGriddingFactor | 1 |
| OverGiddingResolution | 100 microns |
| GridMaxDivision | 4 |

The GridMaxDepth parameter specifies the maximum number of levels that the substrate may have. As an example, a local partition is typically turned into a global partition if the local partition has more divisions than GridMaxDivision. However, even if a local partition has more divisions than GridMaxDivision, that local partition will not be turned into a global partition if there are already as many levels as specified by the parameter GridMaxDepth.

Since GridMaxDepth=3 in this example, the global division at various levels of depths are provided (e.g., 3, 2, and 2 for GridGlobalDivision0, GridGlobalDivision1, GridGlobalDivision2, respectively). The GridGlobalDivision parameter at each level relates to the default number of local partitions that is formed out of the global partition at that level. As an example, in FIG. 12B, the global partition is at level 0. In this case, the GridGlobalDivision0 is 3 per Table 1 and, therefore, the default partitioning is 3×3 local partitions (but adjusted to a matrix 3×2 therein to make the local partitions quasi-square). As another example, in FIG. 12F, the global partition D is at level 1. In this case, the GridGlobalDivision1 is 2 per Table 1 and, therefore, the default partititioning is 2×2 local partitions (i.e., D1, D2, D3, and D4 therein). As a further example, if any of the local partitions D1–D4 is turned into a global partition, that resultant global partition (now at level 2) will have a default partitioning of 2>2 local partitions since GridGlobalDivision2 is 2 per Table 1.

OverGriddingFactor and OverGriddingResolution, as mentioned earlier, are parameters which determine how a particular local partition may be divided during the initialization stage. In this example, it is specified that a division be provided for every 100 microns. As mentioned, the creation of the default divisions may be constrained such that the number of default local grid elements be no greater than the global grid segments of an inferior level if this local partition has to be turned into a global partition at a later time. In the current example, each local partition in the global partition of level 0 (FIG. 12B) cannot contain more than 1 default local grid segment in either the X or Y direction since the global partition of level 1 is 2×2 (as specified by the parameter GridGlobalDivisionl of Table 1 below).

In step 1304, the substrate is initialized at the top level 0. In this step, the appropriate matrix parameters for inititially partitioning of the substrate into local partitions such that they are quasi-square are also computed. In step 1306, the default level 0 is created in accordance with the matrix parameters derived in step 1304, such as 3×2 in the present example. The resultant local partitions are shown in FIG. 12A.

In step 1308, the default divisions for the local partitions in the global partitition of level 0 are created responsive to two OverGridding parameters: OverGriddingFactor and OverGriddingResolution in Table 1, as well as the constraints discussed earlier. The resultant local partitions and divisions are shown in FIG. 12B in which the dotted lines represent the initial overgridding to create the default divisions. The substrate with default level 0 and the default divisions in each local partition is shown in FIG. 12B.

In step 1310, the objects are then inserted or removed, and the gridding scheme adjusted accordingly to properly model the surface of the substrate. The process can continue until the modeler is finished (as indicated by arrow 1312).

FIG. 14 illustrates, in accordance with one embodiment of the present invention, the steps employed in inserting an object into the substrate (step 1310 of FIG. 13). In general, FIG. 14 is a recursive technique, which steps through each local partition to check 1) which local partition overlaps the newly inserted object; (2) if a local partition overlaps a newly inserted object, whether the introduction of local gridding segments would cause the number of divisions to be greater than GridMaxDivision; and (3) if the answer to question 2 is yes, that local partition is promoted to a global partition, and splitted into local partitions, and the technique recursively goes through the new local partitions to perform steps 1, 2, and 3 for the new local partitions. If all local partitions at a given level do not require further partitioning, the technique pops up one level to continue checking the local partitions at a higher level. The process continues until it is satisfied that no local partition has a greater number of divisions than GridMaxDivision.

The recursive technique of FIG. 14 is best understood in connection with FIGS. 12A–F. In step 1402, an object O is inserted in substrate G (that is also Global Grid partition of level 0) at the predefined location for insertion (which is provided by the modeler). Initially, object O represents object M of FIG. 12C. At this point, the surface gridding scheme has not been adjusted, if necessary, to accommodate the insertion of the new object.

In step 1404, the temporary variable P is set to be the first local partition of G. In FIG. 12C, P=A. In step 1406, it is ascertained whether the newly inserted object O intersects P (which is A at this point). With reference to FIG. 12C, the answer is a negative, and the method proceeds to step 1408 wherein P is set to be the next local partition. Thus, P now equals B, and the method loops back to step 1406 since there are more local partitions to check.

The test in step 1406 again results in a negative answer (since object O does not overlap local partition B) and the method proceeds to step 1408 to set P equal to the next partition, which is C. The method loops back to step 1406, obtains a negative answer again (since object O does not intersect C either), and proceeds to step 1408 to set P equal to the next local partition, which is D.

The test in step 1406 yields a positive answer this time (since object O overlaps local partition D), and the method proceeds to step 1420 to ascertain whether the current P (which is partition D) is a global partition. Since local partition D is not a global partition at this point, the method proceeds to step 1422 to ascertain whether the insertion of object O into local partition D would cause it to have more divisions than GridMaxDivision. As can be seen in FIG. 12C, the insertion of object O into local partition D causes local grid segments 1210, 1212, and 1214 to be created. However, the number of divisions is smaller than GridMaxDivision. Accordingly, the method proceeds to step 1424 wherein the local partition D (i.e., the local partition currently represented by P) is divided into divisions in accordance with the insertion of object O, with no additional partitioning required.

Thereafter, the method proceeds to step 1408 wherein it steps through the remaining local partitions E and F and checks for overlap with the newly inserted object O. Since the answer is negative each time, the method ends when there is no more local partition to check (step 1408 and P already equals to F so that there is no more local partition to set to P). At step 1430, the object O is said to be successfully inserted into the substrate and the surface gridding properly modeled with the new divisions. With reference to FIG. 12C, object M has been successfully inserted and the new surface gridding scheme properly established.

The operation of the recursive technique of FIG. 14 may be illustrated again to further understanding with reference to the subsequent insertion of object N. In FIG. 12D, object N is inserted into the existing gridding scheme of FIG. 12C (step 1402). In this round, object N is represented by object O in the steps of FIG. 14.

In step 1404, P is now local partition A. The test in step 1406 is negative, and P is set to local partition B in step 1408. With P=local partition B, the test is step 1406 yields a positive answer (since the new object N intersects local partition B), which causes the method to proceed to step 1420. Since P (local partition B at this point) is not a global partition, the method proceeds to step 1422 to ascertain whether the insertion of object O (object N in this round) into local partition B wouldn't cause local partition B to have more divisions than GridMaxDivision. As can be seen in FIG. 12D, the insertion of object O into local partition B causes local grid segments 1216, 1218, 1220 and 1240 to be created, of which local grid element 1240 is located in local partition B and a portion of local grid elements 1216 and 1218 are also located in local partition B. However, local partition B does not have more divisions than GridMaxDivision. Accordingly, the method proceeds to step 1424 wherein the local partition B (i.e., the local partition currently represented by P) is divided into divisions in accordance with the insertion of object O, with no additional partitioning required.

Once this is performed, P is set to be equal to the next local partition (local partition C) in step 1408, and the test in step 1406 is negative, and P is then set to the next local partition again (local partition D) in step 1408. The next test in step 1406 yields a positive answer since the newly inserted object N (represented by O in this round) also overlaps local partition D. The method then proceeds to step 1420. Note that in the previous round during the insertion of object M, there was no need to partition local partition D, and it remained a local partition until now. Thus, the test in step 1420 yields a negative answer (since local partition D is not a global partition at this point), and the method proceeds to step 1422. In step 1422, it is ascertained that the insertion of object N (represented by object O in this round) does cause local partition D to have more divisions than GridMaxDivision. This can be seen in FIG. 12D wherein the addition of local grid segments 1216 and 1218 causes the local partition D to have 6 divisions in the Y direction (represented by reference numbers 1230, 1232, 1234, 1236, 1238 and 1239). Thus, the answer to the test in step 1422 is positive, and the method proceeds to step 1442 to create a sublevel in P, essentially promoting the current P (local partition D) to a global partition. Thus, local partition D is splitted into 2×2 local partitions (according to GridGlobalDivisionsl). This is done in FIG. 12E.

In step 1444, the object O (i.e., object N in this round) is now inserted into the global partition D and more particularly introduced to the local partitions of the newly created global partition D. Recursively speaking, the method pops down one level to level 1 to treat the global partition D in the same way that it treated the entire substrate at level 0 earlier. The new local partitions D1, D2, D3, and D4 are treated in the same way that the local partitions A, B, C, D, E, and F were treated earlier. At this level 1, the level-1 series of steps starts at step 1404, wherein the temporary variable P(1) is now set to be the first local partition D1. As the level-1 series of steps are discussed, the temporary variable P is given the subscript (1) to distinguish it from the temporary variable P in use to check through the local partitions at level 0 (P equals to D when the recursive method pops down to level 1).

With reference to FIG. 12F, as P(1)=D1, the test in step 1406 yields a negative answer, causing P(1) to be set to D2 in step 1408 next. The next test in step 1406 turns out to yield positive answer (since the object N does indeed intersect local partition D2), and the method proceeds to step 1420, which yields a negative answer since local partition D2 is not a global partition at this point in time. The method then proceeds to step 1422 to ascertain whether the introduction of object N to local partition D2 would cause the number of divisions therein to be greater than GridMaxDivision. With reference to FIG. 12F, the answer is negative, which causes local partition D2 to be divided according to the insertion of object N therein, and no further partitioning of local partition D2 is necessary. D3 does not intersect object N, and with P(1) set to D4, the test in step 1406 turns out to yield negative answer again (since the object N does not intersect local partition D4).

After local partition D4, there are no more local partitions at level 1 to check, and the method pops out of step 1444 back to level 0 to check the remainder of the local partitions E and F. P is next set to local partition E in step 1408 (it should be recalled that P equals to D right before the recursive technique drops down one level to check local partitions D1, D2, D3, and D4 of the newly promoted global partition D). Since neither partition E nor F overlaps the newly introduced object N, the method ends when there are no more local partitions at level 0 to check (i.e., when P=F and there are no more local partitions to set P to in step 1408). At step 1430, object N is said to be successfully inserted into the substrate and the new gridding scheme successfully implemented to facilitate surface modeling of the substrate, including the newly inserted objects M and N.

Figure 15:
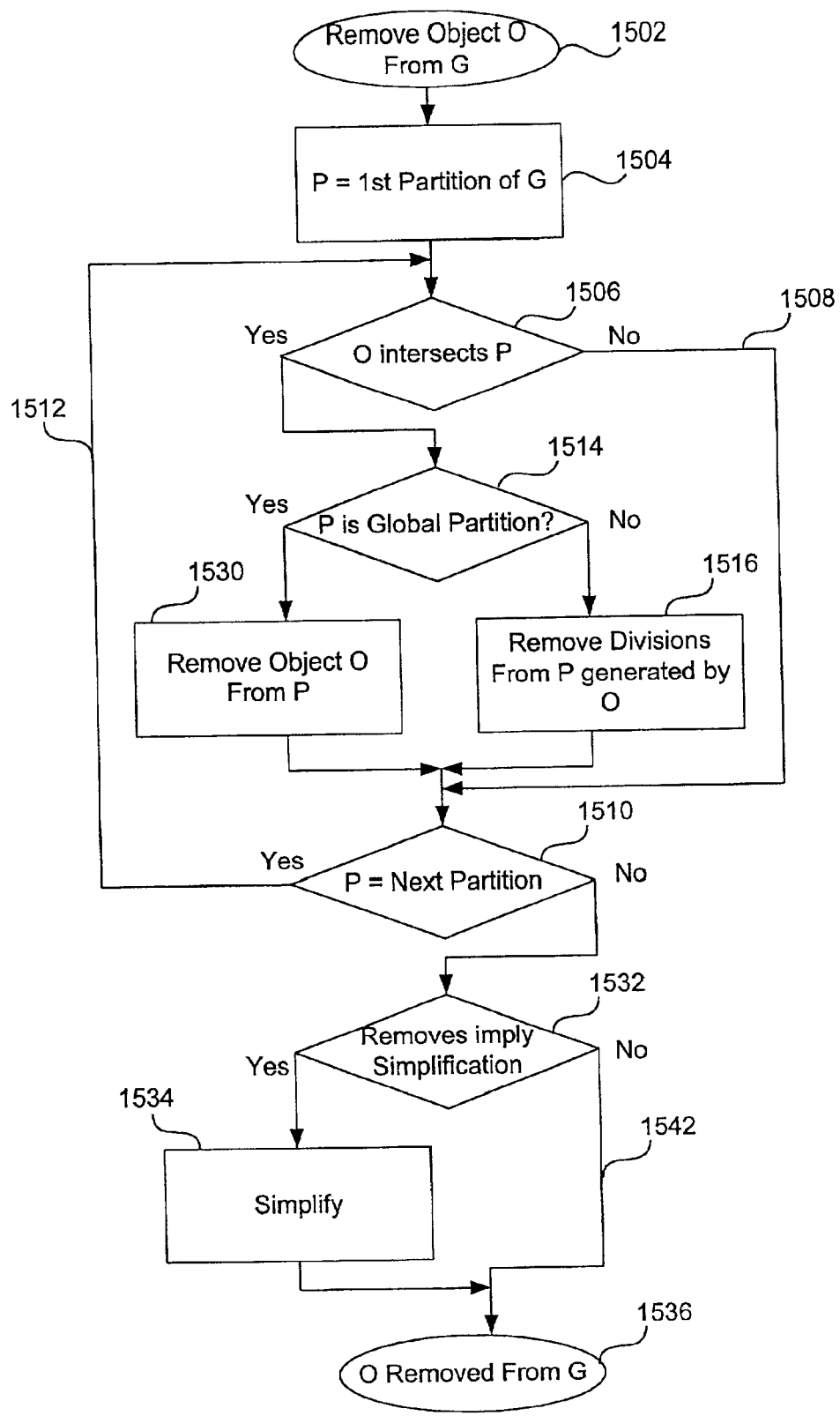
FIG. 15 illustrates, in accordance with one embodiment of the present invention, the steps employed in removing an object from the substrate (step 1310 of FIG. 13).

FIG. 15 illustrates, in accordance with one embodiment of the present invention, the steps employed in removing an object from the substrate (step 1310 of FIG. 13). In general, FIG. 15 is a recursive technique, which reverses the steps taken when an object is inserted. The steps of FIG. 15 may be better understood with the example of FIGS. 16A–16C, as discussed below.

Figure 16A:
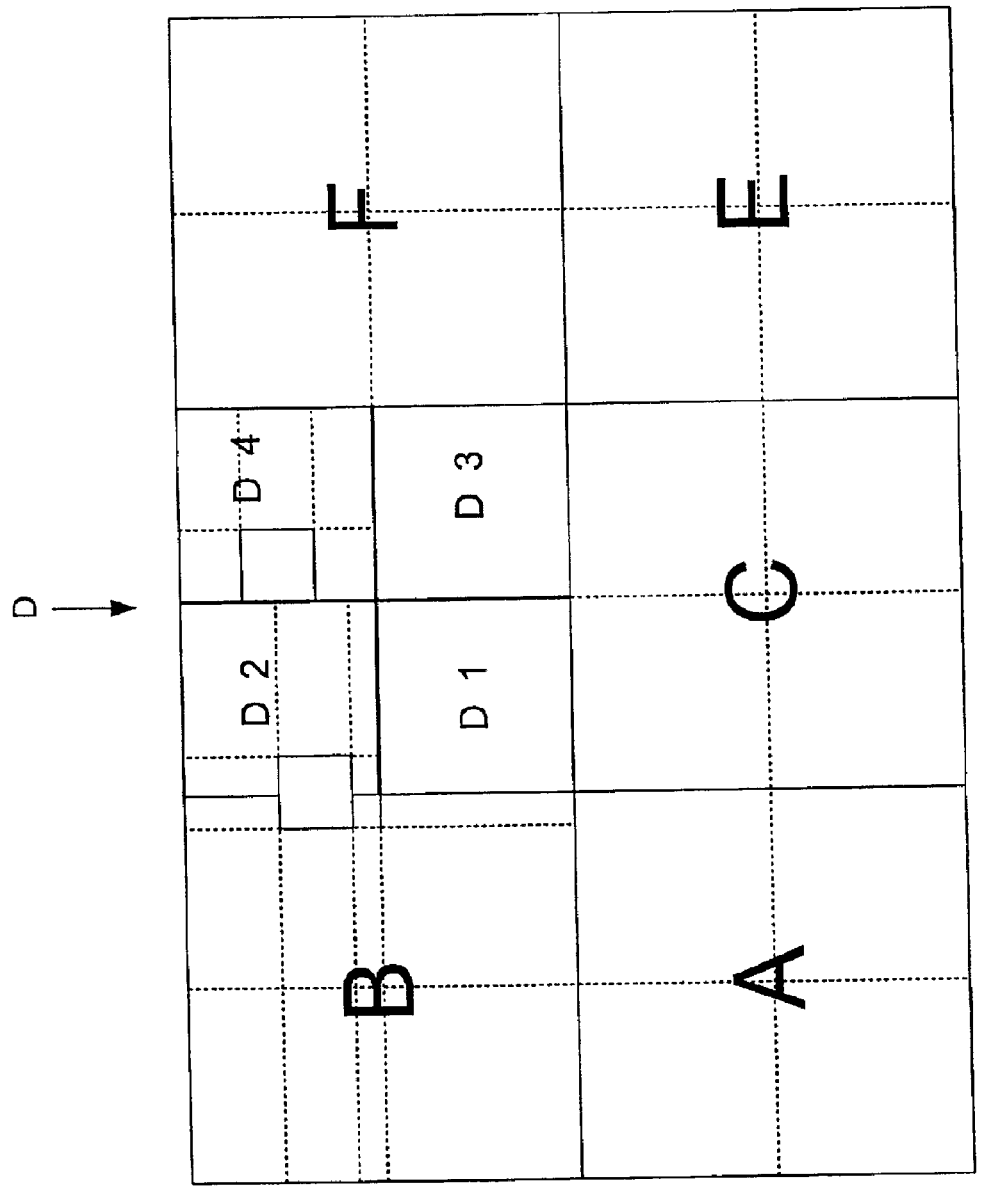
FIGS. 16A–16D depict a substrate and the simplification process that occurs when an object is removed.

In step 1502, the object O is removed from substrate G. For the sake of example, object O is equivalent to object N, which was inserted earlier in connection with FIGS. 12A–F. In step 1504, the temporary variable P is set to be the first local partition of substrate G. In FIG. 16A, P=A. In step 1506, it is ascertained whether the object to be removed (N) overlaps P (which is local partition A at this point). With reference to FIG. 16A, the answer is negative, and the method proceeds via arrow 1508 to step 1510 wherein P is set to be the next local partition. Thus P now equals local partition B, and the method loops back to step 1506 via arrow 1512 since there are more local partitions to check.

Figure 16B:
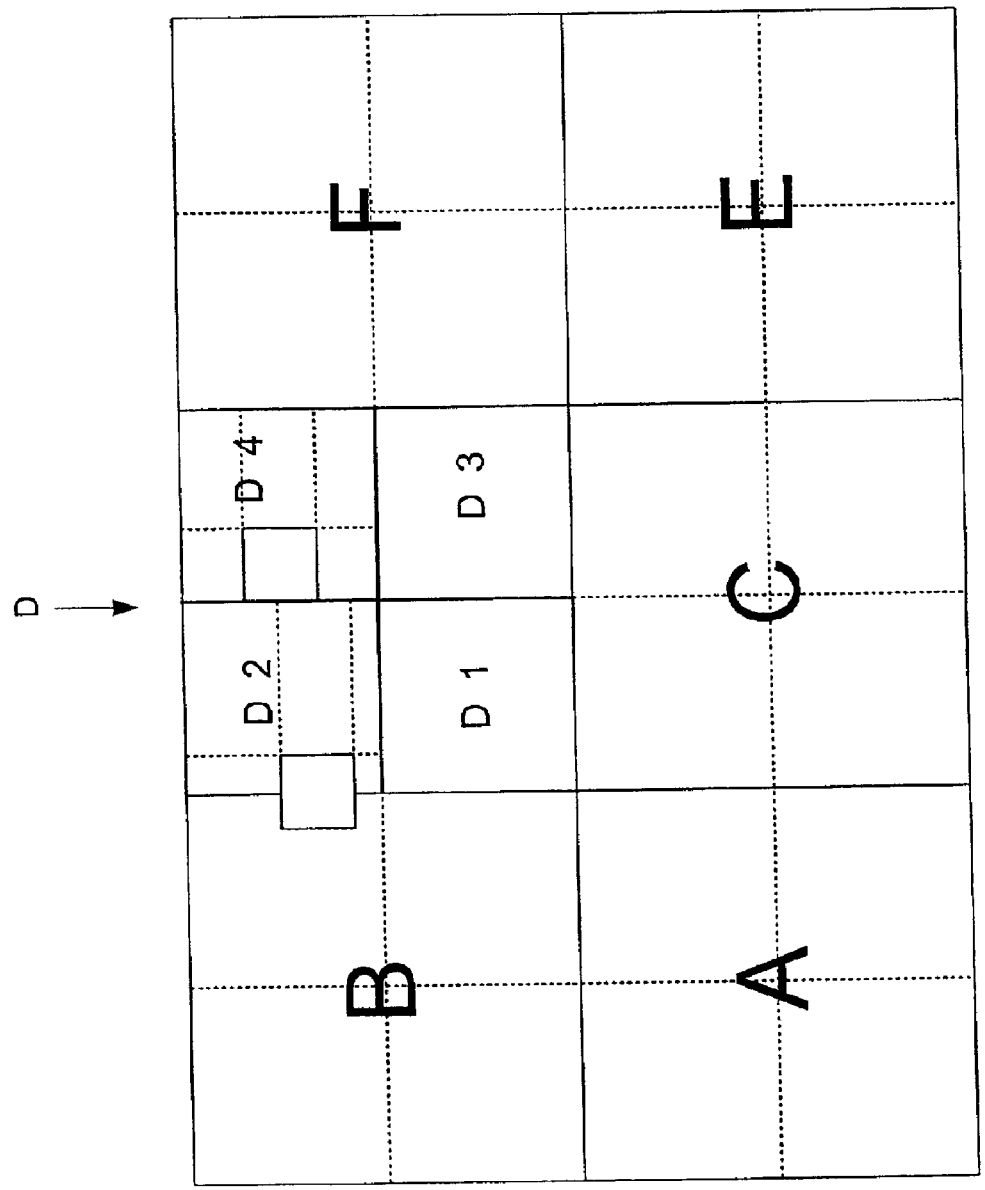

The result of the test in step 1506 is positive since object N overlaps P (which is local partition B at this point), and the method proceeds to step 1514 wherein it is ascertained whether P (which is local partition B at this point) is a global partition. The answer to the test of step 1514 is negative (the reader is invited to review FIGS. 12A–F and the discussions in connection therewith, which explain why B is a local partition), and the method proceeds to step 1516 wherein the divisions (e.g., local grid segments) generated by object N are removed from P (P=local partition B at this point). The result of such removal is shown in FIG. 16B.

Thereafter, the method proceeds to step 1510 wherein P is set to be the next local partition. Thus P is now equal to local partition C, and the method proceeds back to step 1506 (via arrow 1512) to ascertain whether the object to be removed, N, overlaps the new P (i.e., local partition C). With reference to FIG. 16A, the answer is negative, and the method proceeds via arrow 1508 to step 1510 wherein P is set to be the next local partition. Thus P now equals D, and the method loops back to step 1512 since there are more local partitions to check.

The result of the test in step 1506 is positive since object N overlaps P (which is D at this point), and the method proceeds to step 1514 wherein it is ascertained whether P (which is D at this point) is a global partition. The answer to the test of step 1514 is positive (the reader is invited to review FIGS. 12A–F and the discussions in connection therewith, which explains why D is a global partition), and the method proceeds to step 1530 wherein G is set to be the global partition D and the steps of FIG. 15 are recursively performed to remove object N from global partition D.

Recursively speaking, the method pops down to level 1 to treat the global partition D in the same way that the entire substrate is treated up to now. The new local partition D1, D2, D3, and D4 are treated in the same way that local partitions A, B, C, D, E, and F are treated up to now. At this level 1, the level-1 series of steps starts at step 1504, wherein the temporary variable P(1) is set to be the first local partition D1. As the level-1 series of steps are discussed, the temporary variable P is given the subscript (1) to distinguish it from the temporary variable P in use to check through the local partitions at level 0 (P equals to global partition D before the recursive method pops down to level 1).

As P(1)=D1, the test in step 1506 yields a negative, and the method proceeds via arrow 1508 to step 1510 wherein P(1) is set to be the next local partition. Thus P(1) is now equal local partition D2, and the method loops back to step 1506 via arrow 1512 since there are more local partitions to check.

Figure 16C:
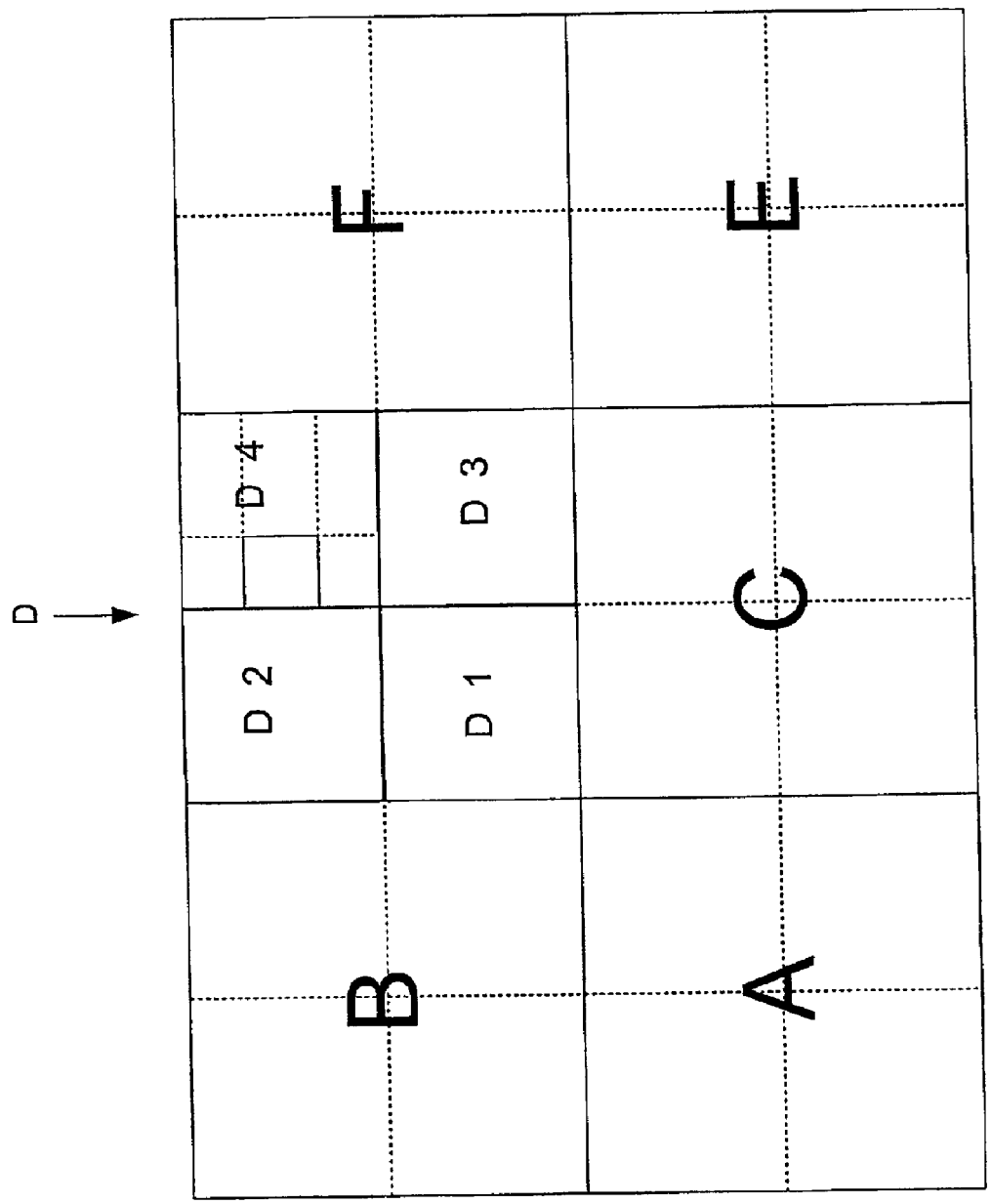

The result of the test in step 1506 is positive since object N overlaps P(1) (which is D2 at this point), and the method proceeds to step 1514 wherein it is ascertained whether P(1) (which is D2 at this point) is a global partition. The answer to the test of step 1514 is negative (the reader is invited to review FIGS. 12A–F and the discussions in connection therewith, which explains why D2 is a local partition), and the method proceeds to step 1516 wherein the divisions generated by object N are removed from P(1), i.e., from local partition D2. The result of such removal is shown in FIG. 16C.

Thereafter, the method proceeds to step 1510 wherein P(1) is set to be the next local partition. Thus P(1) is now equal D3, and the method loops back to step 1506 via arrow 1512 since there are more local partitions to check. In step 1506, it is ascertained that P(1), which is now D3, does not overlap the object N to be removed, and the method proceeds via arrow 1508 to step 1510 wherein P(1) is set to be the next local partition. Thus P is now equal to D4, and the method loops back to step 1506 via arrow 1512 since there are more local partitions to check. In step 1506, it is ascertained that P(1), which is now D4, does not overlap the object N to be removed, and the method proceeds via arrow 1508 to step 1510 wherein it is ascertained that there are no more local partitions to check.

Thereafter, the method proceeds to step 1532 to ascertain whether simplification of the global partition D at this level can be done after removal of the object N from its local partitions D1–D4. Note that since the recursive steps are operating at level 1, it is ascertained in step 1532 whether the global partition D can be simplified. Simplification, in this context, means demoting the global partition to a local partition and demoting the local partition(s) therein to divisions. This simplification is preferably performed after it is ascertained that the simplification does not cause the resultant local partition (i.e., D) to have more divisions therein than GridMaxDivision. With reference to FIG. 16C, the demotion of global partition D to a local partition does not cause the resultant local partition to have more divisions therein than GridMaxDivision, and thus simplification is permitted. In this case, the method proceeds to step 1534 to simplify.

Figure 16D:
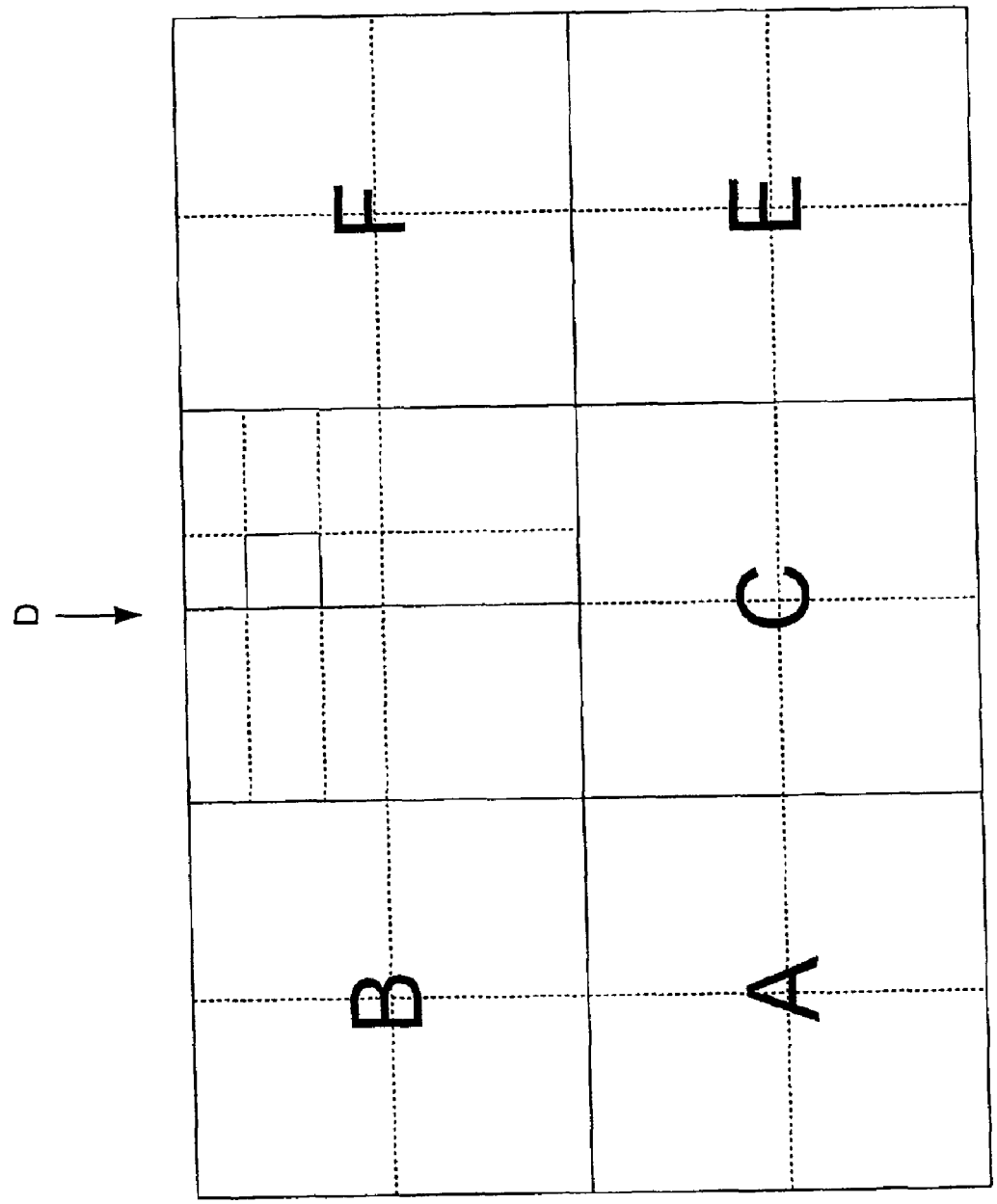

In step 1536, object N is considered successfully removed from global partition D (which, at this point, has been turned into a local partition), and the recursive method pops up to level 0 out of step 1530 to continue checking the remaining local partitions at level 0, i.e., local partitions E and F. P is next set to local partition E in step 1510 (it should be recalled that P equaled to D right before the recursive technique drops down one level to check local partitions D1, D2, D3, and D4 of global partition D). Since neither partition E nor F overlaps the object to be removed, N, the method proceeds to step 1532 ascertain whether simplification on the global partition at this level can be done after removal of the object N. Since we are at level 0, it is ascertained in step 1532 whether the substrate can be simplified. A review of FIG. 16C suggests that this simplification would have resulted in a local partition having more divisions therein than GridMaxDivision. Thus, simplification is not undertaken. Accordingly, the method proceeds to step 1536 via arrow 1542 where object N is considered successfully removed from the substrate. The simplified substrate, with D being a local partition, is shown in FIG. 16D.

It may be desirable, at times, to more accurately model the substrate by taking into account the voltage-dependent capacitance across certain junctions (such as the well-substrate junction between the well and substrate bulk). Of course, the capacitances may be obtained by direct measurement or obtained from industry data sources and employed in the modeling of the substrate. In some cases, however, such data may not be available and direct measurement may not be possible or economical or yield the desired accuracy.

It is known that the formation of a PN junction gives rise to a space-charge region due to impurity ionization and majority carrier diffusion. See, *Computer Aided Analysis Of Parasitic Substrate Coupling In Mixed Digital-Analog CMOS Integrated Circuits* by Francois Clement (Ecole Polytechnique Federale de Lausanne, Department d'Electricite, These 1449, 1995), which is incorporated herein by reference. In the substrate, those junctions are reverse-biased, (i.e., there is no current flowing through the junction) and they behave like variable capacitors. For such a junction, the capacitance is given by:

$$C_t = \frac{A\varepsilon_{Si}}{X}$$

Where A is the area of the junction, X is the thickness of the depletion region, and $\varepsilon_{Si}$ represents the dielectric constant of silicon. As discussed in the reference *Semiconductor-Device Electronics* by R. M. Warner and B. L. Grung (Orlando: Holt, Rinehart & Winston, Inc. 1991), which is incorporated herein by reference, the width of the space-charge region, X, can be represented as follows:

$$X=[\alpha'(\Delta\Psi_0+V_{NP})]^{\gamma'} \qquad \text{Eq. 1}$$

Where $V_{NP}$ is the absolute value of the junction reverse bias voltage and $\Delta\Psi_0$ is a constant representing the junction built-in voltage.

Where $\alpha'$, $\Delta\Psi_0$ and $\gamma'$ are junction capacitance constants depending on the doping profiles:

|  | $\alpha'$ | $|\Delta\Psi_0|$ | $\gamma'$ |
| --- | --- | --- | --- |
| Asymmetric step junction | $\dfrac{2\varepsilon(N_A + N_D)}{qN_AN_D}$ | $\dfrac{kT}{q}\ln\left(\dfrac{N_AN_D}{n_i^2(T)}\right)$ | $\dfrac{1}{2}$ |
| Linear graded junction | $\dfrac{12\varepsilon}{qa}$ | $\dfrac{2kT}{q}\ln\left(\dfrac{aX_0}{n_i(T)}\right) = \dfrac{qaX_0^3}{12\varepsilon}$ | $\dfrac{1}{3}$ |

Where $N_A$ is the concentration of acceptors impurities, $N_D$ is the concentration of donors impurities, and a is the slope; $n_i(T)$ is the intrinsic carrier concentration depending on the temperature T expressed in Kelvin degrees.

Eq. 1 can be rewritten as:

$$X = (\alpha + \beta V_{NP})^\gamma$$

where $\alpha = \alpha'\Delta\Psi_0$, $\beta = \alpha'$ and $\gamma = \gamma'$.

Thus, the thickness of the depletion region (and thus the capacitance across a well-substrate junction $C_t$) are related to the three parameters $\alpha$, $\beta$ and $\gamma$. To put it differently, if the three parameters $\alpha$, $\beta$ and $\gamma$ are known, the capacitance across a well-substrate junction $C_t$ can be calculated for a given bias voltage and employed in the model for a particular well-substrate junction. In the discussion below, techniques for calculating the three parameters $\alpha$, $\beta$ and $\gamma$ from the input 2-D and 1-D mesh doping profile are disclosed. The parameters $\alpha$, $\beta$ and $\gamma$ may be calculated for points along the well-substrate interface, preferably for points corresponding to vertical discretizations.

Figures 17, 33:
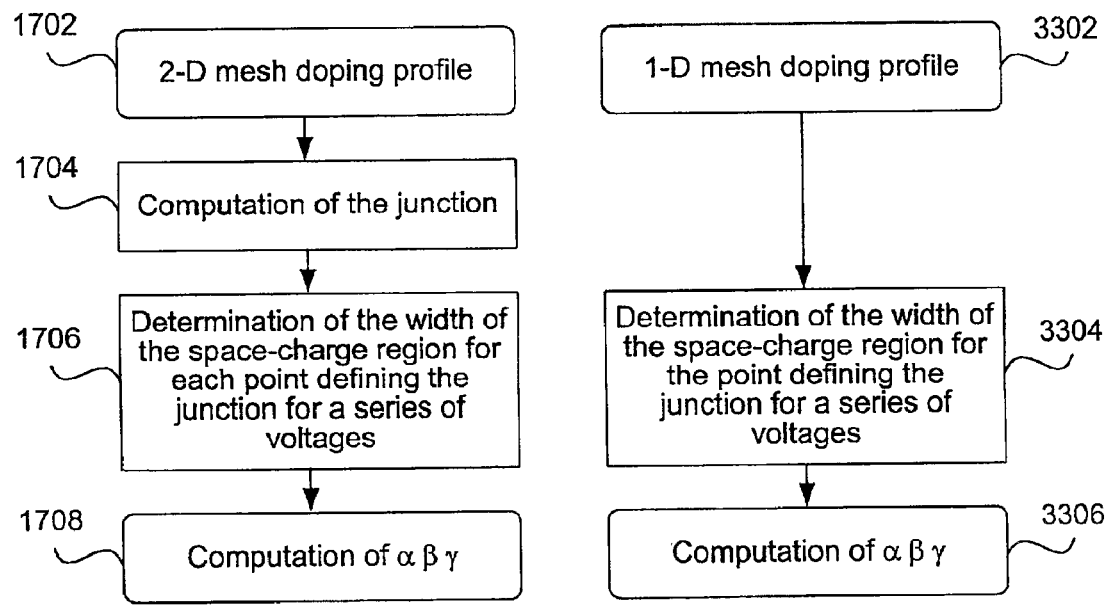
FIG. 17 shows, in accordance with one embodiment of the present invention, a technique for computing the three parameters α, β and γ from the input 2-D mesh doping profile.
FIG. 33 illustrates, in one embodiment, the steps involved in determining the set of parameters $\alpha$, $\beta$ and $\gamma$ from the 1-D doping profile.
Figure 18:
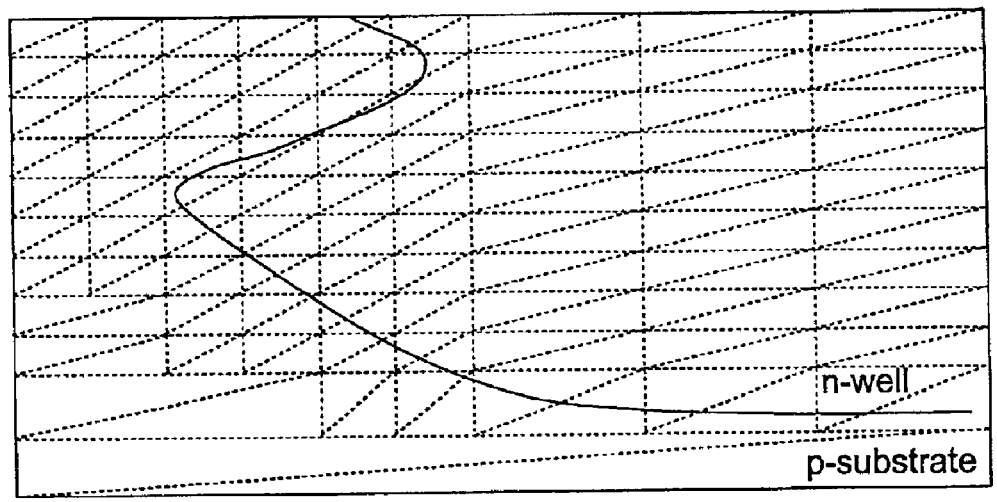
FIG. 18 shows a 2-D input mesh doping profile wherein the concentration of impurities is known in each point of the triangles that comprise the mesh.

FIG. 17 shows, in accordance with one embodiment of the present invention, a technique for computing the three parameters $\alpha$, $\beta$ and $\gamma$ from the input 2-D mesh doping profile. In step 1702, the 2-D mesh doping profile is obtained. Typically, the 2-D mesh doping profile is obtained through a tool such as TSUPREM by Avant! Corp. of Fremont, Calif. FIG. 18 shows one example of such a 2-D triangular mesh input data. The concentration of impurities is known in each point of the triangles that comprise the mesh obtained by a finite element simulation of the fabrication process. In FIG. 18, the view is that of a vertical cross-section of the substrate. From the 2-D mesh of FIG. 18, the concentration at any arbitrary point (x,y) of the mesh may be obtained by using, for example, an interpolation technique utilizing the data associated with the vertices of its associated triangle.

In step 1704, the junction curve is computed. In general, the junction curve represents a series of points in the 2-D mesh input data such that the concentration of impurities at each point of the curve is zero. In other words, the net concentration of impurities, cnet(x,y), is zero along the junction curve.

In step 1706, the widths of the space charge region, X, is determined, for a series of voltage values, for each point of the junction curve. As discussed, since the capacitance at the well-substrate junction behaves like a variable capacitor, calculations of the space-charge region are preferably performed for a series of voltage values. In one embodiment, the series of voltage values may represent voltage values that the junction is expected to experience during operation. In another embodiment, the series of voltage values represents the range of voltage values from the minimum value that the circuit is expected to experience, incremented by a reasonable value such as 0.1V, 0.25V, 0.5V, or the like, up to the maximum voltage value that the circuit is expected to experience. Generally speaking, about 10 values may be sufficient.

In step 1708, the values of the parameters $\alpha$, $\beta$, and $\gamma$ may then be obtained.

Figure 19:
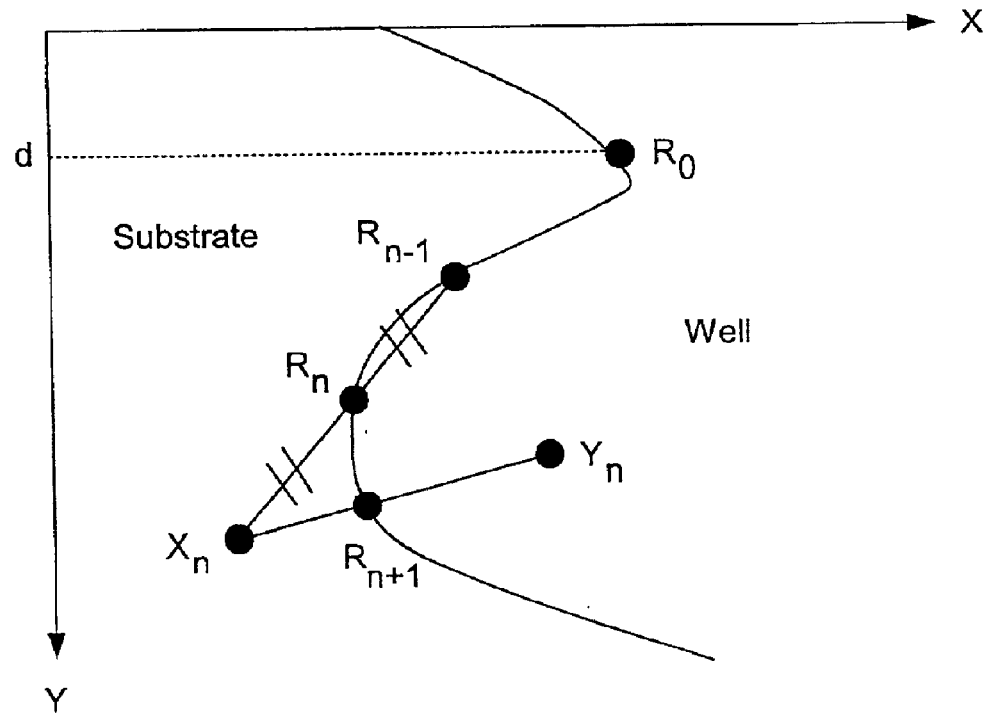
FIG. 19 illustrates, in one embodiment, an extrapolation coupled with binary-search algorithm is employed to find the junction curve from the input 2-D mesh doping profile.

In general, the junction curve may be obtained by any technique that extracts from the 2-D mesh input data a series of points where cnet(x,y)=0. In one embodiment, an extrapolation coupled with binary-search algorithm is employed to find the junction curve. This algorithm is discussed in connection with FIG. 19 herein below. In this algorithm, a horizontal line is first drawn through the 2-D mesh input plot of FIG. 18 (shown in FIG. 19 as the line d). Along this horizontal line, the point at which cnet(x,y)=0 is determined. This is the first point of the junction curve (shown by $R_0$ in FIG. 19).

Thereafter, additional points may be found by iteratively extrapolating to the next point, and from that next point, find the point along the gradient to the curve where cnet(x,y) is again equals to zero. By way of example, if $R_{n-1}$ and $R_n$ are on the junction then $R_{n+1}$ can be obtained by extending the segment $(R_{n-1}, R_n)$:

$$X_n = R_n + (R_n - R_{n-1})$$

if $X_n$ is not on the junction, we follow the gradient direction which is orthogonal to cnet(x,y)=0 up to a point $Y_n$ which has a different sign from $X_n$:

$$Y_n = X_n - \text{sign}(\text{cnet}(X_n)) \times \text{grad}(\text{cnet}(X_n))$$

we then use a bipartition (i.e., binary search) method to exactly determine $R_{n+1}$.

Recursively applying this method leads to a set of points that determines the junction.

It should be understood that other techniques may also be employed for obtaining the series of points along the junction curve where cnet(x,y)=0. In one embodiment, each point along the junction curve preferably corresponds to a vertical discretization discussed above to limit the number of points that need to be computed.

Figure 20:
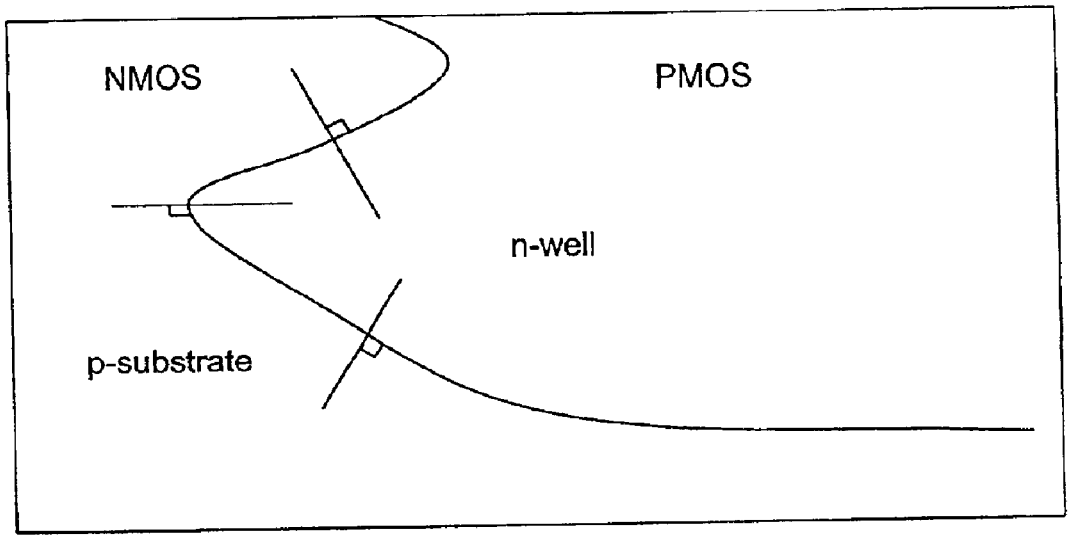
FIG. 20 shows three perpendicular lines for three points on the junction curve along which the widths of the depletion regions are determined.

Once the junction curve is obtained, the width of the depletion region is then determined for each point along the junction curve. In general, the width of the depletion region is determined for each bias voltage, and is calculated along a perpendicular line to the junction curve that intersects the junction curve at the point under consideration. FIG. 20 shows three such perpendicular lines for three points on the junction curve.

Though the doping profile of the well-substrate junction $(N_D - N_A)$ can be represented by a gaussian function:

$$N_D - N_A = N_0 e^{\frac{x^2}{a}} - N_A$$

this representation is not preferred due to many reasons. By way of example, the resolution of Poisson's equation is quite complex, and such representation requires the calibration of parameters $N_0$ and a from the profile. Furthermore, such representation is not suitable for all profiles.

Figure 21:
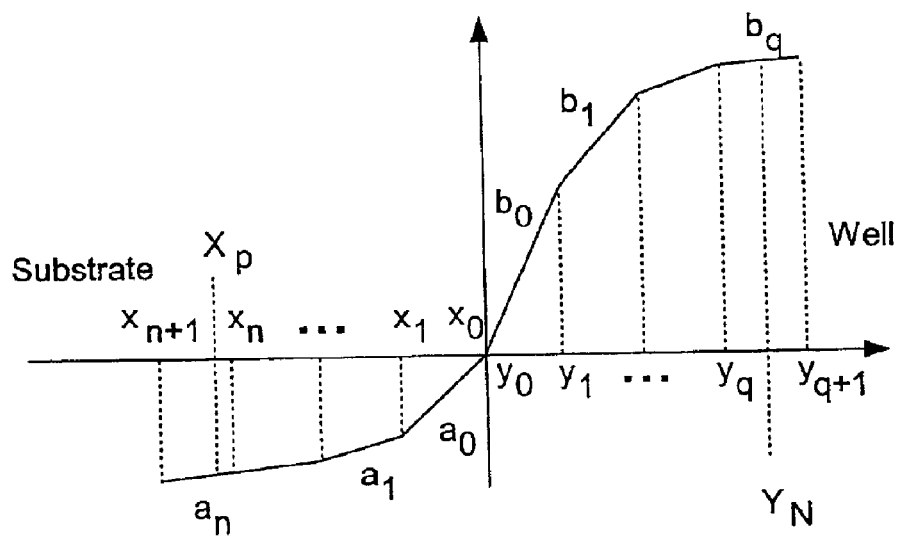
FIG. 21 shows the division of the net doping profile $N_D-N_A(x)$ into q subdivisions in the well part and n subdivisions in the substrate part.

In accordance with one aspect of the present invention, the solution involves approximating the doping profile by a set of linear functions. One of the advantages of this solution is that it is suitable to all doping profiles shapes. The net doping profile $N_D - N_A(x)$ will then be divided into q subdivisions in the well part and n subdivisions in the substrate part as shown in FIG. 21.

Linear Function Properties. A discussion of linear function properties now follows. Consider a function $f(y)$ defined on the interval $[0, +\infty]$ by a set of linear functions $f_m(y) \forall m \geq 0$:

$$f(y) = \begin{cases} f_0(y) = b_0(y - y_0) & y_0 \leq y \leq y_1 \\ f_1(y) = b_0(y_1 - y_0) + b_1(y - y_1) & y_1 \leq y \leq y_2 \\ \cdots \\ f_m(y) = \sum_{j=1}^{m} b_{j-1}(y_j - y_{j-1}) + b_m(y - y_m) & y_m \leq y \leq y_{m+1} \end{cases}$$

The expression $f_m(y) \forall m \geq 0$ can be rewritten as (here $b_j$s and $y_j$s have been switched).

$$f_m(y) = b_m y + \sum_{j=1}^{m} y_j(b_{j-1} - b_j)$$

since $y_0 = 0$.

Well Representation. Back to the substrate-well junction, we consider that the net doping profile is divided into q subdivisions in the well and that the space charge region spreads to $Y_N$, such that $y_q < Y_N < y_{q+1}$. Poisson's equation and continuity equation are the following:

$$\frac{\delta \xi}{\delta y} = \frac{\rho}{\varepsilon_s} = \frac{q e^-}{\varepsilon_s}(N_D - N_A)_y(y) = \frac{q e^-}{\varepsilon_s} f(y) \quad \text{Eq. 2}$$

$$\Delta \Psi - V_{NP} = \Psi_n(Y_N) - \Psi_p(X_p) \quad \text{Eq. 3}$$

where $(N_D - N_A)_y(y)$ is the value of the carrier concentration at position y in the well and with
ξ electric field
ρ space-charge density
$\varepsilon_S$ Dielectric constant of silicon (like $\varepsilon_{Si}$)
ΔΨ potential variation across the space-charge region
$\Psi_N$ potential in the n-region
$Y_N$ width of the n-type portion of the space-charge region
$\Psi_P$ potential in the p-region
$X_P$ width of the p-type portion of the space-charge region
Poisson's equation The resolution of the Poisson's equation leads to:

$$\xi_m(y) = \frac{q e^-}{\varepsilon_s}\left[ b_m \frac{y^2}{2} + \sum_{j=1}^{m}(b_{j-1} - b_j) y_j y + \sum_{j=m}^{q-1}(b_j - b_{j+1})\frac{y_{j+1}^2}{2} - b_q \frac{Y_N^2}{2} - \sum_{j=1}^{q}(b_{j-1} - b_j) y_j Y_N \right]$$

$\xi_m(y)$ electric field for y such that $y_m < y < y_{m+1}$ and $0 \leq m \leq q$
Continuity equation The expression of $\Psi_n(Y_N)$ is:

$$\psi_n(Y_N) = \frac{q e^-}{\varepsilon_s}\left[ b_q \frac{Y_N^3}{3} + \sum_{j=1}^{q}(b_{j-1} - b_j) y_j \frac{Y_N^2}{2} + \sum_{j=0}^{q} b_j \left(\frac{y_j^3}{6} - \frac{y_{j+1}^3}{6}\right) + b_q \frac{y_{q+1}^3}{6} \right]$$

Substrate Representation. For the substrate region, $f(x)$ is defined on $[-\infty, 0]$. The space charge region stretches to $X_p$, $x_{n+1} < X_p < x_n$ and we similarly have:

$$f(x) = \begin{cases} f_0(x) = a_0(x - x_0) & x_1 \leq x \leq x_0 \\ f_1(x) = a_0(x_1 - x_0) + a_1(x - x_1) & x_2 \leq x \leq x_1 \\ \cdots & \\ f_m(y) = \sum_{j=1}^{m} a_{j-1}(x_j - x_{j-1}) + a_m(x - x_m) & x_{m+1} \leq x \leq x_m \end{cases}$$

and thus, $f_m(x)$, $\forall m \geq 0$ can be defined by $$f_m(x) = a_m x + \sum_{j=1}^{m} x_j(a_{j-1} - a_j)$$

$$\xi_m(x) = \frac{q e^-}{\varepsilon_s}\left[ a_m \frac{x^2}{2} + \sum_{j=1}^{m}(a_{j-1} - a_j) x_j x + \sum_{j=m}^{n-1}(a_j - a_{j+1})\frac{x_{j+1}^2}{2} - a_n \frac{X_p^2}{2} - \sum_{j=1}^{n}(a_{j-1} - a_j) x_j X_p \right]$$

$$\psi_p(X_p) = \frac{q e^-}{\varepsilon_s}\left[ a_n \frac{X_p^3}{3} + \sum_{j=1}^{n}(a_{j-1} - a_j) x_j \frac{X_p^2}{2} + \sum_{j=0}^{n} a_j \left(\frac{x_j^3}{6} - \frac{x_{j+1}^3}{6}\right) + a_n \frac{x_{n+1}^3}{6} \right]$$

Width of the Space Charge Region. The width W of the space charge region is given by $W = Y_N - X_p$. To determine $X_p$ and $Y_N$ following system is solved:

$$(\xi_{m=0}(0))_n = (\xi_{m=0}(0))_p \quad \text{Eq. 4}$$

$$\Delta \Psi - V_{NP} = \Psi_N(Y_N) - \Psi_p(X_p) \quad \text{Eq. 5}$$

with $$\Delta \Psi = \frac{kT}{q e^-}\ln\left( \frac{(N_D - N_A)_y(Y_N)(N_D - N_A)_x(X_P)}{n_i^2} \right)$$

If we use the notations:

$$A_1(m) = \sum_{j=0}^{m}(a_j - a_{j+1})\frac{x_{j+1}^2}{2} \quad B_1(m) = \sum_{j=0}^{m}(b_j - b_{j+1})\frac{y_{j+1}^2}{2}$$

$$A_2(m) = \sum_{j=1}^{m}(a_{j-1} - a_j) x_j \quad B_2(m) = \sum_{j=1}^{m}(b_{j-1} - b_j) y_j$$

$$A_3(m) = \sum_{j=0}^{m} a_j \left(\frac{x_j^3}{6} - \frac{x_{j+1}^3}{6}\right) \quad B_3(m) = \sum_{j=0}^{m} b_j \left(\frac{y_j^3}{6} - \frac{y_{j+1}^3}{6}\right)$$

the equations (4) and (5) are:

$$\frac{q e^-}{\varepsilon_s}\left[ B_1(q-1) - b_q \frac{Y_N^2}{2} - B_2(q) Y_N \right] = \quad \text{Eq. 6}$$

$$\frac{q e^-}{\varepsilon_s}\left[ A_1(n-1) - a_n \frac{X_p^2}{2} - A_2(n) X_p \right]$$

$$\Delta \Psi - V_{NP} = \Psi_n(Y_N) - \Psi_p(X_p) \quad \text{Eq. 7}$$

where $$\Psi_n(Y_N) = \frac{q e^-}{\varepsilon_s}\left[ b_q \frac{Y_N^3}{3} + B_2(q)\frac{Y_N^2}{2} + B_3(q) + b_q \frac{y_{q+1}^3}{6} \right] \quad \text{Eq. 8}$$

$$\Psi_p(X_p) = \frac{q e^-}{\varepsilon_s}\left[ a_n \frac{X_p^3}{3} + A_2(n)\frac{X_p^2}{2} + A_3(n) + a_n \frac{x_{n+1}^3}{6} \right] \quad \text{Eq. 9}$$

Resolution of the System. Equation 6 depends on $X_p$ and $Y_N$. We can express $X_p$ from $Y_N$ as follows:

$$X_p = \frac{-A_2(n) \pm \sqrt{(A_2(n))^2 + 2a_n\left(A_1(n-1) - B_1(q-1) + b_q\frac{Y_N^2}{2} + B_2(q)Y_N\right)}}{a_n}$$

but only root (10) will be used for $X_p<0$:

$$X_p = \frac{-A_2(n) - \sqrt{A_2(n)^2 + 2a_n\left(A_1(n-1) - B_1(q-1) + b_q\frac{Y_N^2}{2} + B_2(q)Y_N\right)}}{a_n} \quad \text{Eq. 10}$$

knowing that $y_{q+1}=Y_N$ and $x_{n+1}=X_p$, we can rewrite equations (8) and (9) into $$\Psi_n(Y_N) = \frac{q_{e^-}}{\varepsilon_s}\left[b_q\frac{Y_N^3}{3} + B_2(q)\frac{Y_N^2}{2} + B_3(q-1) + b_q\frac{y_q^3}{6}\right]$$

$$\Psi_p(X_p) = \frac{q_{e^-}}{\varepsilon_s}\left[a_n\frac{X_p^3}{3} + A_2(n)\frac{X_p^2}{2} + A_3(n-1) + a_n\frac{x_n^3}{6}\right]$$

and try to solve (7) to determine $Y_p$. Equation (7) will also be noted F(Y) if $X_p$ is replaced by (10).

Figure 22:
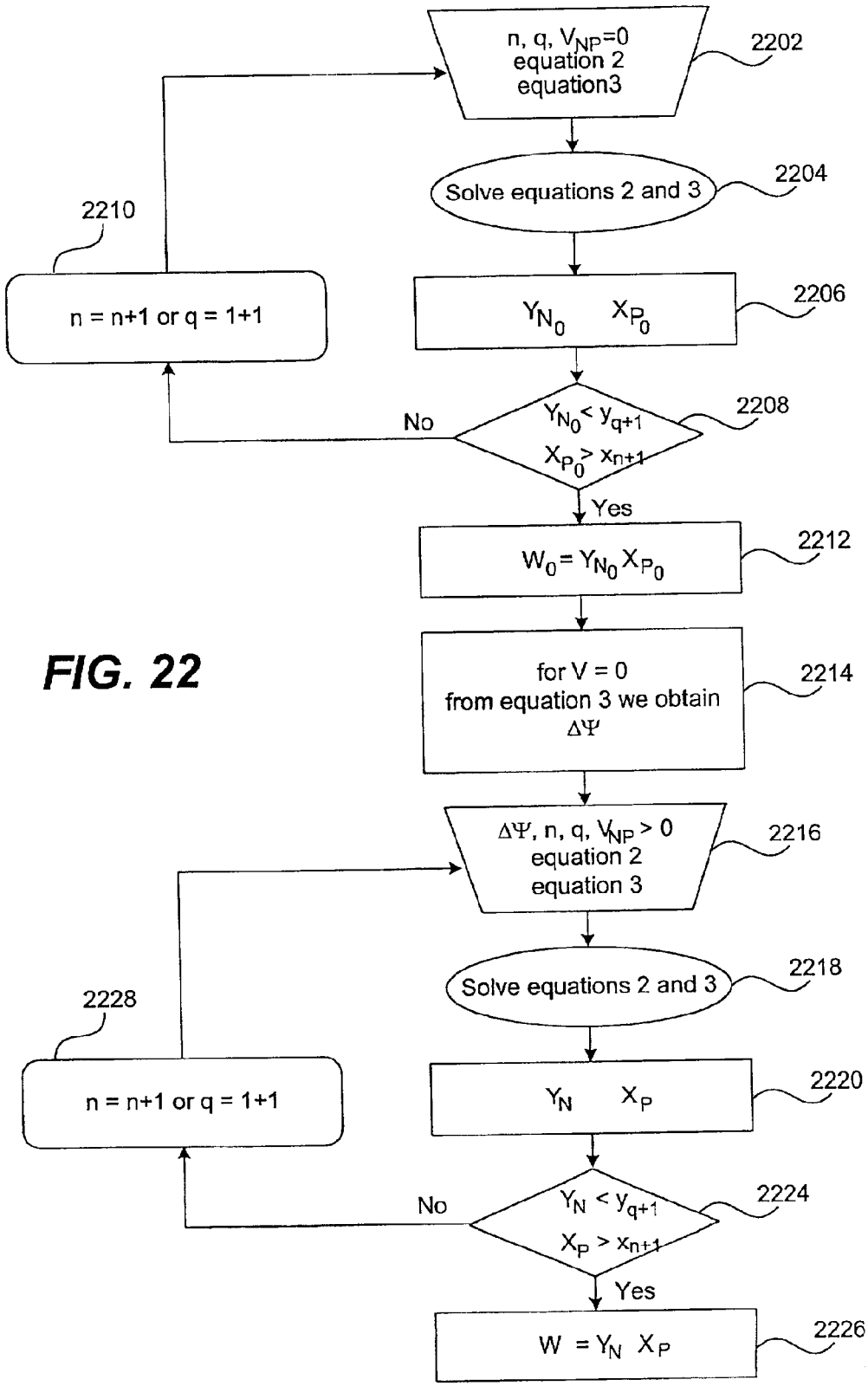
FIG. 22 shows, in one embodiment, the algorithm that corresponds to the search of $X_p$ and $Y_N$ for each voltage.

The algorithm that corresponds to the search of $X_p$ and $Y_N$ for each voltage is presented in FIG. 22. Steps 2200–2214 of the algorithm consists of determining $\Delta\Psi$. To do so, the bias voltage value $V_{NP}=0$ is first employed. In one embodiment, a piece-wise approximation technique is employed. The computation of $Y_{N0}$ and $X_{P0}$ (i.e., the value of $Y_N$ and $X_p$ for $V_{NP}=0$) involves a loop (steps 2208 and 2210) that approximates these two variables. At the start, n=0 and q=0 (see FIG. 21) and Eqs. 2 and 3 are solved to obtain two values for $Y_{N0}$ and $X_{P0}$. If $Y_{N0}$ is greater than $y_{q+1}$ (resp. $X_p$ less than $x_{n+1}$) which means that $Y_N$ is out of the approximation interval, $Y_{N0}$ (resp. $X_{P0}$) is recomputed with a more accurate interval. In other words, some more slope is added to the linear function that approximates $(N_D-N_A)$ in the well part and increment q (resp. n).

Once $Y_{N0}$ and $X_{P0}$ are obtained, $\Delta\Psi$ can be calculated (see Eq. 3) since if $V_{NP}=0$, $$\Delta\Psi=\Psi_n(Y_{N0})-\Psi_p(X_{p0})$$

The value of $\Delta\Psi$ facilitates the calculation of $Y_N$ and $X_P$ for other bias voltages. These are shown in FIG. 22 as steps 2216–2228.

EXAMPLE 1

Consider that n=0, q=0, $a_0=b_0=5e^{+19}$. Then we have from Equation 10:

$$X_p = -\sqrt{\frac{b_0}{a_0}}\, Y_N$$

and from Equation 7:

$$\frac{kT}{q_{e^-}}\ln\left(\frac{(a_0X_p)(b_0Y_N)}{\eta_i^2}\right) - \frac{q_{e^-}}{\varepsilon_s}\left[b_0\frac{Y_N^3}{3} - a_0\frac{X_p^3}{3}\right] = 0$$

-continued $$F(Y) = \frac{kT}{q_{e^-}}\ln\left(\frac{b_0\sqrt{a_0b_0}\,Y_N^2}{\eta_i^2}\right) - \frac{q_{e^-}}{\varepsilon_s}\left[\frac{b_0}{3}Y_N^3\left(1 + \sqrt{\frac{b_0}{a_0}}\right)\right] = 0$$

The resolution of this equation with the following constants:

$q_{e^-} = 1.6021e^{-19}C$ $\varepsilon_s = 103.59e^{-14} F/\text{cm}$ $\eta_i = 1.45e^{+10}\text{cm}^{-3}$ $\frac{kT}{q_{e^-}} = 0.02585$ leads to $Y_N=4.94e^{-5}$ cm for $V_{NP}=0$. $\Delta\Psi$ is then equal to 0.622797.

Figure 23:
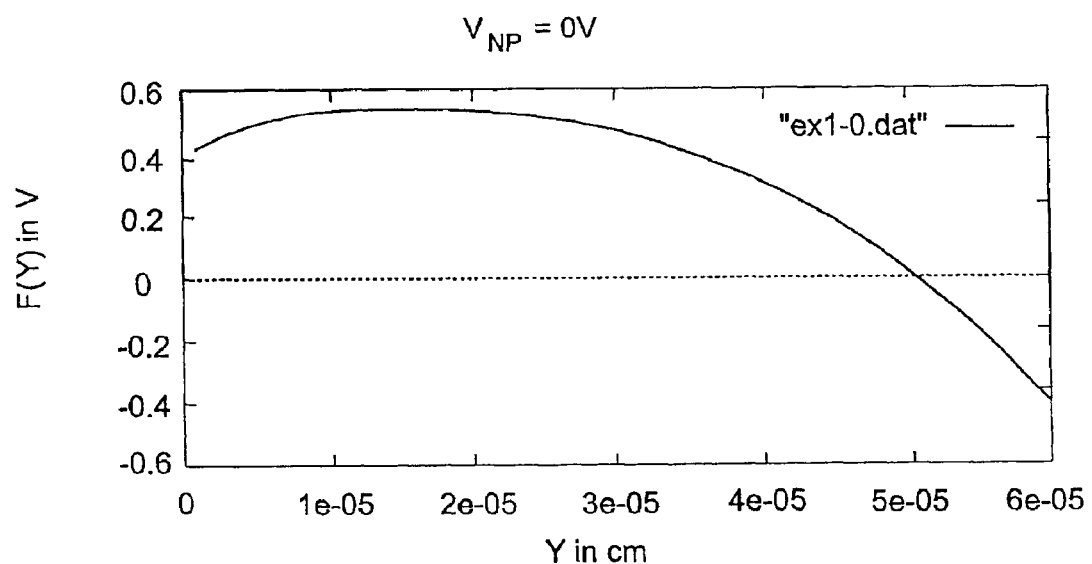
FIGS. 23, 24, and 25 illustrate the function F(Y) for different bias voltages $V_{NP}$ (0V, 0.25V, and 0.5V respectively) for one example.
Figure 24:
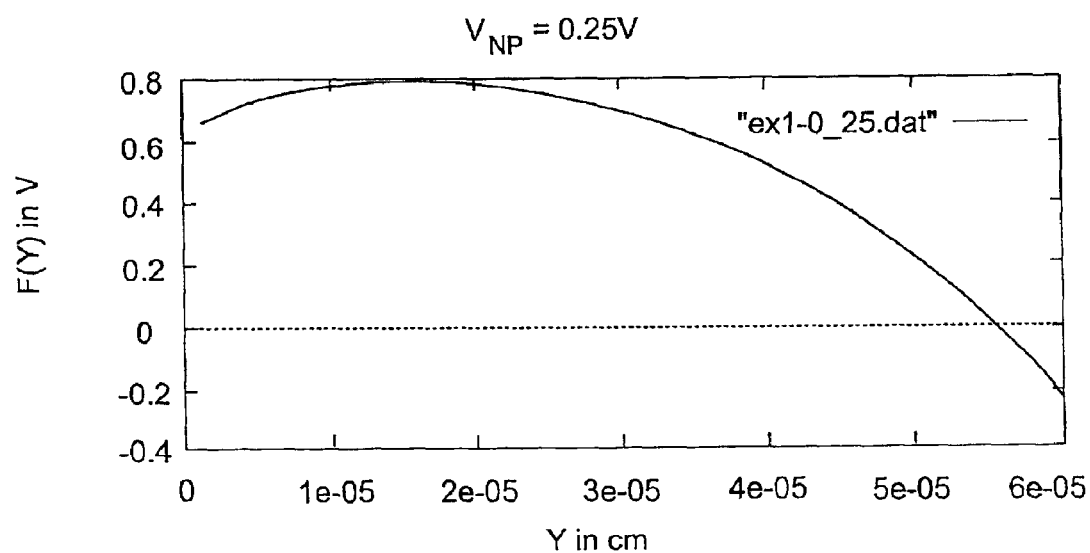
Figures 25, 26:
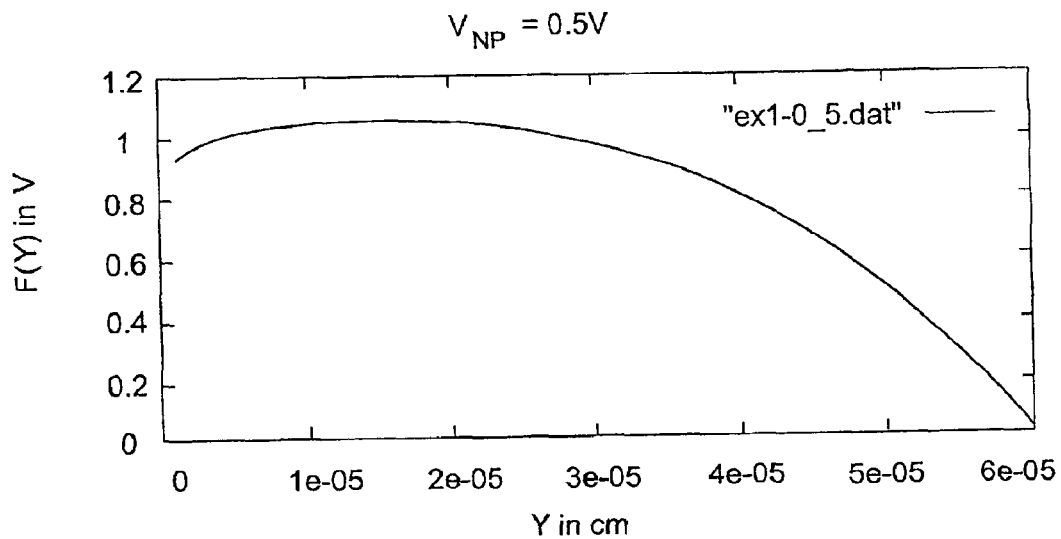
FIG. 26 is a table showing the resultant widths of the depletion region for various bias voltages of one example.

FIGS. 23, 24, and 25 illustrate the function F(Y) for different bias voltages $V_{NP}$ (0V, 0.25V, and 0.5V respectively) or this example.

The resultant widths of the depletion region for various bias voltages of this example is set forth in the table shown in FIG. 26.

EXAMPLE 2

For this second example, consider now that n=1, q=1, $a_0=b_0=5e^{+19}$, $a_1=1e^{+18}$, $b_1=0.5e^{+18}$:

$A_1(0) = (a_0 - a_1)\frac{x_1^2}{2}$   $B_1(0) = (b_0 - b_1)\frac{y_1^2}{2}$ $A_2(1) = (a_0 - a_1)x_1$   $B_2(1) = (b_0 - b_1)y_1$ $A_3(0) = a_0\left(\frac{x_0^3}{6} - \frac{x_1^3}{6}\right) = -a_0\frac{x_1^3}{6}$   $B_3(0) = b_0\left(\frac{y_0^3}{6} - \frac{y_1^3}{6}\right) = -b_0\frac{y_1^3}{6}$ $$X_p = \frac{-A_2(1) - \sqrt{(A_2(1))^2 + 2a_1\left(A_1(0) - B_1(0) + b_1\frac{Y_N^2}{2} + B_2(1)Y_N\right)}}{a_1}$$

$$\Psi_n(Y_N) = \frac{q_{e^-}}{\varepsilon_s}\left[b_1\frac{Y_N^3}{3} + B_2(1)\frac{Y_N^2}{2} + B_3(0) + b_1\frac{y_1^3}{6}\right]$$

$$\Psi_p(X_p) = \frac{q_{e^-}}{\varepsilon_{s2}}\left[a_1\frac{X_p^3}{3} + A_2(1)\frac{X_p^2}{2} + A_3(0) + a_1\frac{x_1^3}{6}\right]$$

and equation 7:

$$F(Y) = \frac{kT}{q_{e^-}}\ln\left(\frac{(a_1X_p + (a_0 - a_1)x_1)(b_1Y_N + (b_0 - b_1)y_1)}{\eta_i^2}\right) -$$

$$\frac{q_{e^-}}{\varepsilon_s}[\Psi_n(Y_N) - \Psi_p(X_p)] = 0$$

Figures 27, 28:
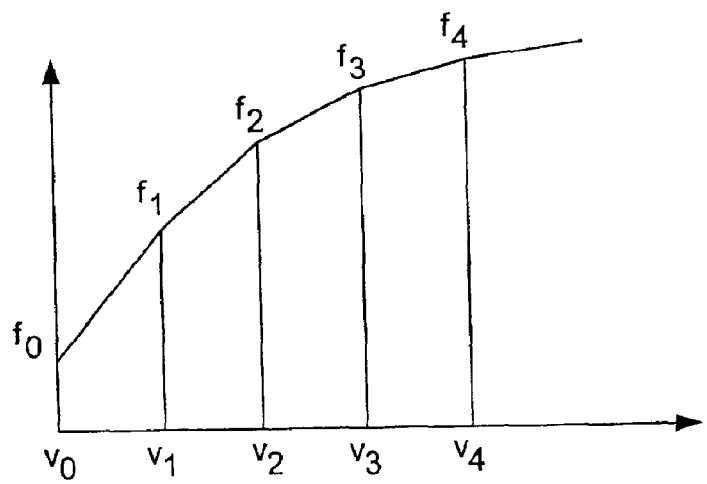
FIG. 27 is another table showing the resultant widths of the depletion region for various bias voltages of one example.
FIG. 28 depicts an exemplary plot of voltages $v_i$ versus the corresponding widths ($f_i$).

The resultant widths of the depletion region for various bias voltages of this example is set forth in the table shown in FIG. 27.

From the widths of the depletion region for various bias voltages, the set of parameters α, β and γ may then be computed. In one embodiment, if a vertical subdivision includes more than one point for which the widths of the depletion regions at various bias voltages have been calculated, an average may be taken so that for each bias voltage level, an average width may be obtained for all the points within the vertical subdivision. Doing so simplifies the modeling subsequently since only one set of values α, β and γ needs to be obtained for that vertical subdivision based on the average value.

Computation of Parameters α, β and γ. One technique for deriving these parameters an α, β and γ is set forth below. It should be noted, however, that other mathematical techniques, other than the preferred technique set forth below, may also be employed to solve for parameters α, β and γ.

Consider a function given by a set of pairs $\{(f_i, v_i)\}$, $0 \leq i \leq n$, where $f_i = f_{\alpha,\beta,\gamma}(v_i)$. FIG. 28 depicts an exemplary plot of voltages $v_i$ versus the corresponding widths $(f_i)$. The function $f_{\alpha,\beta,\gamma(v_i)}$ has the following format:

$$f_i = f_{\alpha,\beta,\gamma}(v_i) = (\alpha + \beta v_i)^\gamma, \forall i, 0 \leq i \leq n$$

To determine α, β and γ we use a simple method:
1. We first express α and β in function of γ for i=0

$$f_0 = (\alpha + \beta v_0)^\gamma$$

but $v_0 = 0$, and then $$\alpha = e^{\frac{\ln(f_0)}{\gamma}}$$

we approximate β with the last point of the function (i=n):

$$f_n = (\alpha + \beta v_n)^\gamma$$

$$\beta = \frac{e^{\frac{\ln(f_n)}{\gamma}} - \alpha}{v_n}$$

2. Given that $$\gamma \epsilon \frac{1}{3} \cdots \frac{1}{2},$$

we iteratively compute α, β and the error function $$e(\alpha, \beta, \gamma) = \sum_{i=0}^{n} (fi - (\alpha + \beta x_i)^\gamma)^2$$

for a set of values of γ in the defined interval and retain the value that minimizes the error function.

Figures 29, 31:
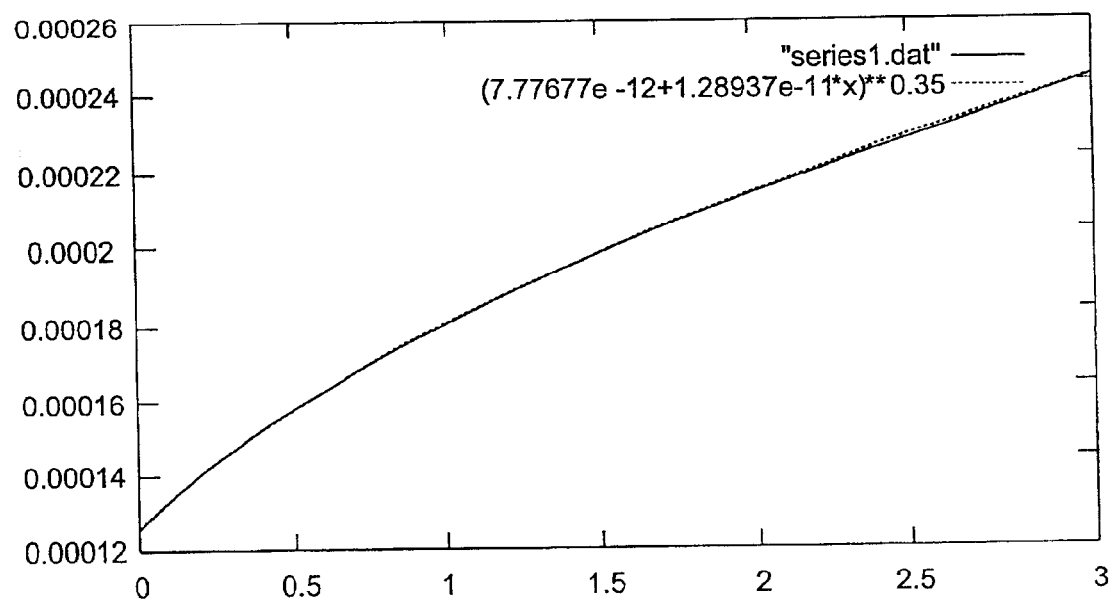
FIGS. 29, 30, 31, and 32 show exemplary results of the method for calculating the three parameters $\alpha$, $\beta$ and $\gamma$ in accordance with one embodiment of the present invention.
Figures 30, 32:
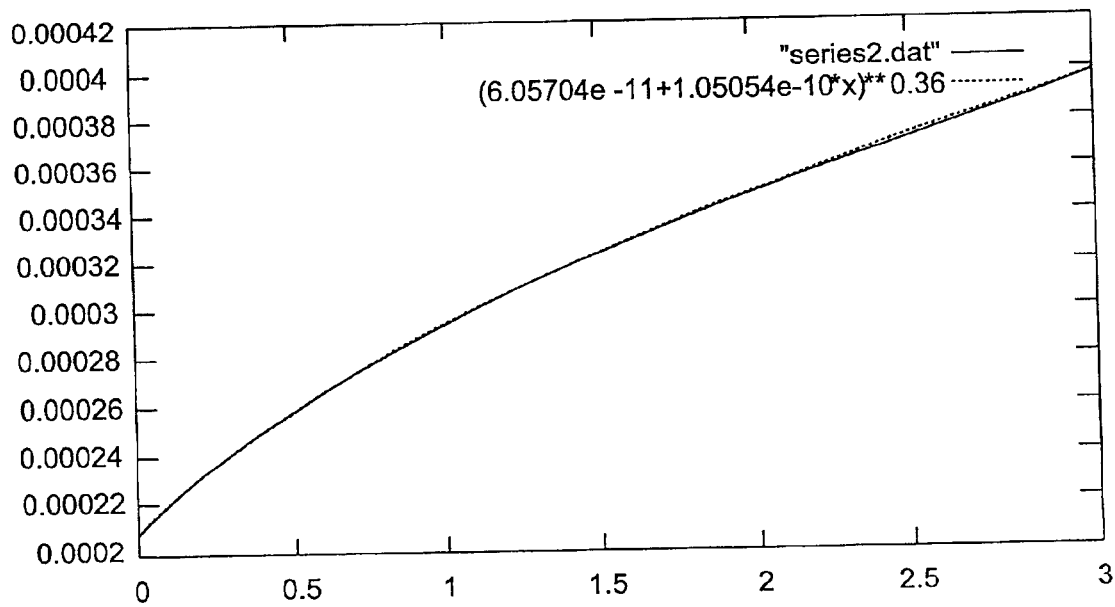

This method, though very simple, seems to give precise results as shown by the sets of exemplary values presented in the tables of FIGS. 29 and 30. FIGS. 31 and 32 show for each set of values the linear function $\{f_i, v_i\}$ and the corresponding approximated function.

Once the three parameters, α, β, and γ, which characterize the well-substrate junction for a particular point in a vertical discretization, are calculated, these parameters may be stored in the database and employed to more accurately model the substrate at modeling time. By way of example, during modeling, the bias potential for each well may be provided and the specific capacitance that connect nodes of the mesh within the well to nodes of the mesh in the substrate across the well-substrate junction, which specific capacitance is associated with the specified bias potential and the specific vertical discretization, may be determined. If the resistance is very large compared to the capacitance, it may be possible, in one embodiment, to ignore the resistance altogether in modeling the well-substrate junction (of course, whether one wishes to ignore the resistance value depends on the accuracy desired). Since the specific capacitance is calculated in view of the doping concentrations and the bias potential, instead of a static value as in the case when the capacitance is provided as a value used in industry and obtained by measurement of the physical structure, a more accurate 3-D mesh model may be obtained.

Note that although only one junction curve is illustrated to simplify the discussion, the capacitance determination technique of the present invention may also be employed when there are multiple junction curves, e.g., in the case where the process is complex.

In some cases, however, the process engineer can only provide a 1-D description of the doping profiles: each cross-section of the process is then represented by a carrier concentration versus the substrate depth. By way of example, FIG. 8A shows one such example of a 1-D profile.

In this case we apply to each junction a similar algorithm used for a 2-D mesh to compute the depletion region width for each p-n transition inside the vertical doping profile. The result is still a set of parameters α, β and γ. FIG. 33 illustrates the steps involved in determining the set of parameters α, β and γ when only the 1-D doping profile information is available.

To compute the perimeter values $C_p$ between region Default and n-well from the 1-D carrier concentrations, we assume that the charge distribution as a function of distance is an abrupt or step junction. Between two adjacent subdivisions i and j, the density of space charge on the n and p sides of the step junction will be given by $-qN_{Aij}$ and $qN_{Dij}$, where $N_{Aij}$ and $N_{Dij}$ stand for the average carrier concentrations of the 1-D default profiles. Then, α, β, γ for perimeter capacitances are given as follows:

$$\gamma_{i,j} = \frac{1}{2\varepsilon}$$

$$\alpha_{i,j} = \frac{2\varepsilon_0 \varepsilon_{Si}}{q_{e^-}} \times \frac{N_{Ai,j} + N_{Di,j}}{N_{Ai,j} N_{Di,j}} \times \frac{kT}{q_{e^-}} \ln\left(\frac{N_{Ai,j} N_{Di,j}}{n_i^2(T)}\right)$$

$$\beta_{i,j} = \frac{2\varepsilon_0 \varepsilon_{Si}}{q_{e^-}} \times \frac{N_{Ai,j} + N_{Di,j}}{N_{Ai,j} N_{Di,j}}$$

where
$\epsilon_0$ permitivity of free space (8.86 e$^{-14}$ F/cm)
$\epsilon_{Si}$ dielectric constant of silicon (11.7)
$N_{Aij}$ concentration of acceptor impurities between subdivisions i and j
$N_{Dij}$ concentration of donor impurities between subdivisions i and j
k Boltzmann's contant
T Temperature in Kelvin
$q_{e^-}$ magnitude of electronic charge (1.6e$^{-19}$ C)
$n_i(T)$ intrinsic carrier concentration (dependent on T)

Once the three parameters α, β, and γ are obtained, they may be employed to calculate the specific capacitance at that junction in the manner discussed earlier.

As mentioned earlier, each doping profile is associated with an access key to facilitate correlation with the layers of the layout database. Also as mentioned earlier in connection with FIG. 6B, a binary key, which is formed by adding the binary value associated with each of the ordered layers, may be employed for accessing a specific doping profile in one embodiment.

In another embodiment of the present invention, the unique access key may be formed by a combination of a region name and a cross-section name. This access key is created, in part, to render the process of accessing doping profiles more user-friendly to professionals, such as foundry professionals, who are more comfortable working with regions and cross-sections when fabricating devices on a substrate.

For the purpose of this portion of the discussion, a region is identified as an area of the substrate in which the number of transitions between p-type material and n-type material within the bulk underlying that area remains the same. Furthermore, the vertical positions of those transitions within the bulk underlying that area also remains the same (within tolerance limits). Different regions have either different numbers of transitions between the p-type material and the n-type material, or different locations for those transitions, or both. For a particular substrate, region specification may come from a variety of sources, including, for example, foundry professionals.

One may think of region names as, for example, coarse information, which provides information pertaining to whether an area has no well, a single well, or a triple well, or the like, and how deep are the transitions. A substrate may have any number of regions.

Within each region, there may be different structures which one may wish to fabricate. Each structure fabricated in a given region will result in a variation of carrier densities therein. One example of such a structure is a contact. However, a contact may occur in many different regions, and the cross-section associated with a contact may not be unique on its own. For this reason, a combination of the specific region and the specific cross-section is needed for uniqueness, and it is from this combination of both the region name and the cross-section name that the access key is created. In this manner, the cross-section name may be thought as more detailed information which, when used in combination with the coarser information (i.e., the region name) would yield a unique combination suitable for use as an access key.

Figure 34:
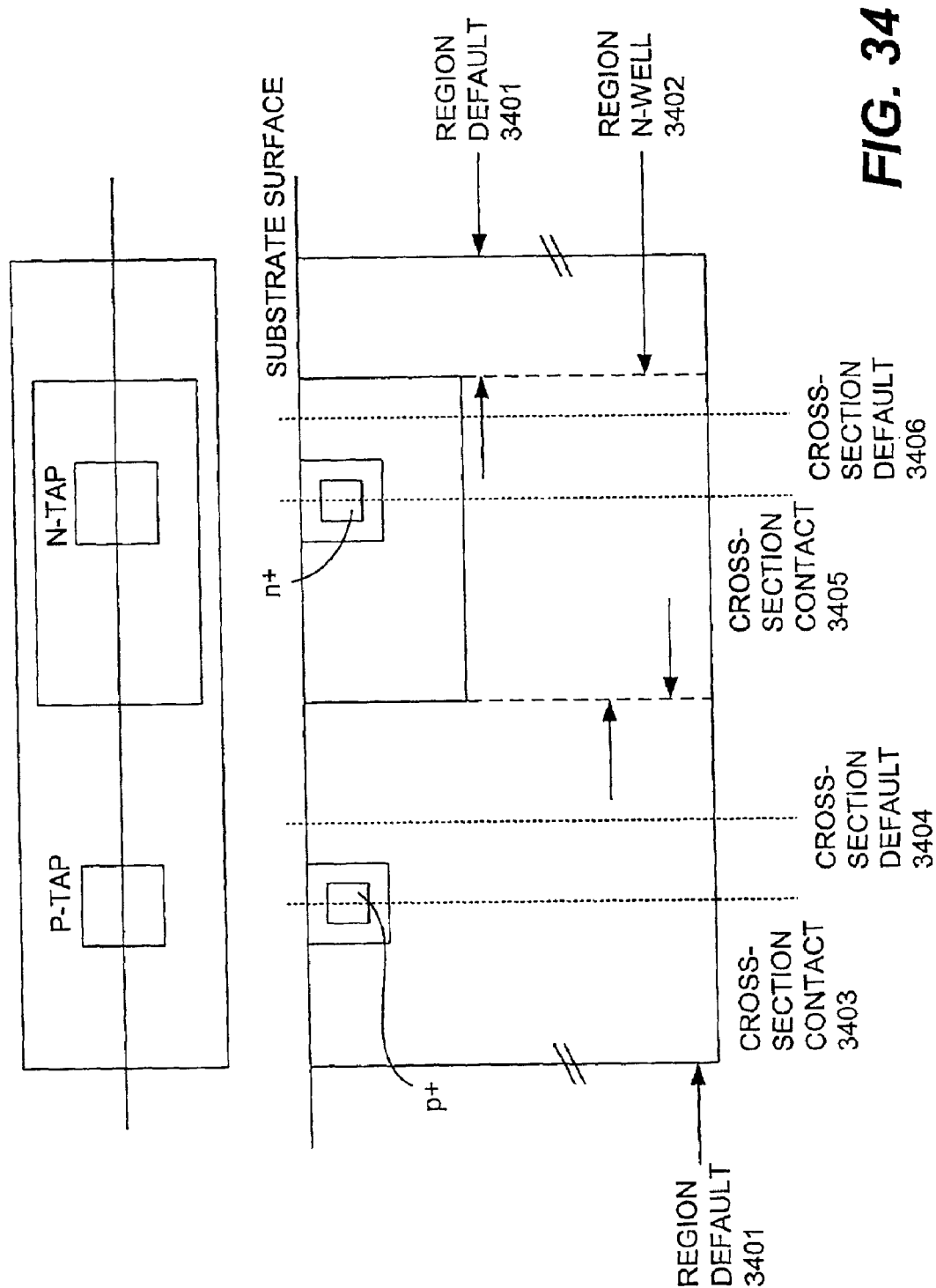
FIG. 34 illustrates, in one embodiment, top and side views of an exemplary substrate to facilitate discussion of the use of region names and cross-section names as access keys for accessing doping profiles.

To facilitate further understanding, an example is discussed in connection with FIG. 34 herein. FIG. 34 illustrates, in accordance with one embodiment of the present invention, an exemplary portion of a substrate having default regions 3401 and an n-well region 3402. Note that there are two default regions to both sides of n-well region 3402 since within these two default regions, the number of transitions is the same (i.e., both have zero transition) and the vertical locations of the transitions are the same (i.e., none in this case). For each region, a default cross-section is provided. In the example of FIG. 34, the default cross section for default region 3401 is indicated by a reference number 3404. This default cross-section 3404 represents the cross-section employed with default region 3401 if no specific cross-section is indicated. As another example, the default cross-section for n-well region 3402 is indicated by a reference number 3406. Again, this default cross-section 3406 represents the cross-section employed with n-well region 3402 if no specific cross-section is indicated. Note also that although both cross-sections 3404 and 3406 are default cross-sections, they are different in their doping profiles due to the fact that they occur in different regions.

Within default region 3401, a specific cross-section 3403 "contact" is shown. Within n-well region 3402, a specific cross-section 3405 "contact" is also shown. When each of these cross-sections is combined with its respective region (or when each of the default cross-sections is combined with its respective region for that matter), a unique identifier is obtained, which may be used as an access key to a doping profile associated therewith.

For some people, the formation of a unique access key from the combination of a region name and a cross-section name may be more intuitive. Instead of having to enter all individual layers in every combination, compute their associated binary values, and use those binary values as unique access keys, the present technique allows one to form a unique access key to a doping profile from fewer constituent parts (e.g., from the region name and cross-section name). This is particularly user-friendly if one already has access to information pertaining to the cross-section name and the region name for each location on the substrate.

Furthermore, the use of region names (in combination with cross-section names) to access the doping profiles also clearly identifies the presence of n-type to p-type transitions and yields clues about whether different doping profiles involve different transition depths. In this manner, it is possible to quickly determine whether it is necessary to add junction capacitances in the substrate model. By way of example, a junction capacitance is necessary whenever there is a vertical transition from n-type to p-type material within the structure. By way of another example, when two different regions are placed next to each other there will be at least on lateral n-type type to p-type transition that requires the addition of the corresponding junction capacitance in the substrate model. This is an advantage over the binary access key, as can be appreciated by those skilled in the art.

The present invention provides numerous advantages. Through utilizing doping profiles, substrate characteristics may be accurately and efficiently modeled. Moreover, through creating vertical subdivisions in these doping profiles, the accuracy and efficiency of this modeling is maximized. Similarly, through creating horizontal subdivisions in an integrated circuit substrate, the doping profiles may be accurately and efficiently utilized during the modeling process.

The present invention may generally be implemented on any suitable computer system. The computer system may include any number of processors that may be coupled to memory devices such as a read only memory (ROM) or a random access memory (RAM). In addition, it is contemplated that such a computer system might be connected to a network to receive information from the network or output information to the network.

The invention can also be embodied as computer readable code on a computer readable medium. The computer readable medium is any data storage device that can store data which can thereafter be read by a computer system. Examples of the computer readable medium include read-only memory, random-access memory, CD-ROMs, magnetic tape, and optical data storage devices. The computer readable medium can also be distributed over a network between coupled computer systems so that the computer readable code is stored and executed in a distributed fashion.

Although illustrative embodiments and applications of this invention are shown and described herein, many variations and modifications are possible which remain within the concept, scope, and spirit of the invention, and these variations would become clear to those of ordinary skill in the art after perusal of this application. For instance, the present invention is described as modeling electrical characteristics of a substrate. However, it should be understood that the invention is not limited to modeling characteristics of this type, but instead would equally apply regardless of the characteristics modeled. Accordingly, the present embodi-

What is claimed is:

1. A computer-readable medium storing thereon computer-readable instructions configured for characterizing an integrated circuit substrate, comprising:
   instructions for obtaining a substrate doping profile, the substrate doping profile including a net doping level for each one of a plurality of depths within the integrated circuit substrate;
   instructions for vertically discretizing the substrate doping profile to form a vertically discretized substrate doping profile; and
   instructions for associating the vertically discretized doping profile with an access key, the access key comprising a region name and a cross-section name.

2. The computer-readable medium as recited in claim 1, Wherein the region name corresponds to a region of the integrated circuit substrate.

3. The computer-readable medium as recited in claim 2, wherein the region of the integrated circuit substrate is defined by a horizontal area of the integrated circuit substrate.

4. The computer-readable medium as recited in claim 1, wherein the cross-section name corresponds to a cross-section of the integrated circuit substrate.

5. The computer-readable medium as recited in claim 4, wherein the cross-section of the integrated circuit substrate is defined by a vertical area of the integrated circuit substrate.

6. An apparatus for characterizing an integrated circuit substrate, comprising:
   means for obtaining a substrate doping profile, the substrate doping profile including a net doping level for each one of a plurality of depths within the integrated circuit substrate;
   means for vertically discretizing the substrate doping profile to form a vertically discretized substrate doping profile; and
   means for associating the vertically discretized doping profile with an access key, the access key comprising a region name and a cross-section name.

7. An apparatus for characterizing an integrated circuit substrate, comprising:
   a processor; and
   a memory, at least one of the processor and the memory being adapted for:
   obtaining a substrate doping profile, the substrate doping profile including a net doping level for each one of a plurality of depths within the integrated circuit substrate;
   vertically discretizing the substrate doping profile to form a vertically discretized substrate doping profile; and
   associating the vertically discretized doping profile with an access key, the access key comprising a region name and a cross-section name.

8. A computer-readable medium, the computer-readable medium storing thereon computer readable instructions for characterizing an integrated circuit substrate, comprising:
   instructions for obtaining a substrate doping profile, the substrate doping profile including a net doping level for each one of a plurality of depths within the integrated circuit substrate;
   instructions for vertically discretizing the substrate doping profile to form a vertically discretized substrate doping profile; and
   instructions for associating the vertically discretized doping profile with an access key, the access key corresponding to a region of the integrated circuit substrate and a cross-section of the integrated circuit substrate.

9. The computer-readable medium as recited in claim 8, wherein the access key is associated with a region name and a cross-section name.

10. The computer-readable medium as recited in claim 8, wherein the access key comprises a region name and a cross-section name.

11. The computer-readable medium as recited in claim 8, wherein the region is an area of the integrated circuit substrate in which a number of transitions between p-type material and n-type material within bulk underlying the region is approximately constant within the region.

12. The computer-readable medium as recited in claim 8, wherein the region is an area of the integrated circuit substrate in which vertical locations of transitions between p-type material and n-type material within bulk underlying the region are approximately constant within the region.

13. The computer-readable medium as recited in claim 8, wherein the cross-section of the integrated circuit substrate is a default cross-section of the integrated circuit substrate when no specific cross-section is indicated.

14. The computer-readable medium as recited in claim 8, wherein the region of the integrated circuit substrate is a default region of the integrated circuit substrate when no specific region is indicated.

15. The computer-readable medium as recited in claim 8, further comprising:
   instructions for determining from the access key whether to add a junction capacitance.

16. An apparatus for characterizing an integrated circuit substrate, comprising:
   a processor; and
   a memory, at least one of the processor and the memory being adapted for:
   obtaining a substrate doping profile, the substrate doping profile including a net doping level for each one of a plurality of depths within the integrated circuit substrate;
   vertically discretizing the substrate doping profile to form a vertically discretized substrate doping profile; and
   associating the vertically discretized doping profile with an access key, the access key corresponding to a region of the integrated circuit substrate and a cross-section of the integrated circuit substrate.

17. The apparatus as recited in claim 16, wherein the access key is associated with a region name and a cross-section name.

18. The apparatus as recited in claim 16, wherein the access key comprises a region name and a cross-section name.

19. An apparatus for characterizing an integrated circuit substrate, comprising:
   means for obtaining a substrate doping profile, the substrate doping profile including a net doping level for each one of a plurality of depths within the integrated circuit substrate;
   means for vertically discretizing the substrate doping profile to form a vertically discretized substrate doping profile; and
   means for associating the vertically discretized doping profile with an access key, the access key corresponding to a region of the integrated circuit substrate and a cross-section of the integrated circuit substrate.

* * * * *

UNITED STATES PATENT AND TRADEMARK OFFICE
CERTIFICATE OF CORRECTION

PATENT NO. : 6,920,417 B2
DATED : July 19, 2005
INVENTOR(S) : Lescot et al.

It is certified that error appears in the above-identified patent and that said Letters Patent is hereby corrected as shown below:

Column 33,
Line 18, should be changed from "The computer medium as cited in claim 1, Wherein the region name ..." to -- The computer medium as cited in claim 1, wherein the region name ... --.

Signed and Sealed this

Fourteenth Day of March, 2006

JON W. DUDAS
*Director of the United States Patent and Trademark Office*